(12) United States Patent
Hoff

(10) Patent No.: US 9,645,180 B1
(45) Date of Patent: *May 9, 2017

(54) SYSTEM AND METHOD FOR ESTIMATING PHOTOVOLTAIC ENERGY GENERATION FOR USE IN PHOTOVOLTAIC FLEET OPERATION WITH THE AID OF A DIGITAL COMPUTER

(71) Applicant: Clean Power Research, L.L.C., Napa, CA (US)

(72) Inventor: Thomas E. Hoff, Napa, CA (US)

(73) Assignee: CLEAN POWER RESEARCH, L.L.C., Napa, CA (US)

( * ) Notice: Subject to any disclaimer, the term of this patent is extended or adjusted under 35 U.S.C. 154(b) by 823 days.

This patent is subject to a terminal disclaimer.

(21) Appl. No.: 14/056,898

(22) Filed: Oct. 17, 2013

Related U.S. Application Data

(63) Continuation-in-part of application No. 13/866,901, filed on Apr. 19, 2013, now Pat. No. 9,411,073, which is a continuation-in-part of application No. 13/462,505, filed on May 2, 2012, now Pat. No. 8,437,959, which is a continuation of application No. 13/453,956, filed on Apr. 23, 2012, now Pat. No. 8,335,649, which is a continuation of application No. 13/190,442, filed on Jul. 25, 2011, now Pat. No. 8,165,812.

(51) Int. Cl.
   *G01R 21/133* (2006.01)
(52) U.S. Cl.
   CPC .................... *G01R 21/1331* (2013.01)

(58) Field of Classification Search
   USPC ............................................. 702/61
   See application file for complete search history.

(56) References Cited

U.S. PATENT DOCUMENTS

| | | |
|---|---|---|
| 4,992,942 A | 2/1991 | Bauerle et al. |
| 5,001,650 A | 3/1991 | Francis et al. |
| 5,602,760 A | 2/1997 | Chacon et al. |

(Continued)

OTHER PUBLICATIONS

H.T. Nguyen, Estimating potential photovoltaic yield with r.sun and the open source Geographical Resources Analysis Support System, Mar. 17, 2010, pp. 831-843.*

(Continued)

*Primary Examiner* — Tung Lau
(74) *Attorney, Agent, or Firm* — Patrick J. S. Inouye

(57) ABSTRACT

The accuracy of photovoltaic simulation modeling is predicated upon the selection of a type of solar resource data appropriate to the form of simulation desired. Photovoltaic power simulation requires irradiance data. Photovoltaic energy simulation requires normalized irradiation data. Normalized irradiation is not always available, such as in photovoltaic plant installations where only point measurements of irradiance are sporadically collected or even entirely absent. Normalized irradiation can be estimated through several methodologies, including assuming that normalized irradiation simply equals irradiance, directly estimating normalized irradiation, applying linear interpolation to irradiance, applying linear interpolation to clearness index values, and empirically deriving irradiance weights. The normalized irradiation can then be used to forecast photovoltaic fleet energy production.

16 Claims, 34 Drawing Sheets

(56) References Cited

U.S. PATENT DOCUMENTS

| | | | |
|---|---|---|---|
| 7,742,897 B2 | 6/2010 | Herzig | |
| 8,165,811 B2* | 4/2012 | Hoff | G01W 1/12 702/1 |
| 8,165,812 B2* | 4/2012 | Hoff | G01W 1/12 702/1 |
| 8,165,813 B2* | 4/2012 | Hoff | H02S 10/00 702/1 |
| 8,335,649 B1* | 12/2012 | Hoff | G01W 1/12 702/1 |
| 8,437,959 B2* | 5/2013 | Hoff | G01W 1/12 702/3 |
| 8,682,585 B1* | 3/2014 | Hoff | H02S 50/10 702/3 |
| 9,007,460 B2 | 4/2015 | Schmidt et al. | |
| 9,086,585 B2 | 7/2015 | Hamada et al. | |
| 9,103,719 B1 | 8/2015 | Ho et al. | |
| 9,411,073 B1* | 8/2016 | Hoff | G06F 17/18 |
| 2005/0055137 A1 | 3/2005 | Andren et al. | |
| 2007/0084502 A1 | 4/2007 | Kelly et al. | |
| 2008/0258051 A1 | 10/2008 | Heredia et al. | |
| 2009/0125275 A1 | 5/2009 | Woro | |
| 2009/0302681 A1 | 12/2009 | Yamada et al. | |
| 2010/0219983 A1 | 9/2010 | Peleg et al. | |
| 2011/0137591 A1 | 6/2011 | Ishibashi | |
| 2011/0276269 A1 | 11/2011 | Hummel | |
| 2011/0307109 A1 | 12/2011 | Sri-Jayantha | |
| 2012/0191439 A1 | 7/2012 | Meagher et al. | |
| 2013/0054662 A1 | 2/2013 | Coimbra | |
| 2013/0152998 A1 | 6/2013 | Herzig | |
| 2014/0039709 A1 | 2/2014 | Steven et al. | |

OTHER PUBLICATIONS

S. Pless, Procedure for Measuring and Reporting the Performance of Photovoltaic Systems in Buildings, 62 pages, Oct. 2005.*

K. A. Emery, Solar Cell Efficiency Measurements, Solar Cells, 17 (1986) 253-274.*

Daniel S. Shugar, "Photovoltaics in the Utility Distribution System: The Evaluation of System and Distributed Benefits," 1990, Pacific Gas and Electric Company Department of Research and Development, p. 836-843.

Andreas Schroeder, "Modeling Storage and Demand Management in Power Distribution Grids," 2011, Applied Energy 88, p. 4700-4712.

Francisco M. Gonzalez-Longatt et al., "Impact of Distributed Generation Over Power Losses on Distribution System," Oct. 2007, Electrical Power Quality and Utilization, 9th International Conference.

M. Begovic et al., "Impact of Renewable Distributed Generation on Power Systems," 2001, Proceedings of the 34th Hawaii International Conference on System Sciences, p. 1-10.

M. Thomson et al., "Impact of Widespread Photovoltaics Generation on Distribution Systems," Mar. 2007, IET Renew. Power Gener., vol. 1, No. 1 p. 33-40.

Varun et al., "LCA of Renewable Energy for Electricity Generation Systems—A Review," 2009, Renewable and Sustainable Energy Reviews 13, p. 1067-1073.

V.H. Mendez, et a., "Impact of Distributed Generation on Distribution Investment Deferral," 2006, Electrical Power and Energy Systems 28, p. 244-252.

Mudathir Funsho Akorede et al., "Distributed Energy Resources and Benefits to the Environment," 2010, Renewable and Sustainable Energy Reviews 14, p. 724-734.

Pathomthat Chiradeja et al., "An Approaching to Quantify the Technical Benefits of Distributed Generation," Dec. 2004, IEEE Transactions on Energy Conversation, vol. 19, No. 4, p. 764-773.

Shahab Poshtkouhi et al., "A General Approach for Quantifying the Benefit of Distributed Power Electronics for Fine Grained MPPT in Photovoltaic Applications Using 3-D Modeling," Nov. 20, 2012, IEE Transactions on Poweer Electronics, vol. 27, No. 11, p. 4656-4666.

Li et al. "Analysis of solar heat gain factors using sky clearness index and energy implications." 2000.

Brinkman et al., "Toward a Solar-Powered Grid." IEEE Power & Energy, vol. 9, No. 3, May/Jun. 2011.

California ISO. Summary of Preliminary Results of 33% Renewable Integration Study—2010 CPUC LTPP. Docket No. R. 10-05-006 May 10, 2011.

Ellis et al., "Model Makers." IEEE Power & Energy, vol. 9, No. 3, May/Jun. 2011.

Danny at al., "Analysis of solar heat gain factors using sky clearness index and energy implications." Energy Conversions and Management, Aug. 2000.

Hoff et al., "Quantifying PV Power Output Variability." Solar Energy 84 (2010) 1782-1793, Oct. 2010.

Hoff et al., "PV Power Output Variability: Calculation of Correlation Coefficients Using Satellite Insolation Data." American Solar Energy Society Annual Conference Proceedings, Raleigh, NC, May 18, 2011.

Kuszamaul et al., "Lanai High-Density Irradiance Sensor Network for Characterizing Solar Resource Variability of MW-Scale PV System." 35th Photovoltaic Specialists Conference, Honolulu, HI. Jun. 20-25, 2010.

Serban C., "Estimating CLear SKy Solar Global Radiation Using Clearness Index, for Brasov Urban Area".

Mills et al., "Dark Shadows." IEEE Power & Energy, vol. 9, No. 3, May/Jun. 2011.

Mills et al., "Implications of Wide-Area Geographic Diversity for Short-Term Variability of Solar Power." Lawrence Berkeley National Laboratory Technical Report LBNL-3884E.

Perez et al., "Parameterization of site-specific short-term irradiance variability." Solar Energy, 85 (2011) 1343-1345, Nov. 2010.

Perez et al., "Short-term irradiance variability correlation as a function of distance." Solar Energy, Mar. 2011.

Philip, J., "The Probability Distribution of the Distance Between Two Random Points in a Box." www.math.kth.se/~johanph/habc.pdf. Dec. 2007.

Stein, J., "Simulation of 1-Minute Power Output from Utility-Scale Photovoltaic Generation Systems." American Solar Energy Society Annual Conference Proceedings, Raleigh, NC, May 18, 2011.

Solar Anywhere, 2011. Web-Based Service that Provides Hourly, Satellite-Derived Solar Irradiance Data Forecasted 7 days Ahead and Archival Data back to Jan. 1, 1998. www.SolarAnywhere.com.

Stokes et al., "The atmospheric radiation measurement (ARM) program: programmatic background and design of the cloud and radiation test bed." Bulletin of American Meteorological Society vol. 75, No. 7, pp. 1201-1221, Jul. 1994.

Hoff et al., "Modeling PV Fleet Output Variability," Solar Energy,May 2010.

Olopade at al., "Solar Radiation Characteristics and the performance of Photovoltaic (PV) Modules in a Tropical Station." Journal Sci. Res. Dev. vol. 11, 100-109, 2008/2009.

* cited by examiner

40

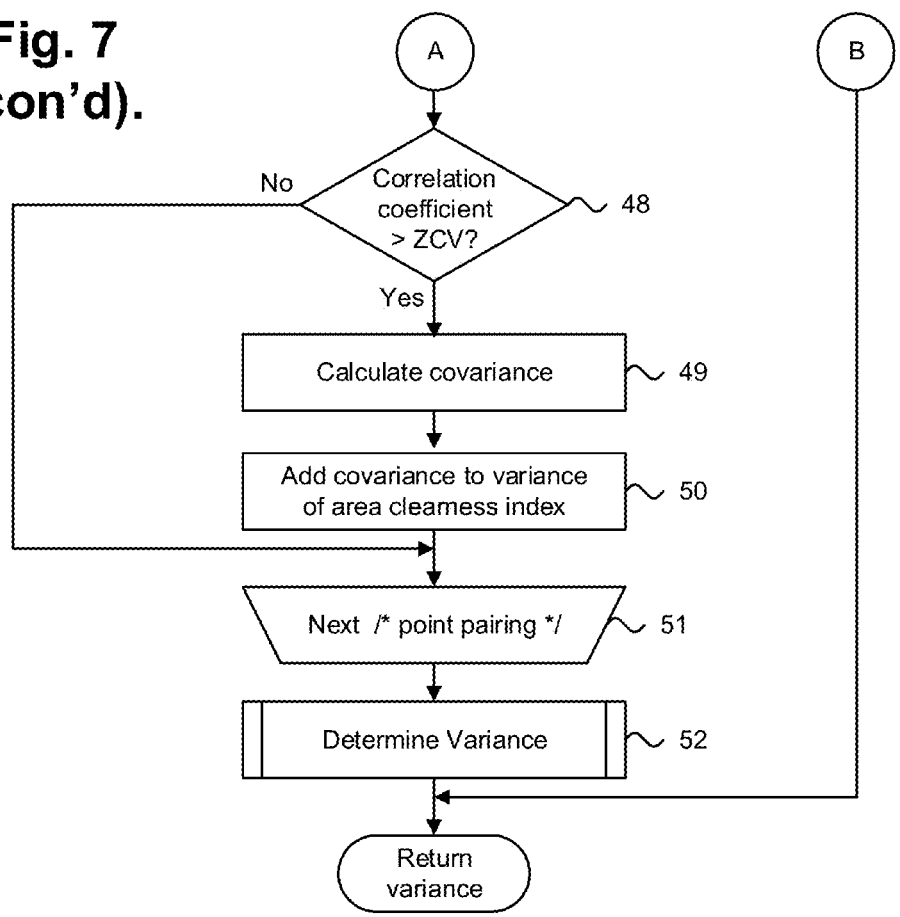
Fig. 7 (con'd).
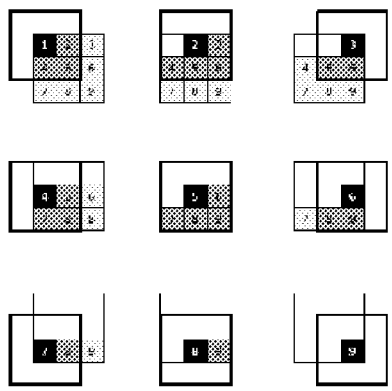
Fig. 8.

Fig. 11.
60

SOLARanywhere
powered by Clean Power Research

Home  Data  Contact  Admin  Toolkit

Welcome tomhoff@cleanpower.com | Logout

Select Delivery Method

| | |
|---|---|
| 1 tile selected: | [47.75, -122.35] ← 61 |
| Data range: | 1/1/2013 to 7/16/2013 ← 62 |
| Solar Model: | v2.3 |
| Wind/Temperature: | No |
| Spatial Resolution: | 0.1 degrees |
| Time Resolution: | [60 minutes ▼] ← 63 |
| Data Sets: | ☑ Timeseries  ☐ Monthly Totals  ☐ Annual Totals |
| | ☐ Average Months  ☐ Clear Sky  ☐ Animation |
| Output format: | [SolarAnywhere, Centered on satellite measurement time ▼] ← 64 |
| | (11:00 timestamp represents 10:30 to 11:30) |
| Site Name: | [SiteName]  (included in output files for your reference) |
| Delivery Method: | ⦿ Download  ○ Email |

Fig. 17.
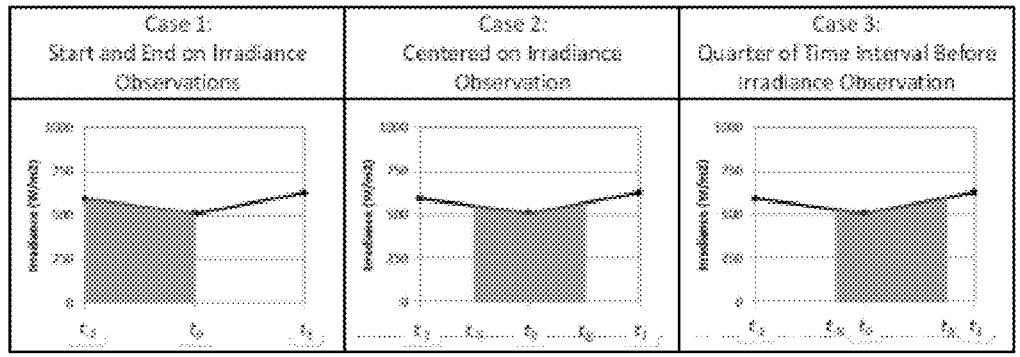
Fig. 18.
|  | | | $\omega_{t_1}$ |
|---|---|---|---|
| Case 1 ($f = 1$) | 1/2 | 1/2 | 0 |
| Case 2 ($f = ½$) | 1/8 | 3/4 | 1/8 |
| Case 3 ($f = ¼$) | 1/32 | 11/16 | 9/32 |
Fig. 19A.              Fig. 19B.
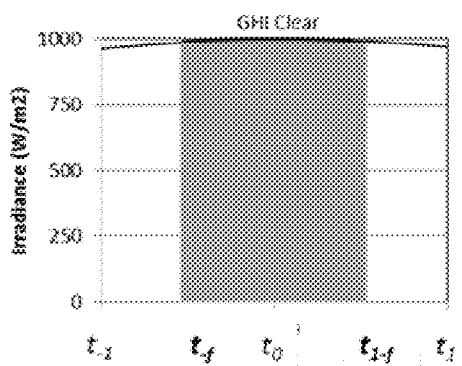 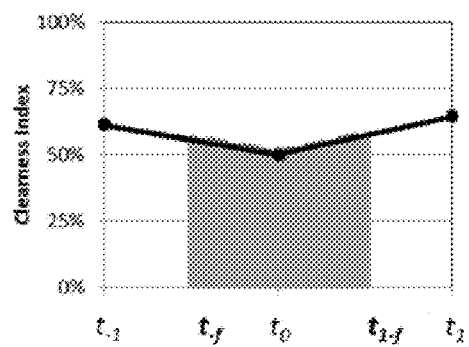

Fig. 20.

| | GOES Satellite | Time Resolution | \multicolumn{4}{c}{Observation Times} | | | | \multicolumn{3}{c}{Required Weighting Factors} | | |
|---|---|---|---|---|---|---|---|---|---|
| | | | 0 | 15 | 30 | 45 | Case 1 (f = 1) | Case 2 (f = ½) | Case 3 (f = ¼) |
| SolarAnywhere Standard Resolution | | | | | | | | | |
| | West | 60 Minutes | ✓ | | | | ✓ | | |
| | East | 60 Minutes | | ✓ | | | | | ✓ |
| SolarAnywhere Enhanced Resolution | | | | | | | | | |
| | West | 30 Minutes | ✓ | | ✓ | | ✓ | | |
| | East | 30 Minutes | | ✓ | | ✓ | | ✓ | |

Fig. 21.

| Location | Irradiance | | Normalized Irradiation | |
|---|---|---|---|---|
| | Un-tuned | Tuned | Linear Interp. | Optimized |
| Standard Resolution (Hourly Data) | | | | |
| Hanford, CA | 7.4% | 7.2% | 6.8% | 6.8% |
| Seattle, WA | 18.7% | 18.4% | 17.4% | 17.3% |
| Madison, WI | 14.4% | 14.4% | 14.0% | 13.9% |
| Penn State, PA | 16.5% | 16.1% | 15.5% | 15.4% |
| Desert Rock, NV | 8.8% | 8.8% | 8.6% | 8.5% |
| Boulder, CO | 18.8% | 18.8% | 17.4% | 17.3% |
| Enhanced Resolution (Half-Hour Data) | | | | |
| Hanford, CA | 7.1% | 6.5% | 6.0% | 6.0% |
| Campbell Oahu, HI | 19.5% | 16.9% | 15.4% | 14.9% |
| Kalaeloa Oahu, HI | 18.5% | 16.5% | 15.1% | 14.5% |
| Waipio Oahu, HI | 18.7% | 18.5% | 17.1% | 16.6% |

Napa, CA

Combine with Fleet Configuration

SYSTEM AND METHOD FOR ESTIMATING PHOTOVOLTAIC ENERGY GENERATION FOR USE IN PHOTOVOLTAIC FLEET OPERATION WITH THE AID OF A DIGITAL COMPUTER

CROSS-REFERENCE TO RELATED APPLICATION

This patent application is a continuation-in-part of U.S. Pat. No. 9,411,073, issued Aug. 9, 2016; which is a continuation-in-part of U.S. Pat. No. 8,437,959, issued May 7, 2013; which is a continuation of U.S. Pat. No. 8,335,649, issued Dec. 18, 2012; which is a continuation of U.S. Pat. No. 8,165,812, issued Apr. 24, 2012, the priority dates of which are claimed and the disclosures of which are incorporated by reference.

This invention was made with State of California support under Agreement Number 722. The California Public Utilities Commission of the State of California has certain rights to this invention.

FIELD

This application relates in general to photovoltaic power generation fleet planning and operation and, in particular, to a computer-implemented system and method for estimating photovoltaic energy generation for use in photovoltaic fleet operation.

BACKGROUND

The manufacture and usage of photovoltaic systems has advanced significantly in recent years due to a continually growing demand for renewable energy resources. The cost per watt of electricity generated by photovoltaic systems has decreased more dramatically than in earlier systems, especially when combined with government incentives offered to encourage photovoltaic power generation. Typically, when integrated into a power grid, photovoltaic systems are collectively operated as a fleet, although the individual systems in the fleet may be deployed at different physical locations within a geographic region.

Grid connection of photovoltaic power generation fleets is a fairly recent development. A power grid is an electricity generation, transmission, and distribution infrastructure that delivers electricity from supplies to consumers. As electricity is consumed almost immediately upon production, power generation and consumption must be balanced across the entire power grid. A large power failure in one part of the grid could cause electrical current to reroute from remaining power generators over transmission lines of insufficient capacity, which creates the possibility of cascading failures and widespread power outages.

Photovoltaic fleets connected to a power grid are expected to exhibit predictable generation behaviors. Accurate production data is particularly crucial when a photovoltaic fleet makes a significant contribution to a power grid's overall energy mix. Various kinds of photovoltaic plant production forecasts can be created and combined into photovoltaic power generation fleet forecasts, such as described in commonly-assigned U.S. Pat. Nos. 8,165,811; 8,165,812; 8,165,813, all issued to Hoff on Apr. 24, 2012; U.S. Pat. Nos. 8,326,535 and 8,326,536, issued to Hoff on Dec. 4, 2012; U.S. Pat. No. 8,335,649, issued to Hoff on Dec. 18, 2012; and U.S. Pat. No. 8,437,959, issued to Hoff on May 7, 2013, the disclosures of which are incorporated by reference.

Photovoltaic production forecasting first requires choosing a type of solar resource appropriate to the form of simulation. The solar resource data is then combined with each plant's system configuration in a photovoltaic simulation model, which generates a forecast of photovoltaic production. Confusion exists about the relationship between irradiance and irradiation, their respective applicability to forecasting, and how to correctly calculate normalized irradiation. In essence, solar power forecasting requires irradiance, which is an instantaneous measure of solar radiation that can be derived from a single ground-based observation, satellite imagery, numerical weather prediction models, or other sources. Solar energy forecasting requires normalized irradiation, which is an interval measure of solar radiation measured or projected over a time period.

The distinction between irradiance and normalized irradiation is frequently overlooked, yet confusing these two solar resources is causal to photovoltaic power and energy simulation inaccuracies. The rate and quantity terms used in photovoltaic production forecasting, irradiance and normalized irradiation, are semantically related and easily mixed up, whereas other fields use linguistically distinct terms, such as transportation, which refers to rate as speed and quantity as distance. As well, irradiance and normalized irradiation reverse conventional uses of time as measures of proportionality, where rate is merely expressed as $W/m^2$ (watts per square meter) and non-normalized quantity, that is, irradiation, is expressed as $W/m^2/h$ (watts per square meter per hour), or, in normalized form, using the same units as rate, $W/m^2$. Using the same units for both rate and quantity contributes to confusion. Irradiance and normalized irradiation are only guaranteed to be equivalent if the irradiance is constant over the time interval over which normalized irradiation is solved. This situation rarely occurs since the sun's position in the sky is constantly changing, albeit at a very slow rate.

In addition to applying the correct type of solar resource, the physical configuration of each photovoltaic system is critical to forecasting aggregate plant power output. Inaccuracies in the assumed specifications of individual photovoltaic system configurations directly translate to inaccuracies in their power output forecasts. Individual photovoltaic system configurations may vary based on power rating and electrical characteristics and by their operational features, such azimuth and tilt angles and shading or other physical obstructions.

Photovoltaic system power output is particularly sensitive to shading due to cloud cover. As well, photovoltaic fleets that combine individual plants physically scattered over a geographical area may be subject to different weather conditions due to cloud cover and cloud speed with an effect on aggregate fleet power output. Photovoltaic fleets operating under cloudy conditions can exhibit variable and potentially unpredictable performance. Conventionally, fleet variability is determined by collecting and feeding direct power measurements from individual photovoltaic systems or indirectly-derived power measurements into a centralized control computer or similar arrangement. However, the practicality of such an approach diminishes as the number of systems, variations in system configurations, and geographic dispersion of the fleet grow.

For instance, one direct approach to obtaining high speed time series power production data from a fleet of existing photovoltaic systems is to install physical meters on every photovoltaic system, record the electrical power output at a desired time interval, such as every 10 seconds, and sum the recorded output across all photovoltaic systems in the fleet at each time interval. An equivalent direct approach to obtaining high speed time series power production data is to collect solar irradiance data from a dense network of weather monitoring stations covering all anticipated locations at the desired time interval, use a photovoltaic performance model to simulate the high speed time series output data for each photovoltaic system individually, and then sum the results at each time interval.

With either direct approach to obtaining high speed time series power production data, several difficulties arise. First, in terms of physical plant, installing, operating, and maintaining meters and weather stations is expensive and detracts from cost savings otherwise afforded through a renewable energy source. Similarly, collecting, transmitting, and storing high speed data for every location requires collateral data communications and processing infrastructure. Moreover, data loss can occur if instrumentation or data communications fail.

Second, both direct approaches only work when and where meters are pre-installed; thus, high speed time series power production data is unavailable for all other locations, time periods, and photovoltaic system configurations. Both direct approaches also cannot be used to directly forecast future photovoltaic system performance since meters must be physically present at the time and location of interest. Data also must be recorded at the time resolution that corresponds to the desired output time resolution. While low time-resolution results can be calculated from high resolution data, the opposite calculation is not possible.

The few solar data networks that exist in the United States, such as the ARM network, described in G. M. Stokes et al., "The Atmospheric Radiation Measurement (ARM) Program: Programmatic Background and Design of the Cloud and Radiation Test Bed," Bull. of Am. Meteor. Soc., Vol. 75, pp. 1201-1221 (1994), the disclosure of which is incorporated by reference, and the SURFRAD network, lack high density networks and do not collect data at a fast rate. These limitations have prompted researchers to evaluate other alternatives, including dense networks of solar monitoring devices in a few limited locations, such as described in S. Kuszamaul et al., "Lanai High-Density Irradiance Sensor Network for Characterizing Solar Resource Variability of MW-Scale PV System." 35$^{th}$ Photovoltaic Specialists Conf., Honolulu, Hi. (Jun. 20-25, 2010), and R. George, "Estimating Ramp Rates for Large PV Systems Using a Dense Array of Measured Solar Radiation Data," Am. Solar Energy Society Annual Conf. Procs., Raleigh, N.C. (May 18, 2011), the disclosures of which are incorporated by reference. As data was collected, the researchers examined the data to determine whether there were underlying models that could translate results from these devices to photovoltaic fleet production operating over a broader geographical area, yet actual translation of the data was not provided.

In addition, satellite irradiance data for specific locations and time periods have been combined with randomly selected high speed data from a limited number of ground-based weather stations, such as described in CAISO 2011. "Summary of Preliminary Results of 33% Renewable Integration Study—2010," Cal. Pub. Util. Comm. LTPP No. R.10-05-006 (Apr. 29, 2011) and J. Stein, "Simulation of 1-Minute Power Output from Utility-Scale Photovoltaic Generation Systems," Am. Solar Energy Soc. Annual Conf. Procs., Raleigh, N.C. (May 18, 2011), the disclosures of which are incorporated by reference. This approach, however, does not produce time synchronized photovoltaic fleet variability for specific time periods because the locations of the ground-based weather stations differ from the actual locations of the fleet.

The concerns relating to high speed time series power production data acquisition also apply to photovoltaic fleet output estimation. Creating a fleet power forecast requires evaluation of the irradiance expected over each location within a photovoltaic fleet, which must be inferred for those locations where measurement-based sources of historical solar irradiance data are lacking. As well, irradiance derived from satellite imagery requires additional processing prior to use in simulating fleet time series output data. Finally, simulating fleet energy output or creating a fleet energy forecast requires evaluation of the normalized irradiation expected over the period of interest. Normalized irradiation is analogous to the average irradiance measured over a time interval, yet normalized irradiation is not always available, such as in situations where only point measurements of irradiance are sporadically collected or even entirely absent.

Therefore, a need remains for an approach to facilitating accurate photovoltaic power simulation by providing an appropriate type of solar resource, regardless of whether physically measured, for use in forecasting photovoltaic fleet power and energy output.

SUMMARY

The accuracy of photovoltaic simulation modeling is predicated upon the selection of a type of solar resource data appropriate to the form of simulation desired. Photovoltaic power simulation requires irradiance data. Photovoltaic energy simulation requires normalized irradiation data. Normalized irradiation is not always available, such as in photovoltaic plant installations where only point measurements of irradiance are sporadically collected or even entirely absent. Normalized irradiation can be estimated through several methodologies, including assuming that normalized irradiation simply equals irradiance, directly estimating normalized irradiation, applying linear interpolation to irradiance, applying linear interpolation to clearness index values, and empirically deriving irradiance weights. The normalized irradiation can then be used to forecast photovoltaic fleet energy production.

One embodiment provides a computer-implemented system and method for estimating photovoltaic energy generation for use in photovoltaic fleet operation. Irradiance observations that have been measured at regular intervals for a plurality of locations suitable for operation of a photovoltaic fleet are obtained. Clear sky irradiance corresponding to the irradiance observations is obtained. Normalized irradiation is estimated at a point within the regular interval falling between each pair of the irradiance observations. A time series of clearness indexes is formed as a ratio of each normalized irradiation estimate and the corresponding clear sky irradiance. Energy for the photovoltaic fleet is statistically evaluated as a function of the time series of the clearness indexes and photovoltaic fleet power rating.

A further embodiment provides a computer-implemented system and method for estimating photovoltaic energy generation through averaged irradiance for use in photovoltaic fleet operation. Irradiance observations that have been measured at regular intervals for a plurality of locations are obtained. Each location is situated within a geographic region suitable for operation of a photovoltaic fleet. Clear sky irradiance corresponding to the irradiance observations is found. Each of the regular intervals within the irradiance observations is selected and normalized irradiation relative to a point within the selected regular interval is estimated as an average of those irradiance observations. Clearness indexes are generated as a ratio of the normalized irradiation estimate for each of the regular intervals and the corresponding clear sky irradiance, and a time series of the clearness indexes is formed for all locations. Normalized irradiation statistics are determined through statistical evaluation of the time series of the clearness indexes. Energy statistics for the photovoltaic fleet are built as a function of the normalized irradiation statistics and an overall photovoltaic fleet power rating.

A still further embodiment provides a computer-implemented system and method for estimating photovoltaic energy generation through interpolated irradiance for use in photovoltaic fleet operation. Irradiance observations that have been measured at regular intervals for a plurality of locations are obtained. Each location is situated within a geographic region suitable for operation of a photovoltaic fleet. Clear sky irradiance corresponding to the irradiance observations is found. Each consecutive pair of regular intervals within the irradiance observations, and a fractional offset about the middle irradiance observation within the consecutive pair of the regular intervals are selected. A pair of linear slopes between the middle irradiance observation and each of the other two irradiance observations within the consecutive pair are interpolated. For each of the linear slopes, a weighting relative to the part of the fractional offset that falls under that linear slope is found. Normalized irradiation is estimated as the averages of the areas under each of the linear slopes in proportion to their respective weightings. Clearness indexes are generated as a ratio of the normalized irradiation estimate for each of the regular intervals and the corresponding clear sky irradiance, and a time series of the clearness indexes for all locations is formed. Normalized irradiation statistics are determined through statistical evaluation of the time series of the clearness indexes. Energy statistics for the photovoltaic fleet are built as a function of the normalized irradiation statistics and an overall photovoltaic fleet power rating.

A yet further embodiment provides a computer-implemented system and method for estimating photovoltaic energy generation through interpolated clearness indexes for use in photovoltaic fleet operation. Irradiance observations that have been measured at regular intervals for a plurality of locations are obtained. Each location is situated within a geographic region suitable for operation of a photovoltaic fleet. Clear sky irradiance corresponding to the irradiance observations is found. Each consecutive pair of regular intervals within the irradiance observations, and a fractional offset about the middle irradiance observation within the consecutive pair of the regular intervals are selected. A pair of linear slopes between the clearness index corresponding to the middle irradiance observation and the clearness indexes corresponding to each of the other two irradiance observations within the consecutive pair are interpolated. For each of the linear slopes, a weighting relative to the part of the fractional offset that falls under that linear slope is found. Normalized irradiation is estimated as a product of the averages of the clear sky irradiances corresponding to each of the linear slopes and the averages of the areas under each of the linear slopes in proportion to their respective weightings. Clearness indexes are generated as a ratio of the normalized irradiation estimate for each of the regular intervals and the corresponding clear sky irradiance, and a time series of the clearness indexes for all locations is formed. Normalized irradiation statistics are determined through statistical evaluation of the time series of the clearness indexes. Energy statistics for the photovoltaic fleet are built as a function of the normalized irradiation statistics and an overall photovoltaic fleet power rating.

Notable elements of this methodology non-exclusively include:

(1) Employing a fully derived statistical approach to generating high-speed photovoltaic fleet production data;

(2) Using a small sample of input data sources as diverse as ground-based weather stations, existing photovoltaic systems, or solar data calculated from satellite images;

(3) Producing results that are usable for any photovoltaic fleet configuration;

(4) Supporting any time resolution, even those time resolutions faster than the input data collection rate;

(5) Providing results in a form that is useful and usable by electric power grid planning and operation tools;

(6) Solving solar irradiance correlation matrices as needed for photovoltaic fleet output estimation in a linear solution space; and (7) Providing both instantaneous irradiance measures and time interval normalized irradiance measures for respective use in photovoltaic power and energy calculations, simulations and forecasting.

Still other embodiments will become readily apparent to those skilled in the art from the following detailed description, wherein are described embodiments by way of illustrating the best mode contemplated. As will be realized, other and different embodiments are possible and the embodiments' several details are capable of modifications in various obvious respects, all without departing from their spirit and the scope. Accordingly, the drawings and detailed description are to be regarded as illustrative in nature and not as restrictive.

BRIEF DESCRIPTION OF THE DRAWINGS

FIG. 8 is a block diagram showing, by way of example, nine evenly-spaced points within a three-by-three correlation region for evaluation by the function of FIG. 7.

FIG. 11 is a screen shot showing, by way of example, a user interface of the SolarAnywhere service.

FIG. 17 is a graph showing, by way of example, three cases of determining normalized irradiation through linear interpolation of the irradiance plotted in FIG. 14A.

FIG. 18 is a table presenting, by way of example, the normalized irradiation calculated for the three cases of FIG. 17.

FIGS. 19A-19B are graphs respectively showing, by way of example, determining clearness indexes through linear interpolation of the irradiance plotted of FIGS. 12A-12B.

FIG. 20 is a table presenting, by way of example, the weighting factors for calculating normalized irradiation for start at top of hour (or half-hour for Enhanced Resolution data) with end of period integration for the three cases of FIG. 17.

FIG. 21 is a table presenting, by way of example, the relative Mean Absolute Error for irradiance and normalized irradiation for the normalized irradiation estimates for the ten locations and resolution scenarios.

DETAILED DESCRIPTION

Photovoltaic cells employ semiconductors exhibiting a photovoltaic effect to generate direct current electricity through conversion of solar irradiance. Within each photovoltaic cell, light photons excite electrons in the semiconductors to create a higher state of energy, which acts as a charge carrier for the electrical current. The direct current electricity is converted by power inverters into alternating current electricity, which is then output for use in a power grid or other destination consumer. A photovoltaic system uses one or more photovoltaic panels that are linked into an array to convert sunlight into electricity. A single photovoltaic plant can include one or more of these photovoltaic arrays. In turn, a collection of photovoltaic plants can be collectively operated as a photovoltaic fleet that is integrated into a power grid, although the constituent photovoltaic plants within the fleet may actually be deployed at different physical locations spread out over a geographic region.

Figure 1:
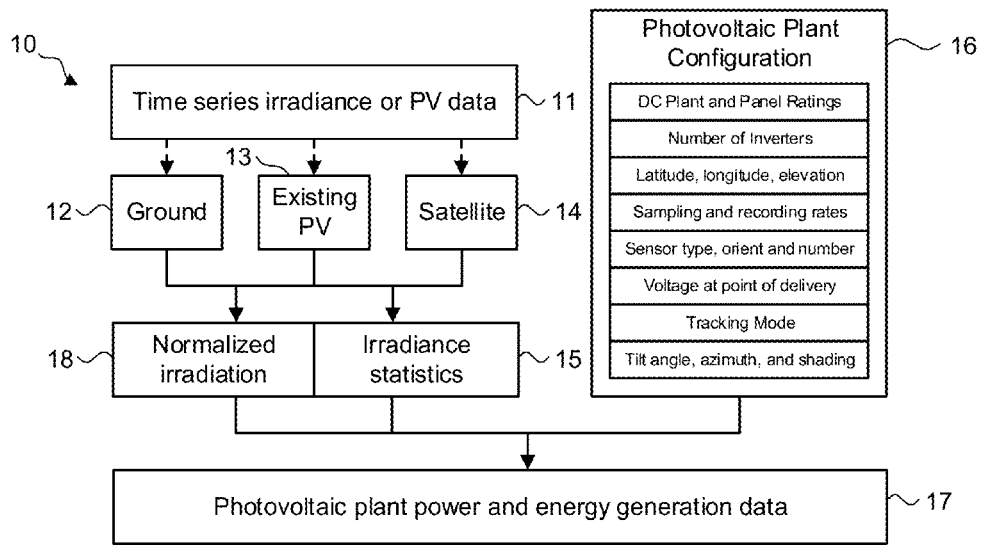
FIG. 1 is a flow diagram showing a computer-implemented method for estimating photovoltaic energy generation for use in photovoltaic fleet operation in accordance with one embodiment.

To aid with the planning and operation of photovoltaic fleets, whether at the power grid, supplemental, or standalone power generation levels, photovoltaic output power and energy production and variability must be estimated expeditiously, particularly when forecasts are needed in the near term. FIG. 1 is a flow diagram showing a computer-implemented method 10 for estimating photovoltaic energy generation for use in photovoltaic fleet operation in accordance with one embodiment. The method 10 can be implemented in software and execution of the software can be performed on a computer system, such as further described infra, as a series of process or method modules or steps.

Figure 3:
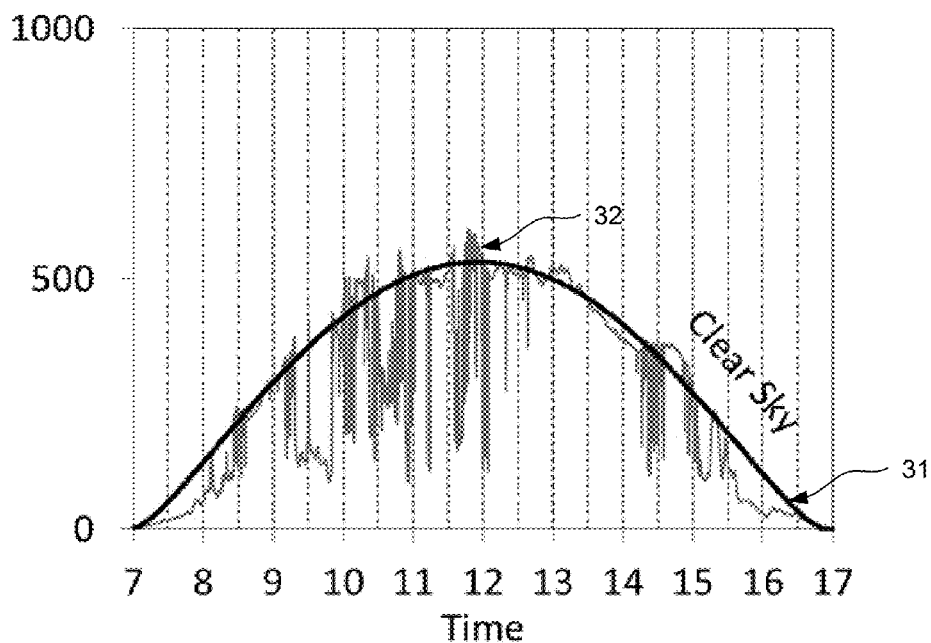
FIG. 3 is a graph depicting, by way of example, ten hours of time series irradiance data collected from a ground-based weather station with 10-second resolution.

A time series of solar irradiance or photovoltaic ("PV") data is first obtained (step 11) for a set of locations representative of the geographic region within which the photovoltaic fleet is located or intended to operate, as further described infra with reference to FIG. 3. Each time series contains solar irradiance observations, which are instantaneous measures associated with a single observation time that are measured or derived, then electronically recorded at a known sampling rate at fixed time intervals, such as at half-hour intervals, over successive observational time periods. The solar irradiance observations can include solar irradiance measured by a representative set of ground-based weather stations (step 12), existing photovoltaic systems (step 13), satellite observations (step 14), or some combination thereof. Other sources of the solar irradiance data are possible, including numeric weather prediction models.

Next, the solar irradiance data in the time series is converted over each of the time periods, such as at half-hour intervals, into a set of global horizontal irradiance (GHI) clearness indexes, which are calculated relative to clear sky global horizontal irradiance based on the type of solar irradiance data, such as described in commonly-assigned U.S. Patent application, entitled "Computer-Implemented Method for Tuning Photovoltaic Power Generation Plant Forecasting," Ser. No. 13/677,175, filed Nov. 14, 2012, pending, the disclosure of which is incorporated by reference. The set of clearness indexes can be interpreted into irradiance statistics (step 15), as further described infra with reference to FIGS. 4-6. The solar irradiance data and, in a further embodiment, the set of clearness indexes, can also be interpreted into normalized irradiation (step 18), as further described infra with reference to FIGS. 11-27.

Output data that can include power and energy data, including a time series of the power statistics for the photovoltaic plant, are generated (step 17) as a function of the irradiance statistics, photovoltaic plant configuration, and, if applicable, normalized irradiation (step 16). The photovoltaic plant configuration includes power generation and location information, including direct current ("DC") plant and photovoltaic panel ratings; number of power inverters; latitude, longitude and elevation; sampling and recording rates; sensor type, orientation, and number; voltage at point of delivery; tracking mode (fixed, single-axis tracking, dual-axis tracking), azimuth angle, tilt angle, row-to-row spacing, tracking rotation limit, and shading or other physical obstructions. In a further embodiment, photovoltaic plant configuration specifications can be inferred, which can be used to correct, replace or, if configuration data is unavailable, stand-in for the plant's specifications, such as described in commonly-assigned U.S. Patent application, entitled "Computer-Implemented System and Method for Inferring Operational Specifications of a Photovoltaic Power Generation System," Ser. No. 13/784,560, filed Mar. 4, 2013, pending, the disclosure of which is incorporated by reference. Other types of information can also be included as part of the photovoltaic plant configuration. The resultant high-speed time series plant performance data can be combined to estimate photovoltaic fleet power output and variability, such as described in commonly-assigned U.S. Pat. Nos. 8,165,811; 8,165,812; 8,165,813; 8,326,535; 8,335,649; and 8,326,536, cited supra, for use by power grid planners, operators and other interested parties.

The calculated irradiance statistics are combined with the photovoltaic fleet configuration to generate the high-speed time series photovoltaic production data. In a further embodiment, the foregoing methodology may also require conversion of weather data for a region, such as data from satellite regions, to average point weather data. A non-optimized approach would be to calculate a correlation coefficient matrix on-the-fly for each satellite data point. Alternatively, a conversion factor for performing area-to-point conversion of satellite imagery data is described in commonly-assigned U.S. Pat. Nos. 8,165,813 and 8,326,536, cited supra.

Figure 2:
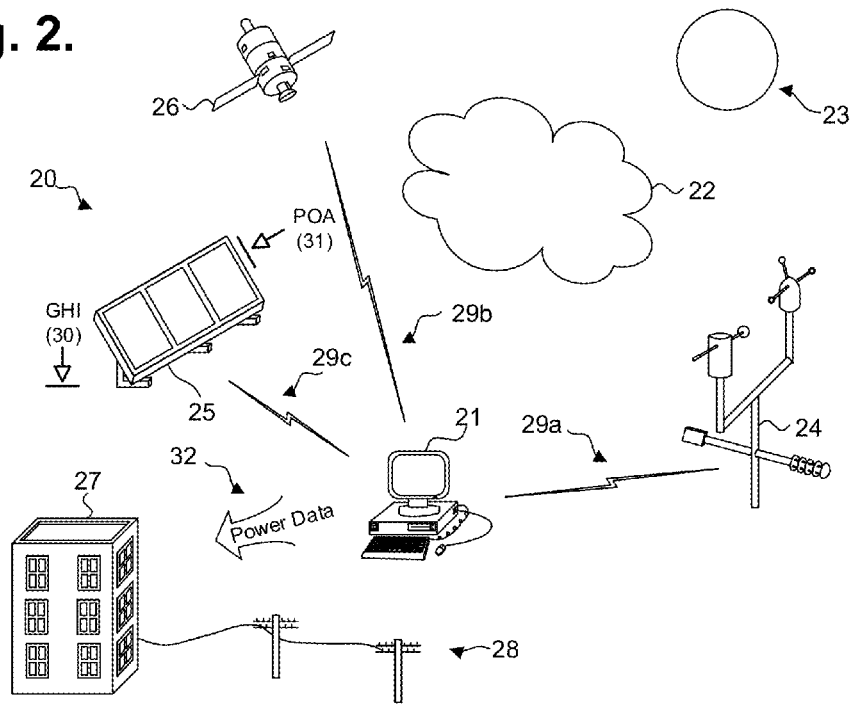
FIG. 2 is a block diagram showing a computer-implemented system for estimating photovoltaic energy generation for use in photovoltaic fleet operation in accordance with one embodiment.

Each forecast of power production data for a photovoltaic plant predicts the expected power or energy output over a forecast period. FIG. 2 is a block diagram showing a computer-implemented system 20 for estimating photovoltaic energy generation for use in photovoltaic fleet operation in accordance with one embodiment. Time series power output data 32 for a photovoltaic plant is generated using observed field conditions relating to overhead sky clearness. Solar irradiance 23 relative to prevailing cloudy conditions 22 in a geographic region of interest is measured. Solar irradiance 23 measures the instantaneous power of solar radiation per unit area incident on a surface. On the other hand, solar irradiation (not shown), which is a computed value, measures the solar radiation energy received on a unit area incident on a surface as recorded over an interval of time. Time-averaged solar irradiance is termed normalized irradiation.

Direct solar irradiance measurements can be collected by ground-based weather stations 24. Solar irradiance measurements can also be derived or inferred by the actual power output of existing photovoltaic systems 25. Additionally, satellite observations 26 can be obtained for the geographic region. In a further embodiment, the solar irradiance can be generated, derived or inferred by numerical weather prediction models. Both the direct and inferred solar irradiance measurements are considered to be sets of point values that relate to a specific physical location, whereas satellite imagery data is considered to be a set of area values that need to be converted into point values, such as described in commonly-assigned U.S. Pat. Nos. 8,165,813 and 8,326,536, cited supra. Still other sources of solar irradiance measurements are possible.

The solar irradiance measurements are centrally collected by a computer system 21 or equivalent computational device. The computer system 21 executes the methodology described supra with reference to FIG. 1 and as further detailed herein to generate time series power data 26 and other analytics, which can be stored or provided 27 to planners, operators, and other parties for use in solar power generation 28 planning and operations. In a further embodiment, the computer system 21 executes a methodology for inferring operational specifications of a photovoltaic power generation system, such as described in commonly-assigned U.S. patent application Ser. No. 13/784,560, filed Mar. 4, 2013, the disclosure of which is incorporated by reference, which can be stored or provided 27 to planners and other interested parties for use in predicting individual and fleet power output generation. In a still further embodiment, the computer system 21 executes the methodology described infra beginning with reference to FIG. 11 to determine normalized irradiation, which can similarly be stored or provided 27 to planners and other interested parties for use in predicting individual and fleet energy output generation. Still other forms of power and energy data are possible.

The data feeds 29a-c from the various sources of solar irradiance data need not be high speed connections; rather, the solar irradiance measurements can be obtained at an input data collection rate, and application of the methodology described herein provides the generation of an output time series at any time resolution, even faster than the input time resolution. The computer system 21 includes hardware components conventionally found in a general purpose programmable computing device, such as a central processing unit, memory, user interfacing means, such as a keyboard, mouse, and display, input/output ports, network interface, and non-volatile storage, and execute software programs structured into routines, functions, and modules for execution on the various systems. In addition, other configurations of computational resources, whether provided as a dedicated system or arranged in client-server or peer-to-peer topologies, and including unitary or distributed processing, communications, storage, and user interfacing, are possible.

The detailed steps performed as part of the methodology described supra with reference to FIG. 1 will now be described.

Obtain Time Series Irradiance Data

The first step is to obtain time series irradiance data from representative locations. This data can be obtained from ground-based weather stations, existing photovoltaic systems, a satellite network, or some combination sources, as well as from other sources. The solar irradiance data is collected from several sample locations across the geographic region that encompasses the photovoltaic fleet.

Direct irradiance data can be obtained by collecting weather data from ground-based monitoring systems. FIG. 3 is a graph depicting, by way of example, ten hours of time series irradiance data collected from a ground-based weather station with 10-second resolution, that is, the time interval equals ten seconds. In the graph, the blue line 32 is the measured horizontal irradiance and the black line 31 is the calculated clear sky horizontal irradiance for the location of the weather station.

Irradiance data can also be inferred from select photovoltaic systems using their electrical power output measurements. A performance model for each photovoltaic system is first identified, and the input solar irradiance corresponding to the power output is determined.

Finally, satellite-based irradiance data can also be used. As satellite imagery data is pixel-based, the data for the geographic region is provided as a set of pixels, which span across the region and encompassing the photovoltaic fleet.

Calculate Irradiance Statistics

The time series irradiance data for each location is then converted into time series clearness index data, which is then used to calculate irradiance statistics, as described infra.

Clearness Index (Kt)

Figure 4:
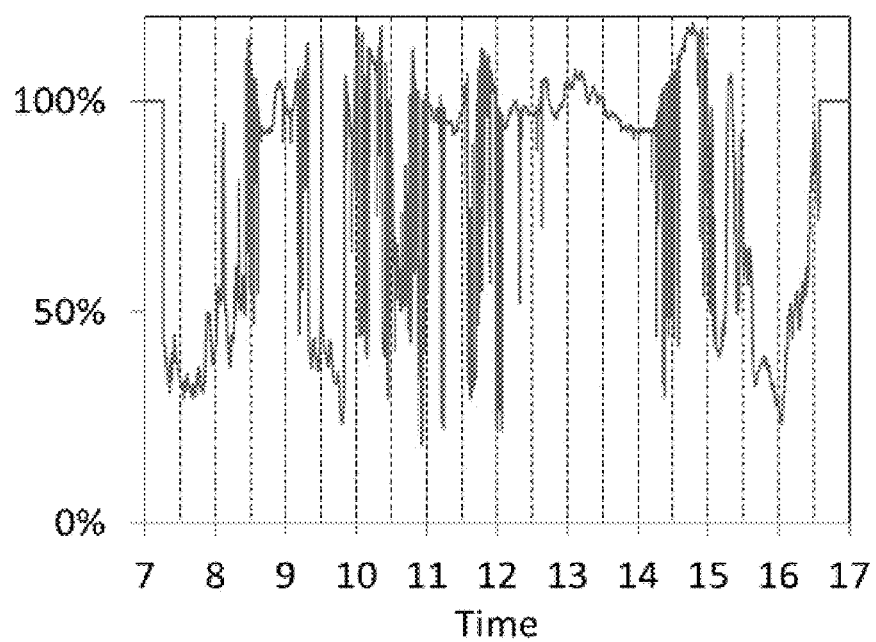
FIG. 4 is a graph depicting, by way of example, the clearness index that corresponds to the irradiance data presented in FIG. 3.

The clearness index (Kt) is calculated for each observation in the data set. In the case of an irradiance data set, the clearness index is determined by dividing the measured global horizontal irradiance by the clear sky global horizontal irradiance, which may be obtained from any of a variety of analytical methods. FIG. 4 is a graph depicting, by way of example, the clearness index that corresponds to the irradiance data presented in FIG. 3. Calculation of the clearness index as described herein is also generally applicable to other expressions of irradiance and cloudy conditions, including global horizontal and direct normal irradiance.

Change in Clearness Index ($\Delta Kt$)

Figure 5:
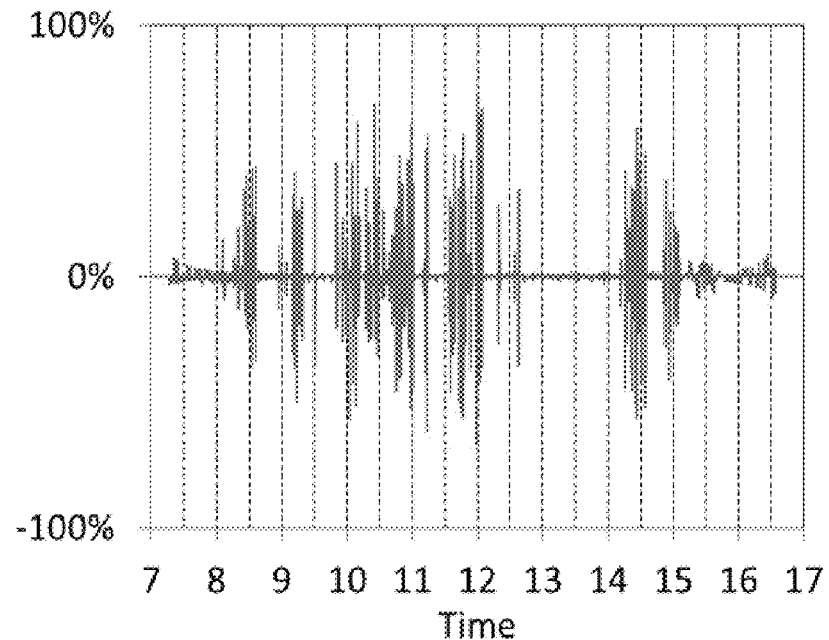
FIG. 5 is a graph depicting, by way of example, the change in clearness index that corresponds to the clearness index presented in FIG. 4.

The change in clearness index ($\Delta Kt$) over a time increment of $\Delta t$ is the difference between the clearness index starting at the beginning of a time increment t and the clearness index starting at the beginning of a time increment t, plus a time increment $\Delta t$. FIG. 5 is a graph depicting, by way of example, the change in clearness index that corresponds to the clearness index presented in FIG. 4.

Time Period

The time series data set is next divided into time periods, for instance, from five to sixty minutes, over which statistical calculations are performed. The determination of time period is selected depending upon the end use of the power output data and the time resolution of the input data. For example, if fleet variability statistics are to be used to schedule regulation reserves on a 30-minute basis, the time period could be selected as 30 minutes. The time period must be long enough to contain a sufficient number of sample observations, as defined by the data time interval, yet be short enough to be usable in the application of interest. An empirical investigation may be required to determine the optimal time period as appropriate.

Fundamental Statistics

Table 1 lists the irradiance statistics calculated from time series data for each time period at each location in the geographic region. Note that time period and location subscripts are not included for each statistic for purposes of notational simplicity.

TABLE 1

| Statistic | Variable |
| --- | --- |
| Mean clearness index | $\mu_{Kt}$ |
| Variance clearness index | $\sigma_{Kt}^2$ |
| Mean clearness index change | $\mu_{\Delta Kt}$ |
| Variance clearness index change | $\sigma_{\Delta Kt}^2$ |

Table 2 lists sample clearness index time series data and associated irradiance statistics over five-minute time periods. The data is based on time series clearness index data that has a one-minute time interval. The analysis was performed over a five-minute time period. Note that the clearness index at 12:06 is only used to calculate the clearness index change and not to calculate the irradiance statistics.

TABLE 2

|  | Clearness index (Kt) | Clearness index Change ($\Delta Kt$) |
| --- | --- | --- |
| 12:00 | 50% | 40% |
| 12:01 | 90% | 0% |
| 12:02 | 90% | −80% |
| 12:03 | 10% | 0% |
| 12:04 | 10% | 80% |
| 12:05 | 90% | −40% |
| 12:06 | 50% |  |
| Mean ($\mu$) | 57% | 0% |
| Variance ($\sigma^2$) | 13% | 27% |

The mean clearness index change equals the first clearness index in the succeeding time period, minus the first clearness index in the current time period divided by the number of time intervals in the time period. The mean clearness index change equals zero when these two values are the same. The mean is small when there are a sufficient number of time intervals. Furthermore, the mean is small relative to the clearness index change variance. To simplify the analysis, the mean clearness index change is assumed to equal zero for all time periods.

Figure 6:
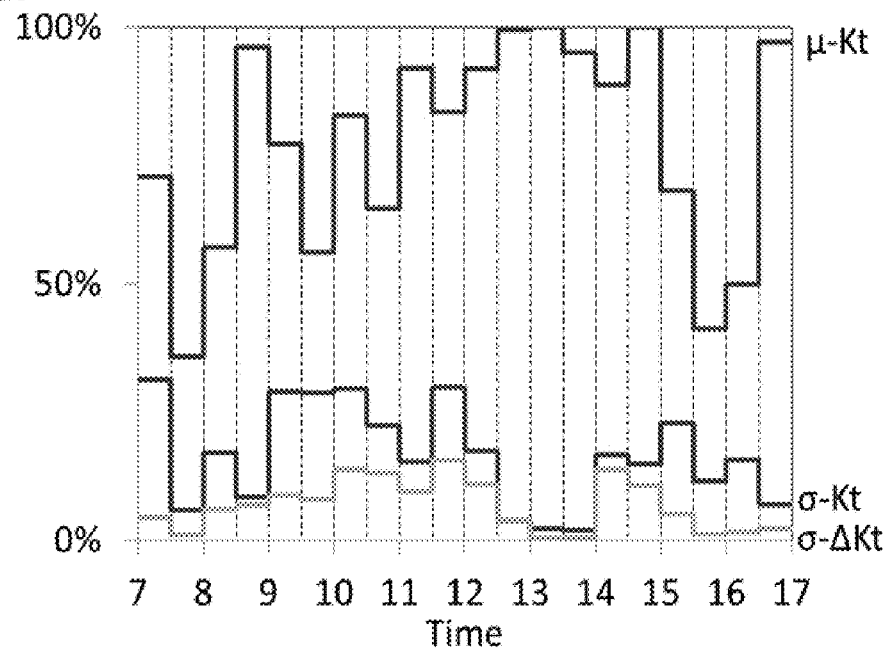
FIG. 6 is a graph depicting, by way of example, the irradiance statistics that correspond to the clearness index in FIG. 4 and the change in clearness index in FIG. 5.

FIG. 6 is a graph depicting, by way of example, the irradiance statistics that correspond to the clearness index in FIG. 4 and the change in clearness index in FIG. 5 using a half-hour hour time period. Note that FIG. 6 presents the standard deviations, determined as the square root of the variance, rather than the variances, to present the standard deviations in terms that are comparable to the mean.

Calculate Fleet Irradiance Statistics

Irradiance statistics were calculated in the previous section for the data stream at each sample location in the geographic region. The meaning of these statistics, however, depends upon the data source. Irradiance statistics calculated from ground-based weather station data represent results for a specific geographical location as point statistics. Irradiance statistics calculated from satellite data represent results for a region as area statistics. For example, if a satellite pixel corresponds to a one square kilometer grid, then the results represent the irradiance statistics across a physical area one kilometer square.

Average irradiance statistics across the photovoltaic fleet region are a critical part of the methodology described herein. This section presents the steps to combine the statistical results for individual locations and calculate average irradiance statistics for the region as a whole. The steps differ depending upon whether point statistics or area statistics are used.

Irradiance statistics derived from ground-based sources simply need to be averaged to form the average irradiance statistics across the photovoltaic fleet region. Irradiance statistics from satellite sources are first converted from irradiance statistics for an area into irradiance statistics for an average point within the pixel. The average point statistics are then averaged across all satellite pixels to determine the average across the photovoltaic fleet region.

Mean Clearness Index ($\mu_{\overline{Kt}}$) and Mean Change in Clearness Index ($\mu_{\overline{\Delta Kt}}$)

The mean clearness index should be averaged no matter what input data source is used, whether ground, satellite, or photovoltaic system originated data. If there are N locations, then the average clearness index across the photovoltaic fleet region is calculated as follows.

$$\mu_{\overline{Kt}} = \sum_{i=1}^{N} \frac{\mu_{Kt_i}}{N} \tag{1}$$

The mean change in clearness index for any period is assumed to be zero. As a result, the mean change in clearness index for the region is also zero.

$$\mu_{\overline{\Delta Kt}} = 0 \tag{2}$$

Convert Area Variance to Point Variance

The following calculations are required if satellite data is used as the source of irradiance data. Satellite observations represent values averaged across the area of the pixel, rather than single point observations. The clearness index derived from this data ($Kt^{Area}$) may therefore be considered an average of many individual point measurements.

$$Kt^{Area} = \sum_{i=1}^{N} \frac{Kt^i}{N} \tag{3}$$

As a result, the variance of the area clearness index based on satellite data can be expressed as the variance of the average clearness indexes across all locations within the satellite pixel.

$$\sigma^2_{Kt-Area} = VAR[Kt^{Area}] = VAR\left[\sum_{i=1}^{N} \frac{Kt^i}{N}\right] \tag{4}$$

The variance of a sum, however, equals the sum of the covariance matrix.

$$\sigma^2_{Kt-Area} = \left(\frac{1}{N^2}\right) \sum_{i=1}^{N} \sum_{j=1}^{N} COV[Kt^i, Kt^j] \tag{5}$$

Let $\rho^{Kt^i,Kt^j}$ represents the correlation coefficient between the clearness index at location i and location j within the satellite pixel. By definition of correlation coefficient, $COV[Kt^i,Kt^j]=\sigma_{Kt}^i \sigma_{Kt}^j \rho^{Kt^i,Kt^j}$. Furthermore, since the objective is to determine the average point variance across the satellite pixel, the standard deviation at any point within the satellite pixel can be assumed to be the same and equals $\sigma_{Kt}$, which means that $\sigma_{Kt}^i \sigma_{Kt}^j = \sigma_{Kt}^2$ for all location pairs. As a result, $COV[Kt^i,Kt^j]=\sigma_{Kt}^2 \rho^{Kt^i,Kt^j}$. Substituting this result into Equation (5) and simplify.

$$\sigma^2_{Kt-Area} = \sigma^2_{Kt}\left(\frac{1}{N^2}\right) \sum_{i=1}^{N} \sum_{j=1}^{N} \rho^{Kt^i,Kt^j} \tag{6}$$

Suppose that data was available to calculate the correlation coefficient in Equation (6). The computational effort required to perform a double summation for many points can be quite large and computationally resource intensive. For example, a satellite pixel representing a one square kilometer area contains one million square meter increments. With one million increments, Equation (6) would require one trillion calculations to compute.

The calculation can be simplified by conversion into a continuous probability density function of distances between location pairs across the pixel and the correlation coefficient for that given distance, as further described infra. Thus, the irradiance statistics for a specific satellite pixel, that is, an area statistic, rather than a point statistic, can be converted into the irradiance statistics at an average point within that pixel by dividing by a "Area" term (A), which corresponds to the area of the satellite pixel. Furthermore, the probability density function and correlation coefficient functions are generally assumed to be the same for all pixels within the fleet region, making the value of A constant for all pixels and reducing the computational burden further. Details as to how to calculate A are also further described infra.

$$\sigma^2_{Kt} = \frac{\sigma^2_{Kt-Area}}{A_{Kt}^{Satellite\ Pixel}} \tag{7}$$

where:

$$A_{Kt}^{Satellite\ Pixel} = \left(\frac{1}{N^2}\right) \sum_{i=1}^{N} \sum_{j=1}^{N} \rho^{i,j} \tag{8}$$

Likewise, the change in clearness index variance across the satellite region can also be converted to an average point estimate using a similar conversion factor, $A_{\Delta Kt}^{Area}$.

$$\sigma^2_{\Delta Kt} = \frac{\sigma^2_{\Delta Kt-Area}}{A_{\Delta Kt}^{Satellite\ Pixel}} \tag{9}$$

Variance of Clearness Index ($\sigma_{\overline{Kt}}^2$) and Variance of Change in Clearness Index ($\sigma_{\overline{\Delta Kt}}^2$)

At this point, the point statistics ($\sigma_{Kt}^2$ and $\sigma_{\Delta Kt}^2$) have been determined for each of several representative locations within the fleet region. These values may have been obtained from either ground-based point data or by converting satellite data from area into point statistics. If the fleet region is small, the variances calculated at each location i can be averaged to determine the average point variance across the fleet region. If there are N locations, then average variance of the clearness index across the photovoltaic fleet region is calculated as follows.

$$\sigma_{Kt}^2 = \sum_{i=1}^{N} \frac{\sigma_{Kt_i}^2}{N} \quad (10)$$

Likewise, the variance of the clearness index change is calculated as follows.

$$\sigma_{\Delta Kt}^2 = \sum_{i=1}^{N} \frac{\sigma_{\Delta Kt_i}^2}{N} \quad (11)$$

Calculate Fleet Power Statistics

The next step is to calculate photovoltaic fleet power statistics using the fleet irradiance statistics, as determined supra, and physical photovoltaic fleet configuration data. These fleet power statistics are derived from the irradiance statistics and have the same time period.

The critical photovoltaic fleet performance statistics that are of interest are the mean fleet power, the variance of the fleet power, and the variance of the change in fleet power over the desired time period. As in the case of irradiance statistics, the mean change in fleet power is assumed to be zero.

Photovoltaic System Power for Single System at Time t

Photovoltaic system power output (kW) is approximately linearly related to the AC-rating of the photovoltaic system (R in units of $kW_{AC}$) times plane-of-array irradiance. Plane-of-array irradiance can be represented by the clearness index over the photovoltaic system (KtPV) times the clear sky global horizontal irradiance times an orientation factor (O), which both converts global horizontal irradiance to plane-of-array irradiance and has an embedded factor that converts irradiance from Watts/m² to kW output/kW of rating. Thus, at a specific point in time (t), the power output for a single photovoltaic system (n) equals:

$$P_t^n = R^n O_t^n KtPV_t^n I_t^{Clear,n} \quad (12)$$

The change in power equals the difference in power at two different points in time.

$$\Delta P_{t,\Delta t}^n = R^n O_{t+\Delta t}^n KtPV_{t+\Delta t}^n I_{t+\Delta t}^{Clear,n} - R^n O_t^n KtPV_t^n I_t^{Clear,n} \quad (13)$$

The rating is constant, and over a short time interval, the two clear sky plane-of-array irradiances are approximately the same ($O_{t+\Delta t}^n I_{t+\Delta t}^{Clear,n} \approx O_t^n I_t^{Clear,n}$), so that the three terms can be factored out and the change in the clearness index remains.

$$\Delta P_{t,\Delta t}^n \approx R^n O_t^n I_t^{Clear,n} \Delta KtPV_t^n \quad (14)$$

Time Series Photovoltaic Power for Single System $P^n$ is a random variable that summarizes the power for a single photovoltaic system n over a set of times for a given time interval and set of time periods. $\Delta P^n$ is a random variable that summarizes the change in power over the same set of times.

Mean Fleet Power ($\mu_P$)

The mean power for the fleet of photovoltaic systems over the time period equals the expected value of the sum of the power output from all of the photovoltaic systems in the fleet.

$$\mu_P = E\left[\sum_{n=1}^{N} R^n O^n KtPV^n I^{Clear,n}\right] \quad (15)$$

If the time period is short and the region small, the clear sky irradiance does not change much and can be factored out of the expectation.

$$\mu_P = \mu_{I^{Clear}} E\left[\sum_{n=1}^{N} R^n O^n KtPV^n\right] \quad (16)$$

Again, if the time period is short and the region small, the clearness index can be averaged across the photovoltaic fleet region and any given orientation factor can be assumed to be a constant within the time period. The result is that:

$$\mu_P = R^{Adj.Fleet} \mu_{I^{Clear}} \mu_{\overline{Kt}} \quad (17)$$

where $\mu_{I^{Clear}}$ is calculated, $\mu_{\overline{Kt}}$ is taken from Equation (1) and:

$$R^{Adj.Fleet} = \sum_{n=1}^{N} R^n O^n \quad (18)$$

This value can also be expressed as the average power during clear sky conditions times the average clearness index across the region.

$$\mu_P = \mu_P^{Clear} \mu_{\overline{Kt}} \quad (19)$$

Variance of Fleet Power ($\sigma_P^2$)

The variance of the power from the photovoltaic fleet equals:

$$\sigma_P^2 = VAR\left[\sum_{n=1}^{N} R^n O^n KtPV^n I^{Clear,n}\right] \quad (20)$$

If the clear sky irradiance is the same for all systems, which will be the case when the region is small and the time period is short, then:

$$\sigma_P^2 = VAR\left[I^{Clear} \sum_{n=1}^{N} R^n O^n KtPV^n\right] \quad (21)$$

The variance of a product of two independent random variables X, Y, that is, VAR[XY]) equals $E[X]^2 VAR[Y] + E[Y]^2 VAR[X] + VAR[X] VAR[Y]$. If the X random variable has a large mean and small variance relative to the other terms, then $VAR[XY] \approx E[X]^2 VAR[Y]$. Thus, the clear sky irradiance can be factored out of Equation (21) and can be written as:

$$\sigma_P^2 = (\mu_{I^{Clear}})^2 \text{VAR}\left[\sum_{n=1}^{N} R^n KtPV^n O^n\right] \quad (22)$$

The variance of a sum equals the sum of the covariance matrix.

$$\sigma_P^2 = (\mu_{I^{Clear}})^2 \left(\sum_{i=1}^{N}\sum_{j=1}^{N} \text{COV}[R^i KtPV^i O^i, R^j KtPV^j O^j]\right) \quad (23)$$

In addition, over a short time period, the factor to convert from clear sky GHI to clear sky POA does not vary much and becomes a constant. All four variables can be factored out of the covariance equation.

$$\sigma_P^2 = (\mu_{I^{Clear}})^2 \left(\sum_{i=1}^{N}\sum_{j=1}^{N} (R^i O^i)(R^j O^j) \text{COV}[KtPV^i, KtPV^j]\right) \quad (24)$$

For any $i$ and $j$, $\text{COV}[KtPV^i, KtPV^j] = \sqrt{\sigma_{KtPV^i}^2 \sigma_{KtPV^j}^2} \rho^{Kt^i,Kt^j}$.

$$\sigma_P^2 = (\mu_{I^{Clear}})^2 \left(\sum_{i=1}^{N}\sum_{j=1}^{N} (R^i O^i)(R^j O^j)\sqrt{\sigma_{KtPV^i}^2 \sigma_{KtPV^j}^2} \rho^{Kt^i,Kt^j}\right) \quad (25)$$

As discussed supra, the variance of the satellite data required a conversion from the satellite area, that is, the area covered by a pixel, to an average point within the satellite area. In the same way, assuming a uniform clearness index across the region of the photovoltaic plant, the variance of the clearness index across a region the size of the photovoltaic plant within the fleet also needs to be adjusted. The same approach that was used to adjust the satellite clearness index can be used to adjust the photovoltaic clearness index. Thus, each variance needs to be adjusted to reflect the area that the $i^{th}$ photovoltaic plant covers.

$$\sigma_{KtPV^i}^2 = A_{Kt}^i \sigma_{Kt}^2 \quad (26)$$

Substituting and then factoring the clearness index variance given the assumption that the average variance is constant across the region yields:

$$\sigma_P^2 = (R^{Adj.Fleet} \mu_{I^{Clear}})^2 P^{Kt} \sigma_{\overline{Kt}}^2 \quad (27)$$

where the correlation matrix equals:

$$P^{Kt} = \frac{\sum_{i=1}^{N}\sum_{j=1}^{N}(R^i O^i A_{Kt}^i)(R^j O^j A_{Kt}^j)\rho^{Kt^i,Kt^j}}{\left(\sum_{n=1}^{N} R^n O^n\right)^2} \quad (28)$$

$R^{Adj.Fleet}\mu_{I^{Clear}}$ in Equation (27) can be written as the power produced by the photovoltaic fleet under clear sky conditions, that is:

$$\sigma_P^2 = \mu_{P^{Clear}}^2 P^{Kt} \sigma_{\overline{Kt}}^2 \quad (29)$$

If the region is large and the clearness index mean or variances vary substantially across the region, then the simplifications may not be able to be applied. Notwithstanding, if the simplification is inapplicable, the systems are likely located far enough away from each other, so as to be independent. In that case, the correlation coefficients between plants in different regions would be zero, so most of the terms in the summation are also zero and an interregional simplification can be made. The variance and mean then become the weighted average values based on regional photovoltaic capacity and orientation.

Discussion

In Equation (28), the correlation matrix term embeds the effect of intra-plant and inter-plant geographic diversification. The area-related terms (A) inside the summations reflect the intra-plant power smoothing that takes place in a large plant and may be calculated using the simplified relationship, as further discussed supra. These terms are then weighted by the effective plant output at the time, that is, the rating adjusted for orientation. The multiplication of these terms with the correlation coefficients reflects the inter-plant smoothing due to the separation of photovoltaic systems from one another.

Variance of Change in Fleet Power ($\sigma_{\Delta P}^2$)

A similar approach can be used to show that the variance of the change in power equals:

$$\sigma_{\Delta P}^2 = \mu_{P^{Clear}}^2 P^{\Delta Kt} \sigma_{\overline{\Delta Kt}}^2 \quad (30)$$

where:

$$P^{\Delta Kt} = \frac{\sum_{i=1}^{N}\sum_{j=1}^{N}(R^i O^i A_{\Delta Kt}^i)(R^j O^j A_{\Delta Kt}^j)\rho^{\Delta Kt^i,\Delta Kt^j}}{\left(\sum_{n=1}^{N} R^n O^n\right)^2} \quad (31)$$

Variance of Change in Fleet Power as Decreasing Function of Distance

The determinations of Equations (5), (6), (8), (23), (24), (28), (30), and (31) each require solving a covariance matrix or some derivative of the covariance matrix, which becomes increasingly computationally intensive at an exponential or near-exponential rate as the network of points representing each system within the photovoltaic fleet grows. For example, a network with 10,000 photovoltaic systems would require the computation of a correlation coefficient matrix with 100 million calculations. As well, in some applications, the computation must be completed frequently and possibly over a near-term time window to provide fleet-wide power output forecasting to planners and operators. The computing of 100 million covariance solutions, though, can require an inordinate amount of computational resource expenditure in terms of processing cycles, network bandwidth and storage, plus significant time for completion, making frequent calculation effectively impracticable.

To illustrate the computational burden associated with solving a covariance matrix, consider an example of calculating the variability of the power output of a fleet of N photovoltaic systems. Let the power output associated with each individual photovoltaic system i be represented by the random variable $P^i$. The variance of the fleet FleetVariance is defined as follows:

$$\text{Fleet Variance} = \text{VAR}\left[\sum_{i=1}^{N} P^i\right] \quad (32)$$

In general, the variance of the sum of random variables can be expressed as the sum of the covariance matrix, provided that the variables are correlated. Thus, Equation (32) can be rewritten as:

$$\text{VAR}\left[\sum_{i=1}^{N} P^i\right] = \sum_{i=1}^{N}\sum_{j=1}^{N} \text{COV}[P^i, P^j] \quad (33)$$

Solving the covariance matrix in Equation (33) requires $N^2$ calculations, which represents an exponential computational burden. As a simplification, the computational burden can be reduced first, by recognizing that the covariance for a location and itself merely equals the variance of the location, and second, by noting that the covariance calculation is order independent, that is, the covariance between locations A and B equals the covariance between locations B and A. Thus, Equation (33) can be rewritten as:

$$\text{VAR}\left[\sum_{i=1}^{N} P^i\right] = \sum_{i=1}^{N} \sigma_{P^i}^2 + 2\sum_{i=1}^{N-1}\sum_{j=i+1}^{N} \text{COV}[P^i, P^j] \quad (34)$$

Equation (34) reduces the number of calculations by slightly less than half from $N^2$ to $N[(N-1)/2+1]$. This approach, however, is still exponentially related to the number of locations in the network and can therefore become intractable.

Another way to express each term in the covariance matrix is using the standard deviations and Pearson's correlation coefficient. The Pearson's correlation coefficient between two variables is defined as the covariance of the two variables divided by the product of their standard deviations. Thus, Equation (34) can be rewritten as:

$$\text{VAR}\left[\sum_{i=1}^{N} P^i\right] = \sum_{i=1}^{N}\sum_{j=1}^{N} \rho^{P^i, P^j} \sigma_{P^i} \sigma_{P^j} \quad (35)$$

However, Equation (35) still exhibits the same computational complexity as Equation (34) and does not substantially alleviate the computational load.

Skipping ahead, FIGS. 30A-30F are graphs depicting, by way of example, the measured and predicted weighted average correlation coefficients for each pair of locations versus distance. FIGS. 31A-31F are graphs depicting, by way of example, the same information as depicted in FIGS. 30A-30F versus temporal distance, based on the assumption that cloud speed was six meters per second. The upper line and dots appearing in close proximity to the upper line present the clearness index and the lower line and dots appearing in close proximity to the lower line present the change in clearness index for time intervals from 10 seconds to 5 minutes. The symbols are the measured results and the lines are the predicted results. FIGS. 30A-30F and 31A-31F suggest that the correlation coefficient for sky clearness between two locations, which is the critical variable in determining photovoltaic power production, is a decreasing function of the distance between the two locations. The correlation coefficient is equal to 1.0 when the two systems are located next to each other, while the correlation coefficient approaches zero as the distance increases, which implies that the covariance between the two locations beyond some distance is equal to zero, that is, the two locations are not correlated.

The computational burden can be reduced in at least two ways. First, where pairs of photovoltaic systems are located too far away from each other to be statistically correlated, the correlation coefficients in the matrix for that pair of photovoltaic systems are effectively equal to zero. Consequently, the double summation portion of the variance calculation can be simplified to eliminate zero values based on distance between photovoltaic plant locations. Second, once the simplification has been made, rather than calculating the entire covariance matrix on-the-fly for every time period, the matrix can be calculated once at the beginning of the analysis for a variety of cloud speed conditions, after which subsequent analyses would simply perform a lookup of the appropriate pre-calculated covariance value. The zero value simplification of the correlation coefficient matrix will now be discussed in detail.

Figure 7:
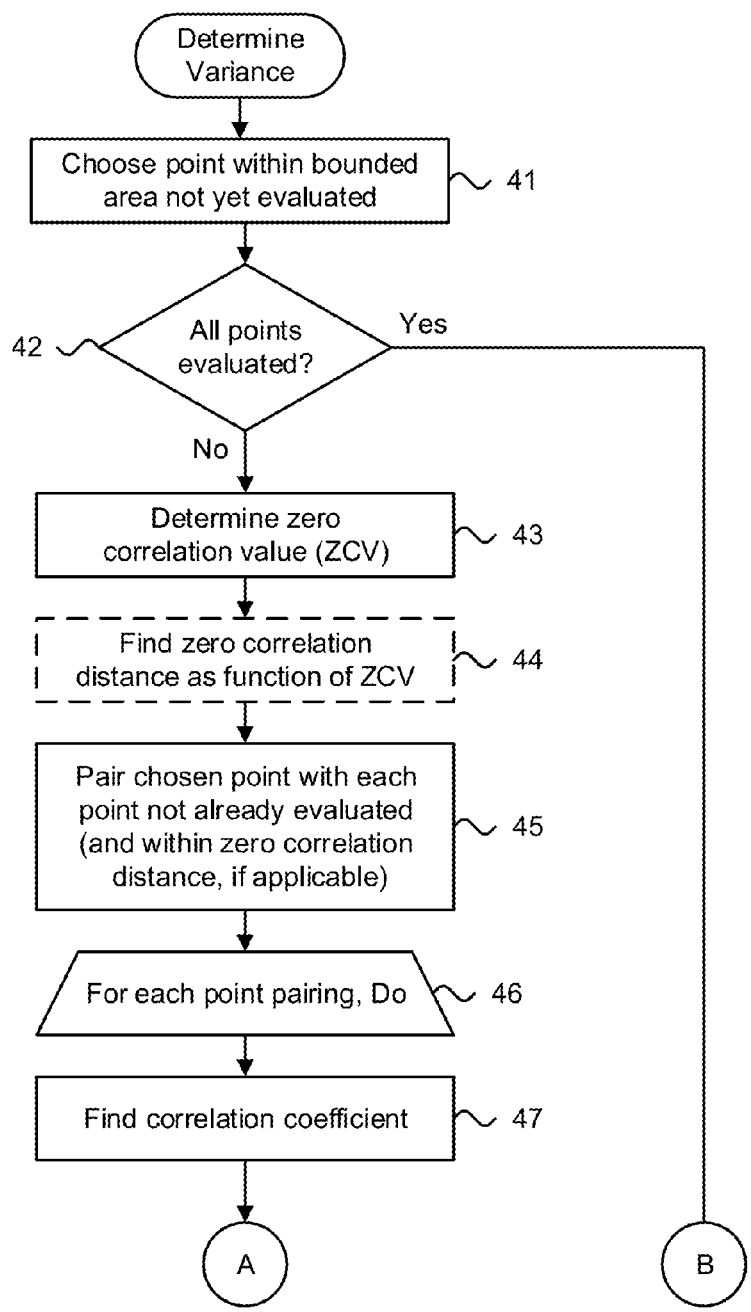
FIG. 7 is a flow diagram showing a function for determining variance for use with the method of FIG. 1.

As a heuristical simplification, the variance of change in fleet power can be computed as a function of decreasing distance. When irradiance data is obtained from a satellite imagery source, irradiance statistics must first be converted from irradiance statistics for an area into irradiance statistics for an average point within a pixel in the satellite imagery. The average point statistics are then averaged across all satellite pixels to determine the average across the whole photovoltaic fleet region. FIG. 7 is a flow diagram showing a function 40 for determining variance for use with the method 10 of FIG. 1. The function 40 calculates the variance of the average point statistics across all satellite pixels for the bounded area upon which a photovoltaic fleet either is (or can be) situated. Each point within the bounded area represents the location of a photovoltaic plant that is part of the fleet.

The function 40 is described as a recursive procedure, but could also be equivalently expressed using an iterative loop or other form of instruction sequencing that allows values to be sequentially evaluated. Additionally, for convenience, an identification number from an ordered list can be assigned to each point, and each point is then sequentially selected, processed and removed from the ordered list upon completion of evaluation. Alternatively, each point can be selected such that only those points that have not yet been evaluated are picked (step 41). A recursive exit condition is defined, such that if all points have been evaluated (step 42), the function immediately exits.

Otherwise, each point is evaluated (step 42), as follows. First, a zero correlation value is determined (step 43). The zero correlation value is a value for the correlation coefficients of a covariance matrix, such that, the correlation coefficients for a given pair of points that are equal to or less than (or, alternatively, greater than) the zero correlation value can be omitted from the matrix with essentially no effect on the total covariance. The zero correlation value can be used as a form of filter on correlation coefficients in at least two ways. The zero correlation value can be set to a near-zero value.

In one embodiment where the variance between the points within a bounded area is calculated as a bounded area variance using a continuous probability density function, the zero correlation value is a threshold value against which correlation coefficients are compared. In a further embodiment where the variance between the points within a bounded area is calculated as an average point variance, a zero correlation distance is found as a function of the zero correlation value (step 44). The zero correlation distance is the distance beyond which there is effectively no correlation between the photovoltaic system output (or the change in the photovoltaic system output) for a given pair of points. The zero correlation distance can be calculated, for instance, by setting Equation (64) (for power) or Equation (65) (for the change in power), as further discussed infra, equal to the zero correlation value and solving for distance. These equations provide that the correlation is a function of distance, cloud speed, and time interval. If cloud speed varies across the locations, then a unique zero correlation distance can be calculated for each point. In a further embodiment, there is one zero correlation distance for all points if cloud speed is the same across all locations. In a still further embodiment, a maximum (or minimum) zero correlation distance across the locations can be determined by selecting the point with the slowest (or fastest) cloud speed. Still other ways of obtaining the zero correlation distance are possible, including evaluation of equations that express correlation as a function of distance (and possibly other parameters) by which the equation is set to equal the zero correlation value and solved for distance.

The chosen point is paired with each of the other points that have not already been evaluated and, if applicable, that are located within the zero correlation distance of the chosen point (step 45). In one embodiment, the set of points located within the zero correlation distance can be logically represented as falling within a grid or correlation region centered on the chosen point. The zero correlation distance is first converted (from meters) into degrees and the latitude and longitude coordinates for the chosen point are found. The correlation region is then defined as a rectangular or square region, such that Longitude−Zero Correlation Degrees≤Longitude≤Longitude+Zero Correlation Degrees and Latitude−Zero Correlation Degrees≤Latitude≤Latitude+Zero Correlation Degrees. In a further embodiment, the correlation region is constructed as a circular region centered around the chosen point. This option, however, requires calculating the distance between the chosen point and all other possible points.

Each of the pairings of chosen point-to-a point yet to be evaluated are iteratively processed (step 46) as follows. A correlation coefficient for the point pairing is calculated (step 47). In one embodiment where the variance is calculated as a bounded area variance, the covariance is only calculated (step 49) and added to the variance of the area clearness index (step 50) if the correlation coefficient is greater than the zero correlation value (step 48). In a further embodiment where the variance is calculated as an average point variance, the covariance is simply calculated (step 49) and added to the variance of the area clearness index (step 50). Processing continues with the next point pairing (step 51). Finally, the function 40 is recursively called to evaluate the next point, after which the variance is returned.

Figure 9:
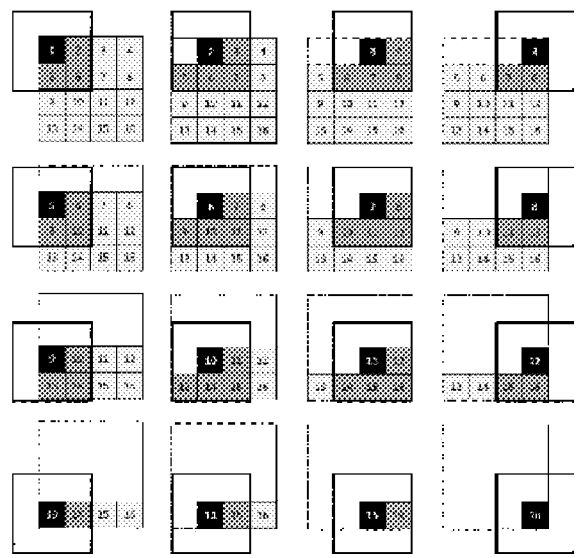
FIG. 9 is a block diagram showing, by way of example, 16 evenly-spaced points within a three-by-three correlation region for evaluation by the function of FIG. 7.

The variance heuristic determination can be illustrated through two examples. FIGS. 8 and 9 are block diagrams respectively showing, by way of example, nine evenly-spaced points within a four-by-four correlation region and 16 evenly-spaced points within a three-by-three correlation region for evaluation by the function of FIG. 7. Referring first to FIG. 8, suppose that there are nine photovoltaic system locations, which are evenly spaced in a square three-by-three region. Evaluation proceeds row-wise, left-to-right, top-to-bottom, from the upper left-hand corner, and the chosen location is labeled with an identification number. Within each evaluative step, the black square with white lettering represents the chosen point and the heavy black border represents the corresponding correlation region. The dark gray squares are the locations for which correlation is non-zero and the light gray squares are the locations for which correlation is zero. The number of correlation coefficients to be calculated equals the sum of the number of dark gray boxes, with 20 correlation correlations calculated here. Note that while this example presents the results in a particular order, the approach does not require the locations to be considered in any particular order. Referring next to FIG. 9, suppose that there are now 16 photovoltaic system locations, which are evenly spaced in the four-by-four region. As before, evaluation proceeds row-wise, left-to-right, top-to-bottom, from the upper left-hand corner, and the chosen location is labeled with an identification number. However, in this example, there are 42 correlation coefficient calculations.

The number of point pairing combinations to be calculated for different numbers of points and sizes of correlation regions can be determined as a function of the number of locations and the correlation region size. Due to edge effects, however, determination can be complicated and a simpler approach is to simply determine an upper bound on the number of correlations to be calculated. Assuming equal spacing, the upper bound C can be determined as:

$$C = \frac{N * (\text{Correlation Region} - 1)}{2} \qquad (36)$$

where N is the number of points within the bounded area and Correlation Region is the number of equal-sized divisions of the bounded area.

Figure 10:
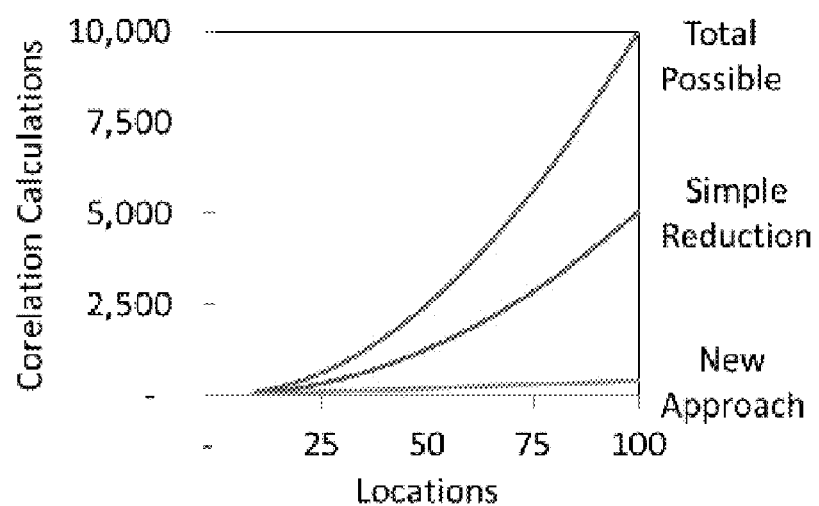
FIG. 10 is a graph depicting, by way of example, the number of calculations required when determining variance using three different approaches.

The upper bound can be used to illustrate the reduction of the problem space from exponential to linear. FIG. 10 is a graph depicting, by way of example, the number of calculations required when determining variance using three different approaches. The x-axis represents the number of photovoltaic plant locations (points) within the bounded region. The y-axis represents the upper bound on the number of correlation calculations required, as determined using Equation (35). Assume, for instance, that a correlation region includes nine divisions and that the number of possible points ranges up to 100. The total possible correlations required using correlation coefficient matrix computations without simplification is as high as 10,000 computations, whilst the total possible correlations required using the simplification afforded by standard deviations and Pearson's correlation coefficient, per Equation (35), is as high as 5,000 computations. By comparison, the heuristical of determining the variance of change in fleet power as a function of decreasing distance approach requires a maximum of 400 correlations calculations, which represents a drastic reduction in computational burden without cognizable loss of accuracy in variance.

Time Lag Correlation Coefficient

The next step is to adjust the photovoltaic fleet power statistics from the input time interval to the desired output time interval. For example, the time series data may have been collected and stored every 60 seconds. The user of the results, however, may want to have photovoltaic fleet power statistics at a 10-second rate. This adjustment is made using the time lag correlation coefficient.

The time lag correlation coefficient reflects the relationship between fleet power and that same fleet power starting one time interval ($\Delta t$) later. Specifically, the time lag correlation coefficient is defined as follows:

$$\rho^{P,P^{\Delta t}} = \frac{\text{COV}[P, P^{\Delta t}]}{\sqrt{\sigma_P^2 \sigma_{P^{\Delta t}}^2}} \qquad (37)$$

The assumption that the mean clearness index change equals zero implies that $\sigma_{P^{\Delta t}}^2 = \sigma_P^2$ Given a non-zero variance of power, this assumption can also be used to show that $$\frac{\text{COV}[P, P^{\Delta t}]}{\sigma_P^2} = 1 - \frac{\sigma_{\Delta P}^2}{2\sigma_P^2}.$$

Therefore:

$$\rho^{P,P^{\Delta t}} = 1 - \frac{\sigma_{\Delta P}^2}{2\sigma_P^2} \quad (38)$$

This relationship illustrates how the time lag correlation coefficient for the time interval associated with the data collection rate is completely defined in terms of fleet power statistics already calculated. A more detailed derivation is described infra.

Equation (38) can be stated completely in terms of the photovoltaic fleet configuration and the fleet region clearness index statistics by substituting Equations (29) and (30). Specifically, the time lag correlation coefficient can be stated entirely in terms of photovoltaic fleet configuration, the variance of the clearness index, and the variance of the change in the clearness index associated with the time increment of the input data.

$$\rho^{P,P^{\Delta t}} = 1 - \frac{P^{\Delta Kt} \sigma_{\Delta Kt}^2}{2 P^{Kt} \sigma_{Kt}^2} \quad (39)$$

Generate High-Speed Time Series Photovoltaic Fleet Power

The final step is to generate high-speed time series photovoltaic fleet power data based on irradiance statistics, photovoltaic fleet configuration, and the time lag correlation coefficient. This step is to construct time series photovoltaic fleet production from statistical measures over the desired time period, for instance, at half-hour output intervals.

A joint probability distribution function is required for this step. The bivariate probability density function of two unit normal random variables (X and Y) with a correlation coefficient of $\rho$ equals:

$$f(x, y) = \frac{1}{2\pi\sqrt{1-\rho^2}} \exp\left[-\frac{(x^2 + y^2 - 2\rho xy)}{2(1-\rho^2)}\right] \quad (40)$$

The single variable probability density function for a unit normal random variable X alone is $$(x) = \frac{1}{\sqrt{2\pi}} \exp\left(-\frac{x^2}{2}\right).$$

In addition, a conditional distribution for y can be calculated based on a known x by dividing the bivariate probability density function by the single variable probability density, that is, $$f(y|x) = \frac{f(x, y)}{f(x)}.$$

Making the appropriate substitutions, the result is that the conditional distribution of y based on a known x equals:

$$f(y|x) = \frac{1}{\sqrt{2\pi}\sqrt{1-\rho^2}} \exp\left[-\frac{(y-\rho x)^2}{2(1-\rho^2)}\right] \quad (41)$$

Define a random variable $$Z = \frac{Y - \rho x}{\sqrt{1-\rho^2}}$$

and substitute into Equation (41). The result is that the conditional probability of z given a known x equals:

$$f(z|x) = \frac{1}{\sqrt{2\pi}} \exp\left(-\frac{z^2}{2}\right) \quad (42)$$

The cumulative distribution function for Z can be denoted by $\Phi(z^*)$, where $z^*$ represents a specific value for z. The result equals a probability (p) that ranges between 0 (when $z^* = -\infty$) and 1 (when $z^* = \infty$). The function represents the cumulative probability that any value of z is less than $z^*$, as determined by a computer program or value lookup.

$$p = \Phi(z^*) = \frac{1}{\sqrt{2\pi}} \int_{-\infty}^{z^*} \exp\left(-\frac{z^2}{2}\right) dz \quad (43)$$

Rather than selecting $z^*$, however, a probability p falling between 0 and 1 can be selected and the corresponding $z^*$ that results in this probability found, which can be accomplished by taking the inverse of the cumulative distribution function.

$$\Phi^{-1}(p) = z^* \quad (44)$$

Substituting back for z as defined above results in:

$$\Phi^{-1}(p) = \frac{y - \rho x}{\sqrt{1-\rho^2}} \quad (45)$$

Now, let the random variables equal $$X = \frac{P - \mu_P}{\sigma_P} \text{ and } Y = \frac{P^{\Delta t} - \mu_{P^{\Delta t}}}{\sigma_{P^{\Delta t}}},$$

with the correlation coefficient being the time lag correlation coefficient between P and $P^{\Delta t}$, that is, let $\rho = \rho^{P,P^{\Delta t}}$. When $\Delta t$ is small, then the mean and standard deviations for $P^{\Delta t}$ are approximately equal to the mean and standard deviation for P. Thus, Y can be restated as $$Y \approx \frac{P^{\Delta t} - \mu_P}{\sigma_P}.$$

Add a time subscript to all of the relevant data to represent a specific point in time and substitute x, y, and ρ into Equation (45).

$$\Phi^{-1}(p) = \frac{\left(\frac{P_t^{\Delta t} - \mu_P}{\sigma_P}\right) - \rho^{P,P^{\Delta t}}\left(\frac{P_t - \mu_P}{\sigma_P}\right)}{\sqrt{1 - \rho^{P,P^{\Delta t}2}}} \quad (46)$$

The random variable $P^{\Delta t}$, however, is simply the random variable P shifted in time by a time interval of $\Delta t$. As a result, at any given time t, $P^{\Delta t}_t = P_{t+\Delta t}$. Make this substitution into Equation (46) and solve in terms of $P_{t+\Delta t}$.

$$P_{t+\Delta t} = \rho^{P,P^{\Delta t}} P_t + (1 - \rho^{P,P^{\Delta t}})\mu_P + \sqrt{\sigma_P^2(1 - \rho^{P,P^{\Delta t}2})}\, \Phi^{-1}(p) \quad (47)$$

At any given time, photovoltaic fleet power equals photovoltaic fleet power under clear sky conditions times the average regional clearness index, that is, $P_t = P_t^{Clear} Kt_t$. In addition, over a short time period, $\mu_P \approx P_t^{Clear} \mu_{\overline{Kt}}$ and $\sigma_P^2 \approx (P_t^{Clear})^2\, P^{Kt} \sigma_{\overline{Kt}}^2$. Substitute these three relationships into Equation (47) and factor out photovoltaic fleet power under clear sky conditions ($P_t^{Clear}$) as common to all three terms.

$$P_{t+\Delta t} = \quad (48)$$
$$P_t^{Clear}\left[\rho^{P,P^{\Delta t}} Kt_t + (1 - \rho^{P,P^{\Delta t}})\mu_{\overline{Kt}} + \sqrt{P^{Kt}\sigma_{\overline{Kt}}^2 (1 - \rho^{P,P^{\Delta t}2})}\, \Phi^{-1}(p_t)\right]$$

Equation (48) provides an iterative method to generate high-speed time series photovoltaic production data for a fleet of photovoltaic systems. At each time step (t+Δt), the power delivered by the fleet of photovoltaic systems ($P_{t+\Delta t}$) is calculated using input values from time step t. Thus, a time series of power outputs can be created. The inputs include:

$P_t^{Clear}$—photovoltaic fleet power during clear sky conditions calculated using a photovoltaic simulation program and clear sky irradiance.

$Kt_t$—average regional clearness index inferred based on $P_t$ calculated in time step t, that is, $Kt_t = P_t/P_t^{Clear}$.

$\mu_{\overline{Kt}}$—mean clearness index calculated using time series irradiance data and Equation (1).

$\sigma_{\overline{Kt}}^2$—variance of the clearness index calculated using time series irradiance data and Equation (10).

$\rho^{P,P^{\Delta t}}$—fleet configuration as reflected in the time lag correlation coefficient calculated using Equation (38). In turn, Equation (38), relies upon correlation coefficients from Equations (28) and (31). A method to obtain these correlation coefficients by empirical means is described in commonly-assigned U.S. Patent application, entitled "Computer-Implemented System and Method for Determining Point-To-Point Correlation Of Sky Clearness for Photovoltaic Power Generation Fleet Output Estimation," Ser. No. 13/190,435, filed Jul. 25, 2011, pending, and U.S. Patent application, entitled "Computer-Implemented System and Method for Efficiently Performing Area-To-Point Conversion of Satellite Imagery for Photovoltaic Power Generation Fleet Output Estimation," Ser. No. 13/190,449, filed Jul. 25, 2011, pending, the disclosure of which is incorporated by reference.

$P^{Kt}$—fleet configuration as reflected in the clearness index correlation coefficient matrix calculated using Equation (28) where, again, the correlation coefficients may be obtained using the empirical results as further described infra.

$\Phi^{-1}(p_t)$—the inverse cumulative normal distribution function based on a random variable between 0 and 1.

Generate High-Speed Time Series Photovoltaic Fleet Energy

The accuracy of photovoltaic simulation modeling is predicated upon the selection of a type of solar resource data appropriate to the form of simulation desired. Photovoltaic power simulation requires irradiance data. Solar irradiance is instantaneous and should be associated with a single observation time. The simulation should therefore return a power measure for the same single observation time, thereby avoiding any confusion that the simulation results represent power, which, like irradiance, is also an instantaneous measure.

On the other hand, photovoltaic energy simulation requires normalized irradiation data. Normalized irradiation is an interval measure bounded by either start and end times or by a single observation time with a time interval convention. The simulation should therefore return a power measure for the start and end time-bounded interval, or a single observation time with a description of the time convention. Alternatively, photovoltaic energy can be indirectly simulated by first performing photovoltaic power simulations using irradiance data and converting the photovoltaic power simulation results into photovoltaic energy simulation results.

Irradiance Versus Normalized Irradiation

An accurate simulation requires consistency between both the solar resource data and the photovoltaic simulation code. Simulating photovoltaic production is typically divided into two parts, solar irradiance data acquisition and production simulation. Photovoltaic production, whether for power or energy, is usually simulated using two separate services, one service that provides the irradiance data and another service that performs the simulation.

Solar irradiance data can be obtained from ground-based measurements, satellite imagery, and numerical weather prediction models. Reliable solar irradiance data, as well as simulation tools, are also available from third party sources, such as the SolarAnywhere data grid web interface, which, by default, reports irradiance data for a desired location using a single observation time, and the SolarAnywhere photovoltaic system modeling service, available in the SolarAnywhere Toolkit, that uses hourly resource data and user-defined physical system attributes to simulate configuration-specific photovoltaic system output. SolarAnywhere is available online (http://www.SolarAnywhere.com) through Web-based services operated by Clean Power Research, L.L.C., Napa, Calif. Other sources of the solar irradiance data are possible, including numeric weather prediction models.

By default, the SolarAnywhere service implicitly assumes that irradiance data is being requested and translates satellite images to irradiance to represent instantaneous weather conditions at a specific point in time. FIG. 11 is a screen shot showing, by way of example, a user interface 60 of SolarAnywhere. To obtain irradiance data, the user must select a location 61, date range 62, time resolution 63, and output format 64. The SolarAnywhere service allows users to retrieve the irradiance data formatted as either centered on satellite measurement time or standard top of hour, end of period integration.

Figure 12A:
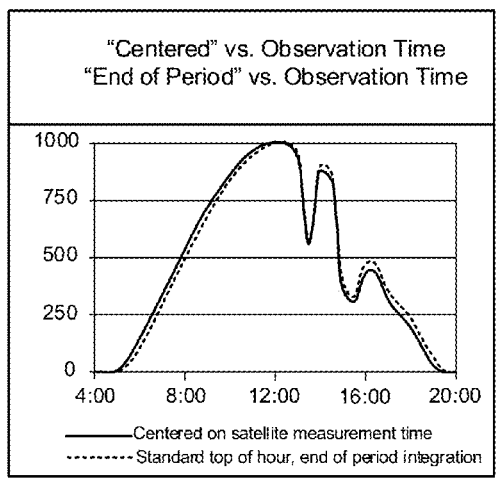
FIGS. 12A-12B are graphs showing, by way of example, a sample day of solar irradiance plotted respectively based on the centered on satellite measurement time and standard top of hour, end of period integration formats.
Figure 12B:
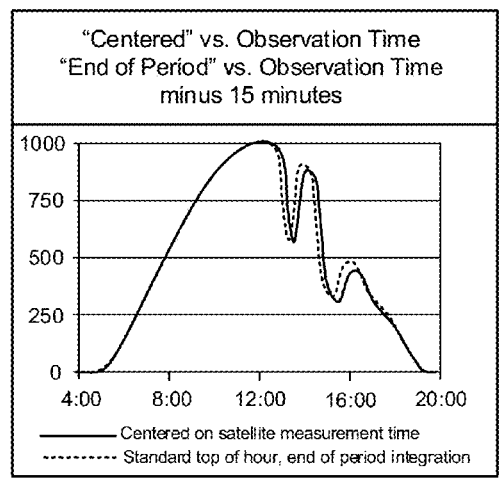

Despite their names, these formats do not provide forms of normalized irradiation data. Out of naiveté, a user could incorrectly believe that irradiance data is equivalent to normalized irradiation data, then use the irradiance data to simulate photovoltaic energy production, rather than photovoltaic power production. The centered on satellite measurement time format returns irradiance data that should be used for power calculations. The standard top of hour, end of period integration format provides neither irradiance nor irradiation data; the SolarAnywhere service calculates the clearness index, shifts the clearness index by some number of minutes while holding the clearness index constant, and then multiplies the shifted clearness index by clear sky irradiance. FIGS. 12A-12B are graphs showing, by way of example, a sample day of solar irradiance plotted respectively based on the centered on satellite measurement time and standard top of hour, end of period integration formats. In both graphs, the x-axes represent time of day and the y-axes represent GHI, as data returned by the SolarAnywhere service, Enhanced Resolution, for Jun. 1, 2013 for Napa, Calif. Referring first to FIG. 12A, the solid line corresponds to the satellite time stamp using the centered on satellite measurement time format and the dashed line corresponds to the standard top of hour, end of period integration format. Referring next to FIG. 12B, the solid line corresponds to the satellite time stamp using the centered on satellite measurement time format and the dashed line corresponds to the standard top of hour, end of period integration format, minus half of a specified time interval of 15 minutes to adjust for the time shift. FIGS. 12A-12B help to illustrate that the fundamental satellite image pattern cannot be replicated simply by adjusting the time stamps, once time shifting occurred, that is, the dashed lines cannot be lined up with the solid lines, no matter how much the time axes are shifted. On the one hand, clear sky conditions do not match if both output formats are plotted against observation time. On the other hand, clear sky conditions match, yet cloudy conditions are shifted if the centered on satellite measurement time format is plotted against observation time, while the standard top of hour, end of period integration format is plotted against the center of the observation time.

Sources of Normalized Irradiation

Normalized irradiation is not always available, such as in photovoltaic plant installations where only point measurements of irradiance are sporadically collected or even entirely absent. Residential photovoltaic systems that contribute to a power grid, yet which are geographically removed from the grid's central operations, for instance, may lack solar irradiance measurement instrumentation. Notwithstanding, normalized irradiation is necessary for accurate photovoltaic energy simulation. Normalized irradiation can be estimated over a set time period through several methodologies, including assuming that normalized irradiation simply equals irradiance, directly estimating normalized irradiation, applying linear interpolation to irradiance, applying linear interpolation to clearness index values, and empirically deriving irradiance weights, as further described infra. Still other methodologies of estimating normalized irradiation are possible.

Figure 13A:
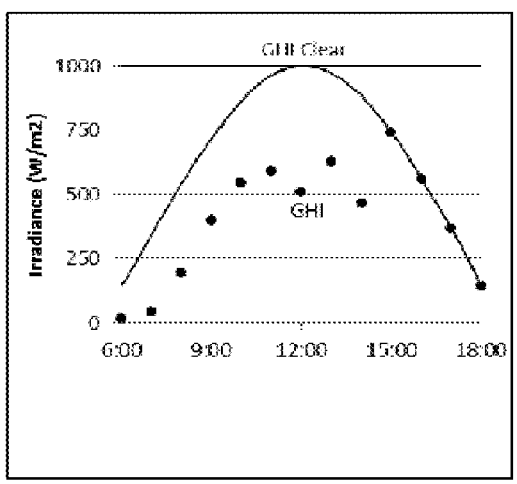
FIGS. 13A-13B are graphs respectively showing, by way of example, a sample day of irradiance and clearness indexes.
Figure 13B:
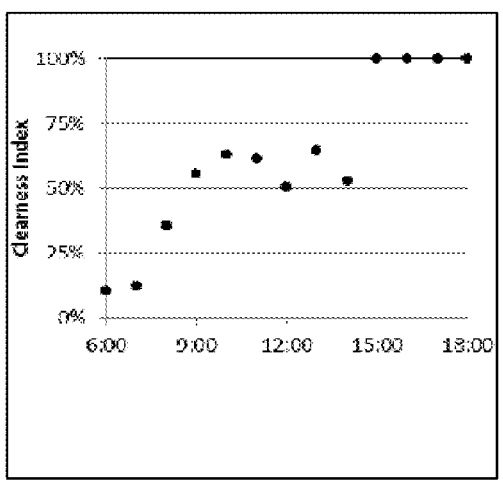
Figure 14A:
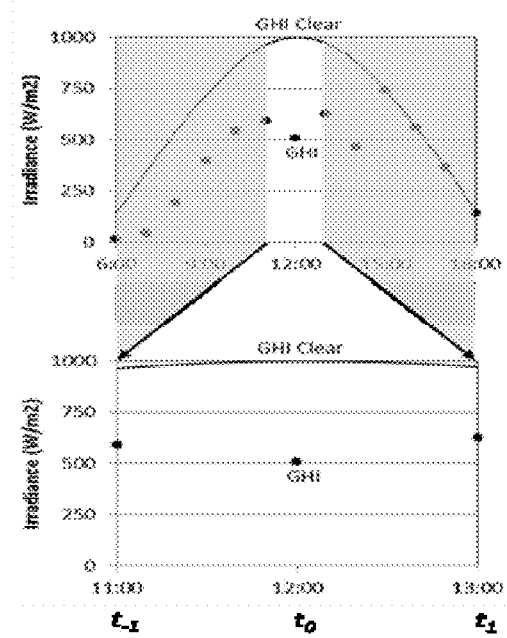
FIGS. 14A-14B are graphs respectively showing, by way of example, two-hour periods of the irradiance and clearness indexes of the sample day of FIGS. 12A-12B.
Figure 14B:
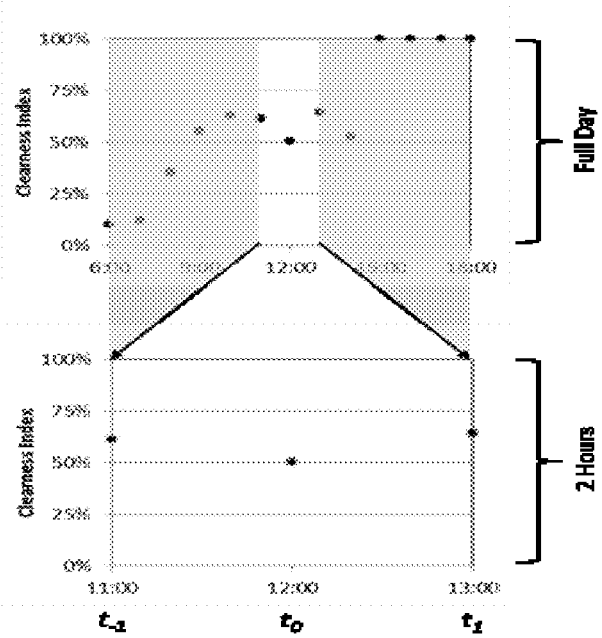

By way of overview, the foregoing methodologies can be illustrated using a sample day. FIGS. 13A-13B are graphs respectively showing, by way of example, a sample day of irradiance and clearness indexes. In both graphs, the x-axes represent time of day and the y-axes respectively represent irradiance and clearness index. Referring first to FIG. 13A, clear sky irradiance $I_t^{ClearSky}$ over a sixteen-hour period, from 4:00 am to 8:00 pm, is plotted as a continuous line and the GHI is plotted as discrete dots. Clear sky irradiance $I_t^{ClearSky}$ is a value calculated for any value of time t and can therefore be represented as a continuous value, whereas GHI is represented as discrete points because those values are observed at specific points in time, such as on an hourly basis. Clear sky irradiance $I_t^{ClearSky}$ can either be measured directly or can be calculated as the product of a clearness index Kt* and clear sky irradiance $I_t^{ClearSky}$. Referring next to FIG. 13B, the clearness indexes Kt* are plotted as discrete dots over the same sixteen-hour period. Like GHI, the clearness indexes Kt* are represented as discrete points corresponding to observations recorded at specific points in time. FIGS. 14A-14B are graphs respectively showing, by way of example, two-hour periods of the irradiance and clearness indexes of the sample day of FIGS. 13A-13B. In both graphs, the x-axes represent time of day and the y-axes respectively represent irradiance and clearness index. FIGS. 14A-14B isolate the time period from 11:00 am to 13:00 pm and will be used as a set time period to illustrate the various methodologies for estimating normalized irradiation. In the discussion that immediately follows, the observations in FIGS. 14A-14B at 11:00 am, 12:00 pm, and 1:00 pm correspond to times $t_{-1}$, $t_0$, and $t_1$, except as indicated to the contrary.

The five methodologies for estimating normalized irradiation will now be described in detail. In addition, the user interface 60, discussed supra with reference to FIG. 11, could be extended to allow users to retrieve the irradiance data in formats that include the foregoing forms of normalized irradiation data based on a requested or set time period, as well as other forms of irradiance and normalized irradiation data.

Equate Irradiance to Normalized Irradiation

Figure 15:
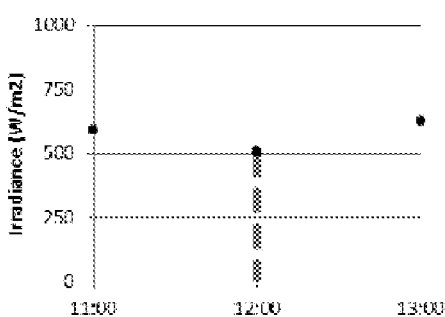
FIG. 15 is a graph showing, by way of example, normalized irradiation equated to irradiance based on the irradiance plotted in FIG. 14A.

Conventional solar resource databases generally provide a single solar resource value for a specific observation time and lack support for the selection of either irradiance or normalized irradiation data. FIG. 15 is a graph showing, by way of example, normalized irradiation equated to irradiance based on the irradiance plotted in FIG. 14A. The x-axis represents time of day and the y-axis represents irradiance. Normalized irradiation is set to equal the value of the irradiance observation at 12:00 pm, as indicated by the vertical dashed line. FIG. 14A helps illustrate the widely-implemented assumption in solar resource databases that normalized irradiation, that is, average irradiance, and irradiance can be treated as equivalent measures. However, this assumption produces inferior results because irradiance is a point measure that fails to reflect the passage of time.

Directly Calculate Normalized Irradiation

Normalized irradiation is analogous to the average of a set of irradiance values consecutively measured over a set time interval and can therefore be directly calculated. Non-normalized irradiation is to irradiance what energy is to power and can be calculated by summing the area under the irradiance curve. Let $I_t$ represent irradiance at time t, $t_0$ the start time, and $\Delta t$ be the time interval of interest. The irradiation between $t_0$ and $t_0+\Delta t$ equals:

$$\text{Irradiation}_{t_0 \text{ to } t_0+\Delta t} = \int_{t_0}^{t_0+\Delta t} I_t dt \qquad (49)$$

Suppose, for example, that irradiance was constant at 1,000 W/m² from 12:00 pm to 12:30 pm. The corresponding irradiation would be 500 Wh/m².

Simulation models, however, typically require normalized irradiation, rather than irradiation, that is, Wh/m² per hour simplified as W/m². Normalized irradiation can also be referred to as average irradiance over some time interval. Irradiation is normalized by dividing irradiation by the time interval, that is, divide Equation (49) by $\Delta t$, which is equivalent to taking the expected value of the irradiance, such that:

$$\overline{\text{Irradiation}_{t_0 \text{ to } t_0+\Delta t}} = E\left[\int_{t_0}^{t_0+\Delta t} I_t dt\right] \qquad (50)$$

where E[ ] is the expectation.

Equation (50) can be estimated directly by discretizing the equation, which converts the integral into a summation and uses a discrete set of irradiance observations to solve the equation:

$$\overline{\text{Irradiation}_{t_0 \text{ to } t_0+\Delta t}} \approx \left(\frac{1}{N}\right)\sum_{i=0}^{N-1} I_{t_0+i*\frac{\Delta t}{N}} \qquad (51)$$

For example, some locations collect one-minute irradiance data using ground-based irradiance sensors. Other locations may use satellite imagery to produce irradiance estimates every half-hour and apply a cloud motion vector approach to generate one-minute irradiance data. For both locations, irradiation normalized over a half-hour time interval can be produced by letting $\Delta t$ equal 30 minutes and N equal 30 (there are 30 one-minute observations in a 30-minute time interval). Thus, Equation (51) simplifies to:

$$\overline{\text{Irradiation}_{t_0 \text{ to } t_0+30 \text{ min.}}} \approx \left(\frac{1}{30}\right)\sum_{i=0}^{29} I_{t_0+i} \qquad (52)$$

Suppose, for example, that irradiance was constant at 1,000 W/m² from 12:00 pm to 12:30 pm. The corresponding normalized irradiation would be 500 Wh/m² divided by 0.5 hours, or 1,000 W/m². In this case, irradiance and normalized irradiance are equal because irradiance was constant over the time interval over which the irradiation was normalized.

Apply Linear Interpolation to Irradiance

Figure 16:
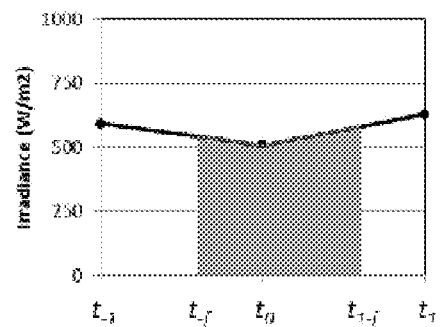
FIG. 16 is a graph showing, by way of example, normalized irradiation determined through linear interpolation of the irradiance plotted in FIG. 14A.

The direct approach to calculating normalized irradiation works better when a sufficient number of irradiance observations exist to estimate normalized irradiation with an acceptable level of accuracy. However, alternative approaches to estimating normalized irradiation must be used when insufficient irradiance data is available. For instance, normalized irradiation may be estimated by linearly interpolating between at least three consecutive irradiance observations and taking the sum of the area under the irradiance curve for a time interval within the irradiance observations. FIG. 16 is a graph showing, by way of example, normalized irradiation determined through linear interpolation of the irradiance plotted in FIG. 14A. The x-axis represents time of day and the y-axis represents irradiance. Clear sky irradiance and the clearness indexes are excluded from FIG. 16 and only irradiance observations are shown.

Normalized irradiation can be estimated using a fractional offset f biased toward an earlier (or later) time $t_{-1}$ (or $t_{+1}$) relative to the center time $t_0$, where the fractional offset f is between 0 and 1. Linearly interpolated irradiance is plotted as a pair of solid lines that form an irradiance curve. The area of the irradiance curve under the fractional offset f represents the irradiation over the time interval starting at $t_{-f}$ and ending at $t_{1-f}$. The fractional offset f could also be set to the length of each regular interval of time occurring between each irradiance observation or other length of time less than or equal to a regular time interval.

First, a slope is linearly interpolated between two consecutive irradiance observations. A linear interpolation of $I_{t_a}$ between $I_{t_i}$ and $I_{t_j}$, where a is the fractional distance away from $t_j$, equals:

$$I_{t_a} = aI_{t_j} + (1-a)I_{t_i} \qquad (53)$$

When i equals $-1$, j equals 0, and a equals f, then:

$$I_{t_f} = fI_{t_{-1}} + (1-f)I_{t_0} \qquad (54)$$

When i equals 1, j equals 0, and a equals $1-f$, then:

$$I_{t_{1-f}} = (1-f)I_{t_1} + fI_{t_0} \qquad (55)$$

Next, the area under the irradiance curve for one time interval is calculated. The area is calculated in two parts. First, the average of the irradiance at time $-f$ and the irradiance at the current time are determined. Second, the average of the irradiance at the current time and the irradiance at time $1-f$ are determined. Each part of the solution is weighted according to the fractional part represented:

$$\overline{I_{t_{-f} \text{ to } t_{1-f}}} = f\left[\frac{I_{t_f} + I_{t_0}}{2}\right] + (1-f)\left[\frac{I_{t_0} + I_{t_{1-f}}}{2}\right] \qquad (56)$$

Substitute Equations (54) and (55) into Equation (56):

$$\overline{I_{t_{-f} \text{ to } t_{1-f}}} = \qquad (57)$$
$$\frac{1}{2}\{f[fI_{t_{-1}} + (1-f)I_{t_0} + I_{t_0}] + (1-f)[I_{t_0} + (1-f)I_{t_1} + fI_{t_0}]\}$$

Combine like terms and simplify. The result equals the product of the weighting factor array and the observed irradiance array:

$$\overline{I_{t_{-f} \text{ to } t_{1-f}}} = [\omega_{t_{-1}} \quad \omega_{t_0} \quad \omega_{t_1}]\begin{bmatrix} I_{t_{-1}} \\ I_{t_0} \\ I_{t_1} \end{bmatrix} \qquad (58)$$

where the weighting factors $$[\omega_{t_{-1}} \quad \omega_{t_0} \quad \omega_{t_1}] = \left[\frac{f^2}{2} \quad \frac{1}{2} + f - f^2 \quad \frac{(1-f)^2}{2}\right] \text{ for } 0 \leq f \leq 1.$$

The sum of the weighting factors equals 1.

Consider three cases of estimating normalized irradiation using Equation (58). FIG. 17 is a graph showing, by way of example, three cases of determining normalized irradiation through linear interpolation of the irradiance plotted in FIG. 14A. The x-axis represents time of day and the y-axis represents irradiance. In Case 1 (leftmost), normalized irradiation starts and ends on irradiance observations $t_{-1}$ and $t_0$. In Case 2 (center), normalized irradiation is centered on an irradiance observation $t_0$ with the start time $t_{1/2}$ corresponding to the midpoint between two observations $t_{-1}$ and $t_0$, and the end time $t_{1/2}$ corresponding to the midpoint between two observations $t_0$ and $t_1$. In Case 3, normalized irradiation starts and ends one-quarter of a time interval $t_{-1/4}$ and $t_{3/4}$ before an irradiance observation $t_0$.

For each of the three cases, normalized irradiation is calculated by setting the fraction (f) equal to 1, ½, and ¼, and calculating the weighting factors defined in Equation (58). FIG. 18 is a table presenting, by way of example, the normalized irradiation calculated for the three cases of FIG. 17. For example, the weighting factors presented in the table of FIG. 17 combined with Equation (58) imply that normalized irradiation $\overline{I_{t_{-1} to t_0}}$ for Case 1 equals:

$$\overline{I_{t_{-1} \, to \, t_0}} = \frac{1}{2} I_{t_{-1}} + \frac{1}{2} I_{t_0} \tag{59}$$

Normalized irradiation for Case 2 and Case 3 are similarly calculated.

Apply Linear Interpolation to Clearness Indexes

Clear sky irradiance is not strictly linear. Empirical results presented infra help demonstrate that estimating normalized irradiation through linear interpolation of solar irradiance noticeably reduces estimation error. The estimation error can be further reduced by adjusting the linear interpolation to reflect that clear sky irradiance between any two observations is not strictly linear.

Irradiance can be expressed as the product of the clear sky irradiance $I_t^{ClearSky}$ and the clearness index $Kt_t^*$. Substituting these two expressions into Equation (50) and defining the interval to from $t_{-f}$ to $t_{1-f}$ results in normalized irradiation of:

$$\overline{I_{t_{-f} \, to \, t_{1-f}}} = E\left[\int_{t_{-f}}^{t_{1-f}} I_t^{ClearSky} Kt_t^* dt\right] \tag{60}$$

The expectation of the product of two random variables equals the product of the expectation of each random variable separately, plus the covariance between the two random variables. For example, if the random variables are X and Y, then $E[XY]=E[X]E[Y]+COV[X,Y]$. Thus, Equation (60) can be rewritten as:

$$\overline{I_{t_{-f} \, to \, t_{1-f}}} = \tag{61}$$
$$E\left[\int_{t_{-f}}^{t_{1-f}} I_t^{ClearSky} dt\right] E\left[\int_{t_{-f}}^{t_{1-f}} Kt_t^* dt\right] + COV[I_t^{ClearSky}, Kt_t^*]$$

The covariance between the clear sky irradiance $I_t^{ClearSky}$ and the clearness index $Kt_t^*$ is approximately equal to 0, whether the clear sky irradiance changes very slowly relative to the clearness index, that is, under variable weather conditions, or the clearness index does not change, that is, overcast or clear sky conditions. As a calculated value, the clear sky irradiance $I_t^{ClearSky}$ is known precisely for all values of t. Thus, the clear sky irradiance $I_t^{ClearSky}$ can be discretized, such that there are a sufficient number of observations to result in an acceptable level of accuracy:

$$\overline{I_{t_{-f} \, to \, t_{1-f}}} = \left[\left(\frac{1}{N}\right) \sum_{i=0}^{N-1} I_{t_{-f}+i*\frac{\Delta t}{N}}^{ClearSky}\right] E\left[\int_{t_{-f}}^{t_{1-f}} Kt_t^* dt\right] \tag{62}$$

Equation (62), however, still requires that the clearness index $Kt_t^*$ be evaluated. The linear interpolation methodology, as described supra, could be applied only to the clearness index portion of the calculation, rather than by applying linear interpolation to the all of the irradiance. FIGS. 19A-19B are graphs respectively showing, by way of example, determining clearness indexes through linear interpolation of the irradiance plotted of FIGS. 12A-12B. In both graphs, the x-axes represent time of day and the y-axes respectively represent irradiance and clearness index. The clear sky irradiance $I_t^{ClearSky}$ is calculated exactly. The clearness index $Kt_t^*$ is estimated using linear interpolation.

Formally, the same linear interpolation methodology as was applied to solar irradiance per Equation (58), described supra, can be used to calculate the linear interpolation of the average clearness index as a function of the fraction f Substitute the result of the linear interpolation into Equation (62):

$$\overline{I_{t_{-f} \, to \, t_{1-f}}} \approx \left[\left(\frac{1}{N}\right) \sum_{i=0}^{N-1} I_{t_{-f}+i*\frac{\Delta t}{N}}^{ClearSky}\right] \left\{ \begin{bmatrix} \omega_{t_{-1}} & \omega_{t_0} & \omega_{t_1} \end{bmatrix} \begin{bmatrix} Kt_{t_{-1}}^* \\ Kt_{t_0}^* \\ Kt_{t_1}^* \end{bmatrix} \right\} \tag{63}$$

with the weighting factors equaling $$\begin{bmatrix} \omega_{t_{-1}} & \omega_{t_0} & \omega_{t_1} \end{bmatrix} = \begin{bmatrix} \frac{f^2}{2} & \frac{1}{2}+f-f^2 & \frac{(1-f)^2}{2} \end{bmatrix} \text{for } 0 \le f \le 1.$$

Empirically Derive Irradiance Weights

The weighting factor array for the irradiance (or clearness index) could also be empirically derived, that is, the values in $[\omega_{t_{-1}}, \omega_{t_0}, \omega_{t_1}]$ could be determined using an optimization approach. Here, weights are selected to minimize error, which can be accomplished by comparing measured irradiation data, as typically measured using ground-based instrumentation, to solar irradiance data.

High-Speed Time Series Photovoltaic Fleet Energy Estimation

Using normalized irradiation, photovoltaic fleet energy production can be estimated in a manner similar to fleet power production. A time interval is selected that is smaller than the time that has elapsed between consecutive irradiance observations. Normalized irradiation is then estimated using one of the foregoing methodologies at a point relative to the time interval, which could be a fractional offset from an irradiance observation centered within a triplet of irradiance observations. Similar to fleet power production estimation, clearness indexes are evaluated as a ratio of the normalized irradiation and the clear sky irradiance, which provides normalized irradiation statistics for the photovoltaic fleet and energy statistics as a function of the normalized irradiation statistics and an overall photovoltaic fleet power rating.

Discussion

The previous section derived five methodologies for estimating normalized irradiation. This section applies those methods to the SolarAnywhere Standard Resolution and SolarAnywhere Enhanced Resolution databases of the SolarAnywhere service, cited supra. By way of background, the SolarAnywhere service provides an Internet-accessible solar resource database that contains historical irradiance data from 1998 through the present hour; real-time irradiance data; and forecast irradiance data for up to seven days beyond the current hour. The SolarAnywhere Standard Resolution database provides data at a 10-km spatial resolution and one-hour temporal resolution. The SolarAnywhere Enhanced Resolution database provides data at a 1-km spatial resolution and half-hour temporal resolution. Satellite imagery is collected from the GOES West and GOES East satellites. The GOES West satellite collects images on the hour and 30 minutes after the hour. The GOES East satellite collects images at 15 and 45 minutes past the hour.

By default, when a user wants the normalized irradiation centered around a selected observation time, normalized irradiation is determined through linear interpolation of solar irradiance with normalized irradiation centered on an irradiance observation $t_0$ with the start time $t_{-1/2}$ corresponding to the midpoint between two observations $t_{-1}$ and $t_0$, and the end time $t_{1/2}$ corresponding to the midpoint between two observations $t_0$ and $t_1$. The default calculation corresponds to Case 2, as discussed supra with reference to FIG. 17. Normalized irradiation is calculated using either Equation (58) or (63) with f equal to ½.

The weighting factors are different, however, if the normalized irradiation needs to start at the top of the hour (or, for Enhanced Resolution data, at the top of the half-hour) with end of period integration. FIG. 20 is a table presenting, by way of example, the weighting factors for calculating normalized irradiation for start at top of hour (or half-hour for Enhanced Resolution data) with end of period integration for the three cases of FIG. 17.

Figure 22:
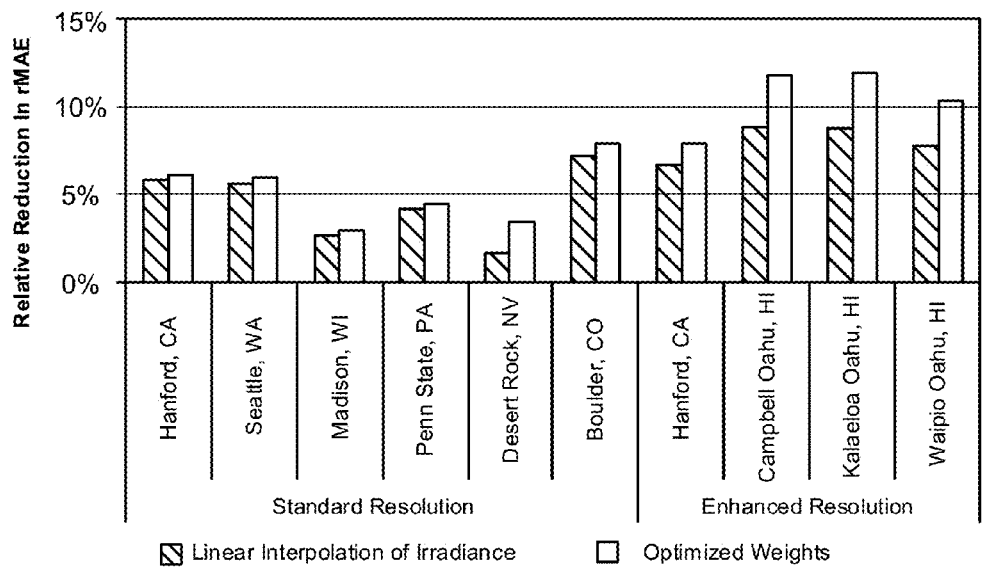
FIG. 22 is a graph showing, by way of example, the relative reduction in relative Mean Absolute Error for the normalized irradiation estimates for the ten locations and resolution scenarios.
Figure 23:
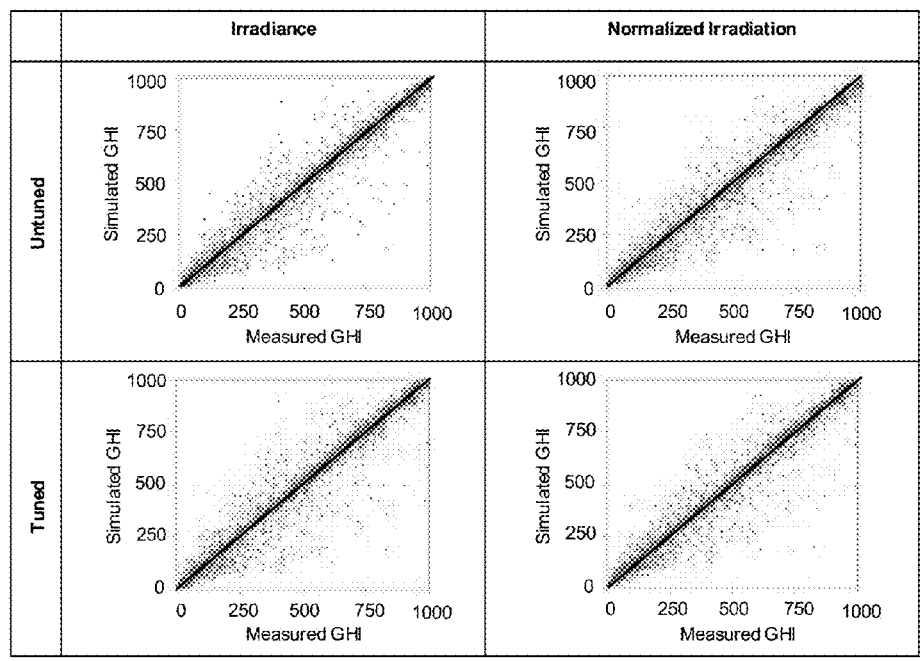
FIG. 23 is a set of graphs showing, by way of example, Standard Resolution data (half-hour, 1-km) in Hanford, Calif., 2012 for the tuned versus un-tuned irradiance and normalized irradiation.
Figure 24:
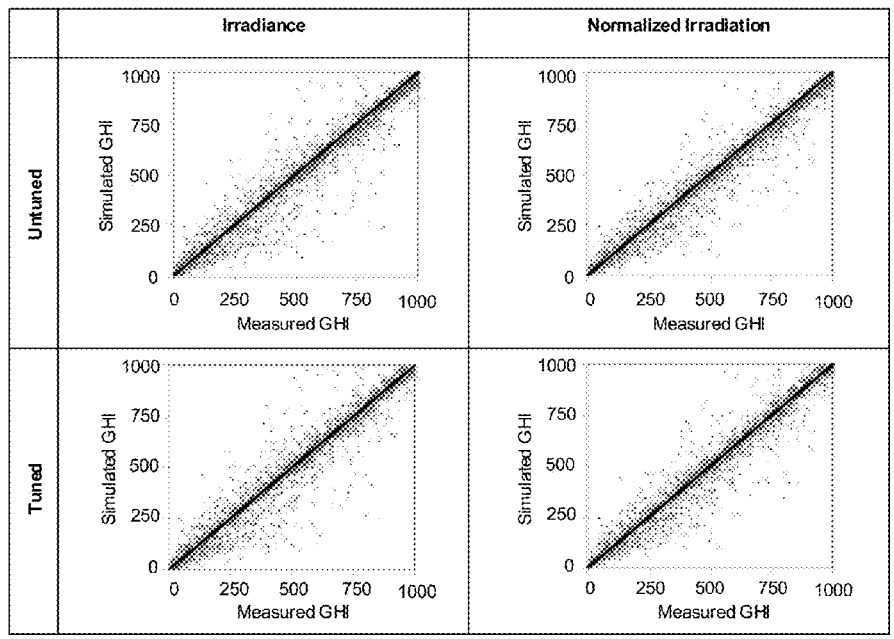
FIG. 24 is a set of graphs showing, by way of example, Enhanced Resolution data (half-hour, 1-km) in Hanford, Calif., 2012 for the tuned versus un-tuned irradiance and normalized irradiation.
Figure 25:
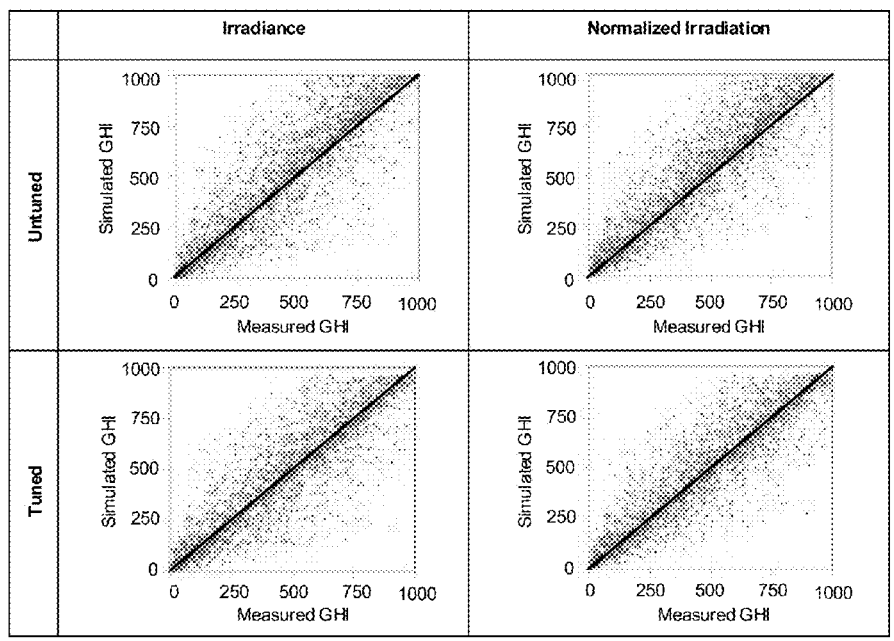
FIG. 25 is a set of graphs showing, by way of example, Enhanced Resolution data (half-hour, 1-km) in Campbell, Hi., first half of 2012 for the tuned versus un-tuned irradiance and normalized irradiation.
Figure 26:
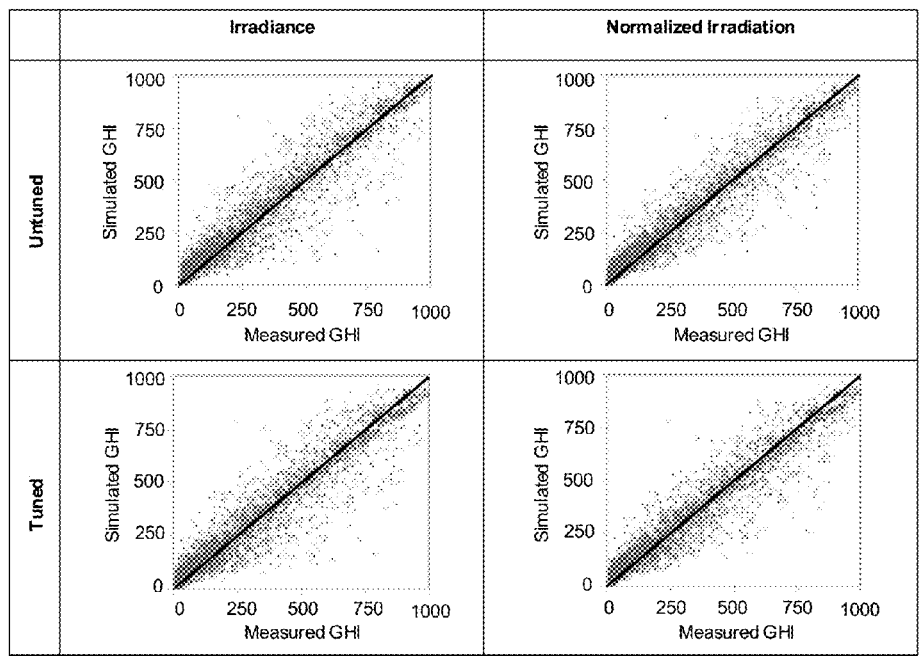
FIG. 26 is a set of graphs showing, by way of example, Standard Resolution data (half-hour, 1-km) in Penn State, PA, 2012 for the tuned versus un-tuned irradiance and normalized irradiation.
Figure 27:
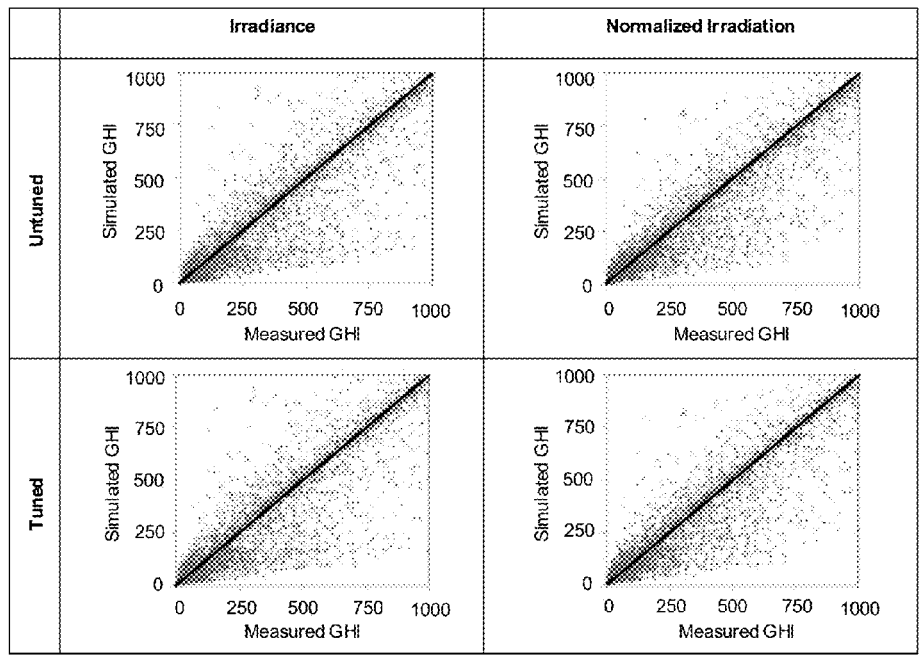
FIG. 27 is a set of graphs showing, by way of example, Standard Resolution data (half-hour, 1-km) in Boulder, Colo., 2012 for the tuned versus un-tuned irradiance and normalized irradiation.

Sample results help illustrate the increase in accuracy in estimating normalized irradiation achieved by respectively applying linear interpolation to solar irradiance and empirically deriving irradiance weights per the third and fifth methodologies, discussed supra. An analysis was performed for ten locations and resolution scenarios to evaluate the improvement in the relative Mean Absolute Error (rMAE) for four scenarios. Each scenario compared SolarAnywhere data to measured hourly data (for SolarAnywhere Standard Resolution) or measured half-hourly data (for SolarAnywhere Enhanced Resolution). A full year of data (2012) was used for all sites, except Hawaii, where a half year of data was used for the first half of 2012. The sample cases included: (1) Un-tuned irradiance; (2) Tuned irradiance; (3) Linear interpolation of irradiance to produce normalized irradiation (third methodology); and (4) Optimized weights (fifth methodology). FIG. 21 is a table presenting, by way of example, the rMAE for irradiance and normalized irradiation for the normalized irradiation estimates for the ten locations and resolution scenarios. FIG. 22 is a graph showing, by way of example, the relative reduction in rMAE for the normalized irradiation estimates for the ten locations and resolution scenarios and compares the linear interpolation that produced normalized irradiation to tuned irradiance, and the optimized weights to tuned irradiance. The graph in FIG. 22 suggests that the application of the foregoing methodologies for estimating normalized irradiation resulted in a 3% to 12% percent reduction in rMAE, a substantial reduction. Last, FIG. 23 is a set of graphs showing, by way of example, Standard Resolution data (half-hour, 1-km) in Hanford, Calif., 2012 for the tuned versus un-tuned irradiance and normalized irradiation. FIG. 24 is a set of graphs showing, by way of example, Enhanced Resolution data (half-hour, 1-km) in Hanford, Calif., 2012 for the tuned versus un-tuned irradiance and normalized irradiation. FIG. 25 is a set of graphs showing, by way of example, Enhanced Resolution data (half-hour, 1-km) in Campbell, Hi., first half of 2012 for the tuned versus un-tuned irradiance and normalized irradiation. FIG. 26 is a set of graphs showing, by way of example, Standard Resolution data (half-hour, 1-km) in Penn State, PA, 2012 for the tuned versus un-tuned irradiance and normalized irradiation. FIG. 27 is a set of graphs showing, by way of example, Standard Resolution data (half-hour, 1-km) in Boulder, Colo., 2012 for the tuned versus un-tuned irradiance and normalized irradiation. A careful examination of the figures illustrates a reduction in the spread of the data for the tuned normalized irradiation.

Derivation of Empirical Models

The previous section developed the mathematical relationships used to calculate irradiance and power statistics for the region associated with a photovoltaic fleet. The relationships between Equations (8), (28), (31), and (38) depend upon the ability to obtain point-to-point correlation coefficients. This section presents empirically-derived models that can be used to determine the value of the coefficients for this purpose.

Figure 28A:
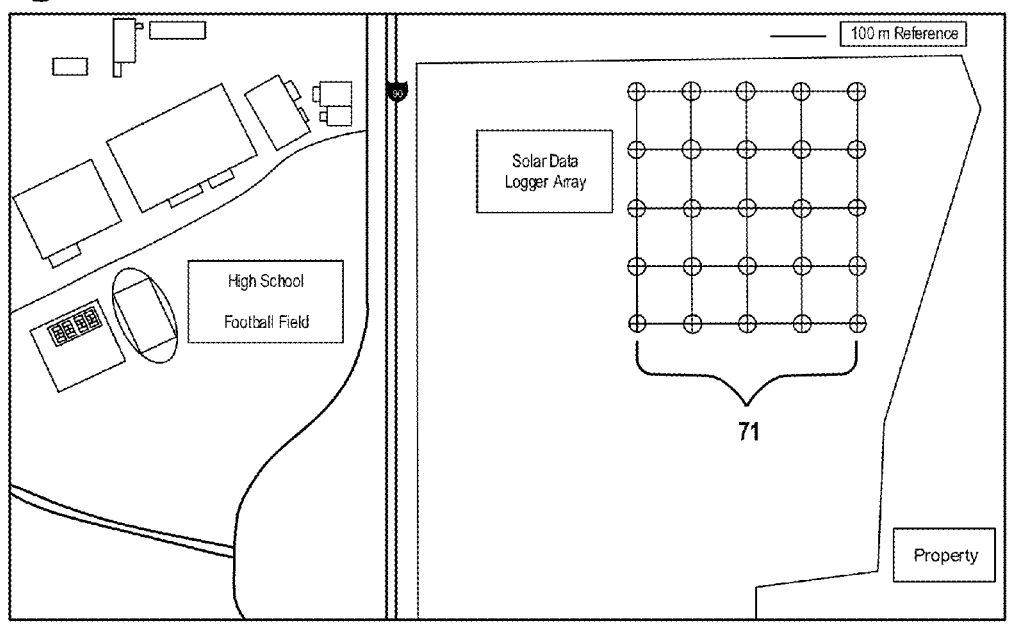
FIGS. 28A-28B are photographs showing, by way of example, the locations of the Cordelia Junction and Napa high density weather monitoring stations.
Figure 28B:
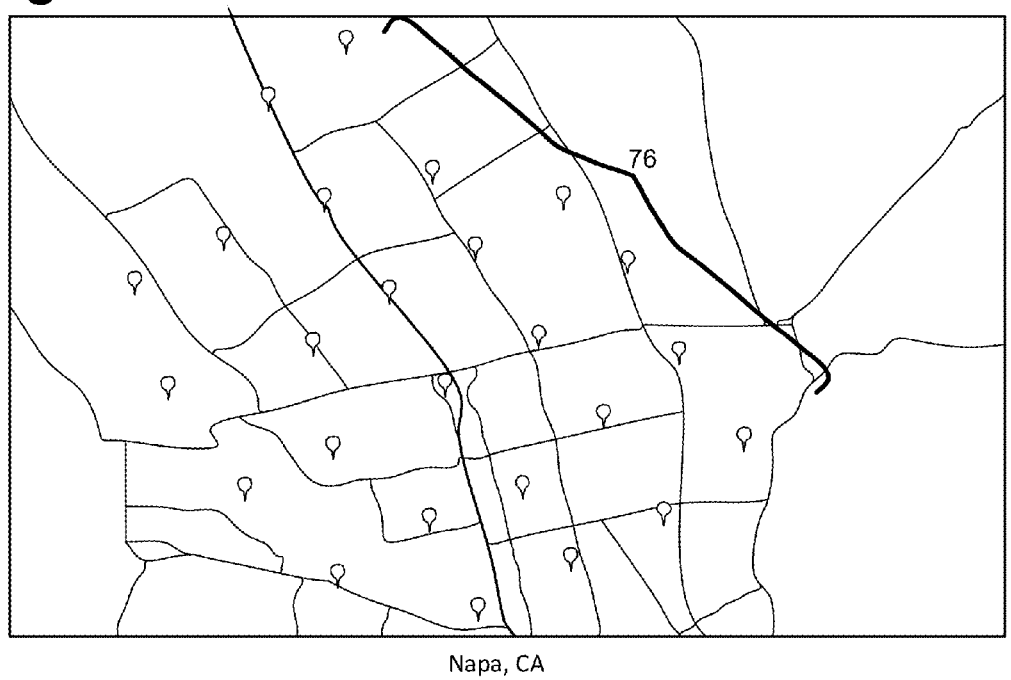

A mobile network of 25 weather monitoring devices was deployed in a 400 meter by 400 meter grid in Cordelia Junction, Calif., between Nov. 6, 2010, and Nov. 15, 2010, and in a 4,000 meter by 4,000 meter grid in Napa, Calif., between Nov. 19, 2010, and Nov. 24, 2010. FIGS. 28A-28B are photographs showing, by way of example, the locations of the Cordelia Junction and Napa high density weather monitoring stations.

An analysis was performed by examining results from Napa and Cordelia Junction using 10, 30, 60, 120 and 180 second time intervals over each half-hour time period in the data set. The variance of the clearness index and the variance of the change in clearness index were calculated for each of the 25 locations for each of the two networks. In addition, the clearness index correlation coefficient and the change in clearness index correlation coefficient for each of the 625 possible pairs, 300 of which are unique, for each of the two locations were calculated.

An empirical model is proposed as part of the methodology described herein to estimate the correlation coefficient of the clearness index and change in clearness index between any two points by using as inputs the following: distance between the two points, cloud speed, and time interval. For the analysis, distances were measured, cloud speed was implied, and a time interval was selected.

The empirical models infra describe correlation coefficients between two points (i and j), making use of "temporal distance," defined as the physical distance (meters) between points i and j, divided by the regional cloud speed (meters per second) and having units of seconds. The temporal distance answers the question, "How much time is needed to span two locations?"

Cloud speed was estimated to be six meters per second. Results indicate that the clearness index correlation coefficient between the two locations closely matches the estimated value as calculated using the following empirical model:

$$\rho^{Kt^i,Kt^j} = \exp(C_1 \times \text{TemporalDistance})^{ClearnessPower} \quad (64)$$

where TemporalDistance=Distance (meters)/CloudSpeed (meters per second), ClearnessPower=$\ln(C_2\Delta t)$−9.3, such that $5 \leq k \leq 15$, where the expected value is k=9.3, $\Delta t$ is the desired output time interval (seconds), $C_1 = 10^{-3}$ seconds$^{-1}$, and $C_2 = 1$ seconds$^{-1}$.

Results also indicate that the correlation coefficient for the change in clearness index between two locations closely matches the values calculated using the following empirical relationship:

$$\rho^{\Delta Kt^i,\Delta Kt^j} = (\rho^{Kt^i,Kt^j})^{\Delta ClearnessPower} \quad (65)$$

where $\rho^{Kt^i,Kt^j}$ is calculated using Equation (64) and $$\Delta ClearnessPower = 1 + \frac{140}{C_2 \Delta t},$$

such that $100 \leq m \leq 200$, where the expected value is m=140.

Empirical results also lead to the following models that may be used to translate the variance of clearness index and the variance of change in clearness index from the measured time interval ($\Delta t$ ref) to the desired output time interval ($\Delta t$).

$$\sigma^2_{Kt_{\Delta t}} = \sigma^2_{Kt_{\Delta t\,ref}} \exp\left[1 - \left(\frac{\Delta t}{\Delta t\,ref}\right)^{C_3}\right] \quad (66)$$

$$\sigma^2_{\Delta Kt_{\Delta t}} = \sigma^2_{\Delta Kt_{\Delta t\,ref}} \left\{1 - 2\left[1 - \left(\frac{\Delta t}{\Delta t\,ref}\right)^{C_3}\right]\right\} \quad (67)$$

where $C_3 = 0.1 \leq C_3 \leq 0.2$, where the expected value is $C_3 = 0.15$.

Figure 29A:
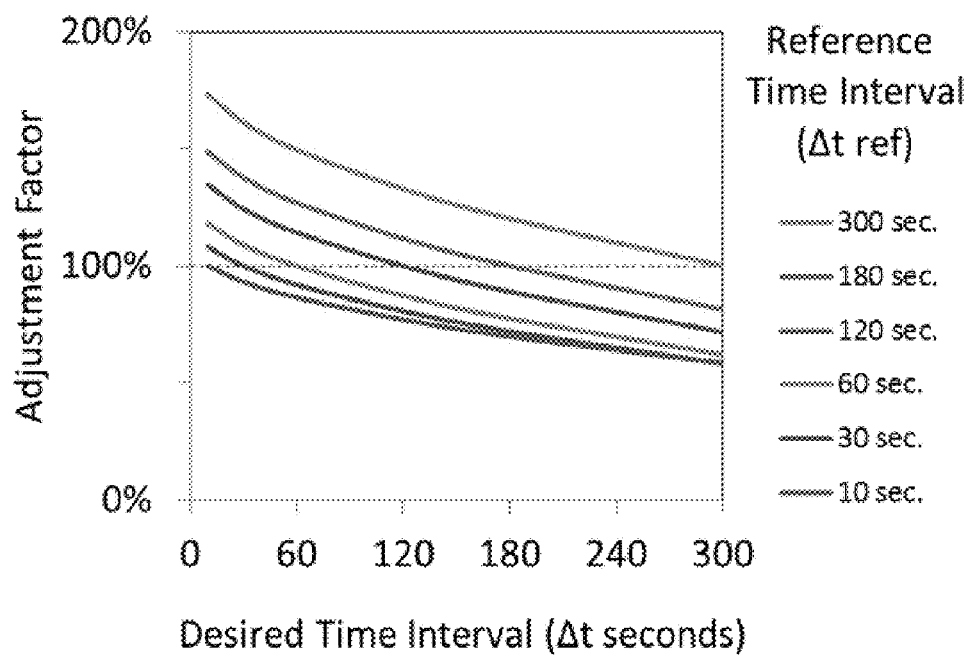
FIGS. 29A-29B are graphs depicting, by way of example, the adjustment factors plotted for time intervals from 10 seconds to 300 seconds.
Figure 29B:
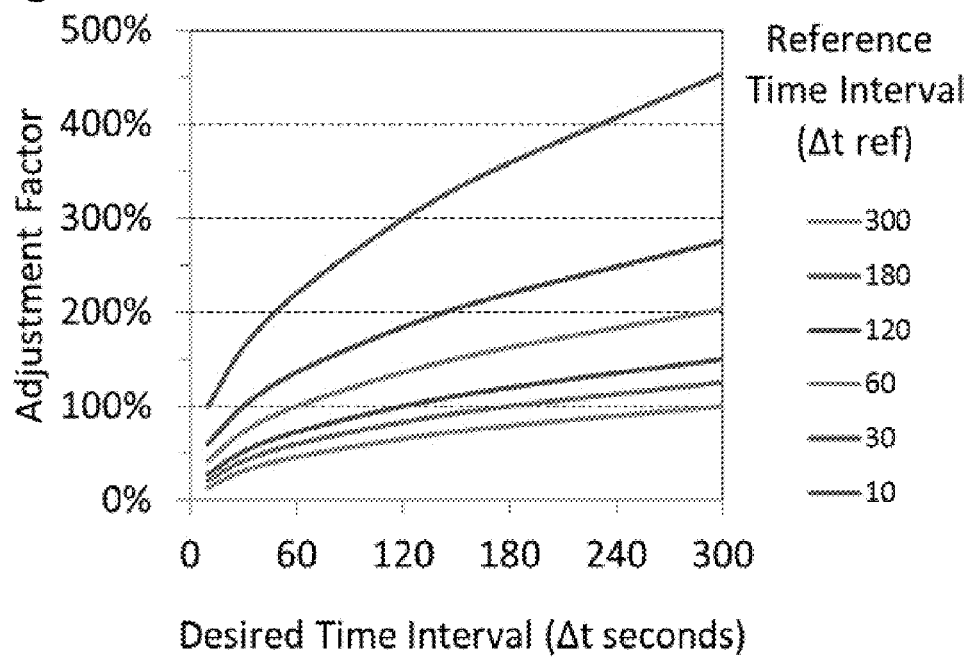
Figure 30A:
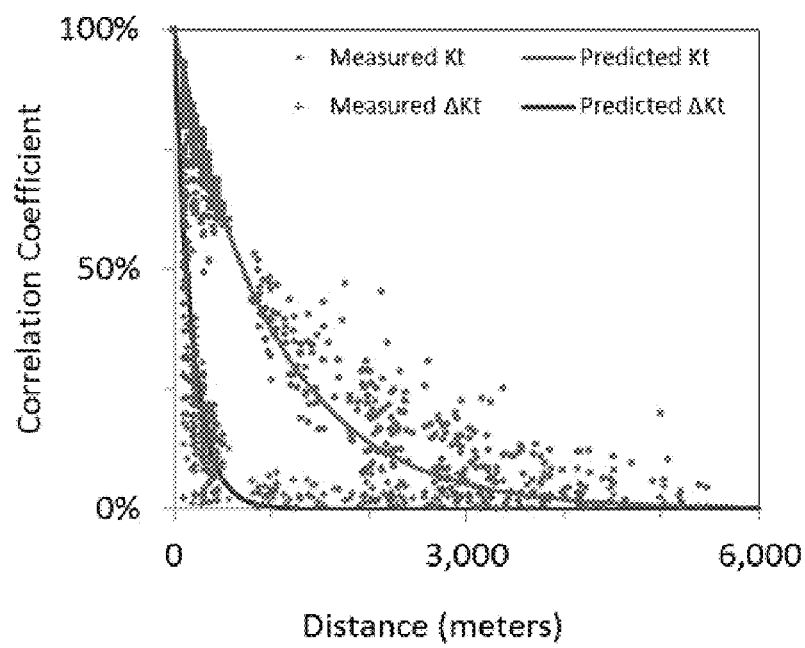
FIGS. 30A-30F are graphs depicting, by way of example, the measured and predicted weighted average correlation coefficients for each pair of locations versus distance.
Figure 30B:
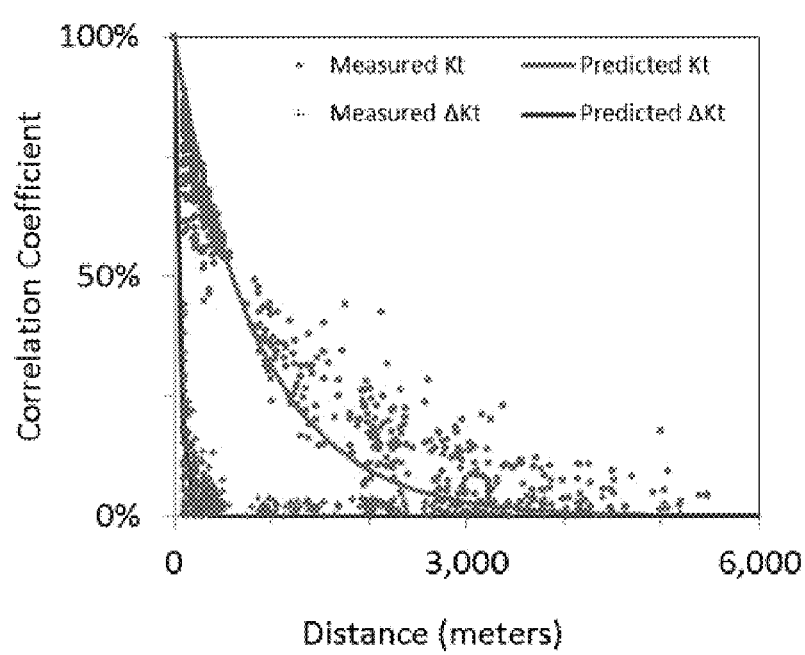
Figure 30C:
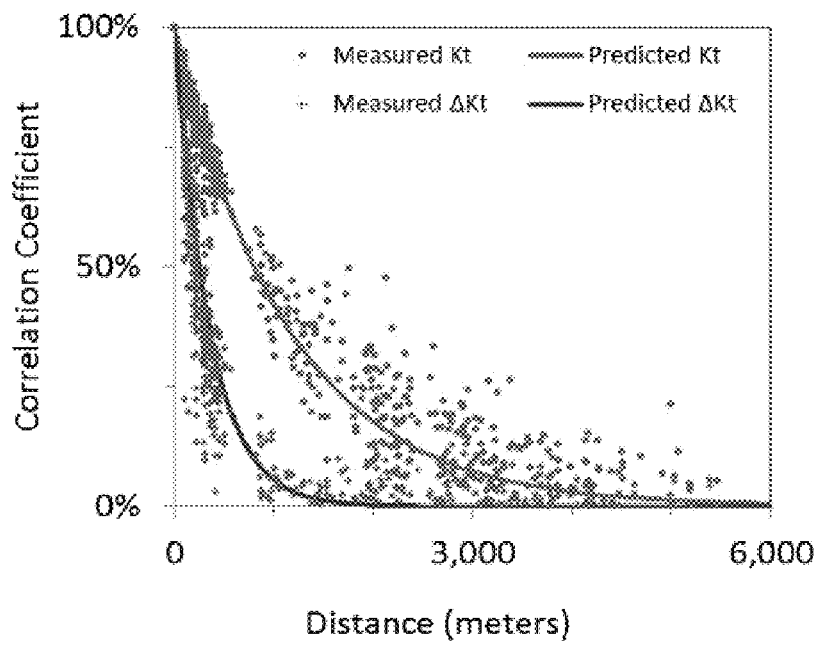
Figure 30D:
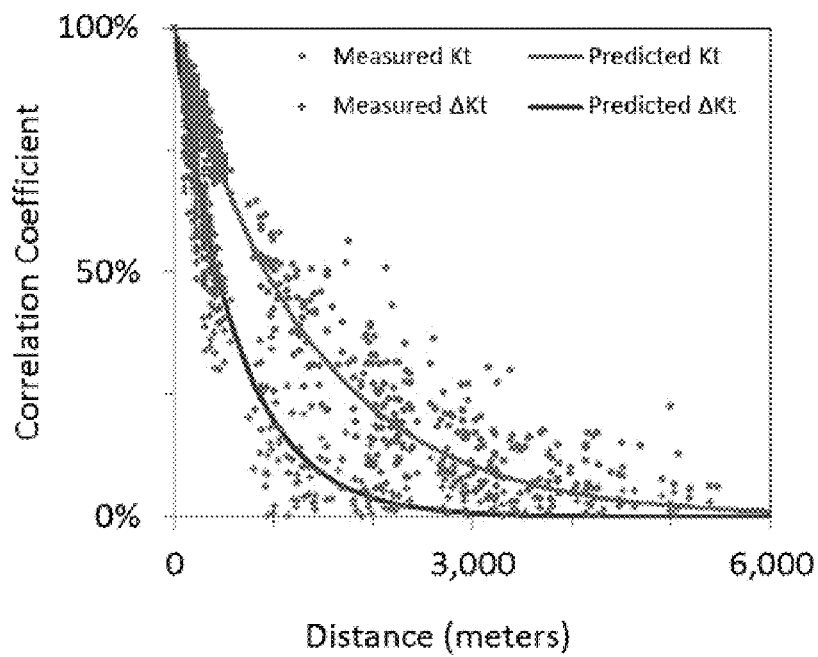
Figure 30E:
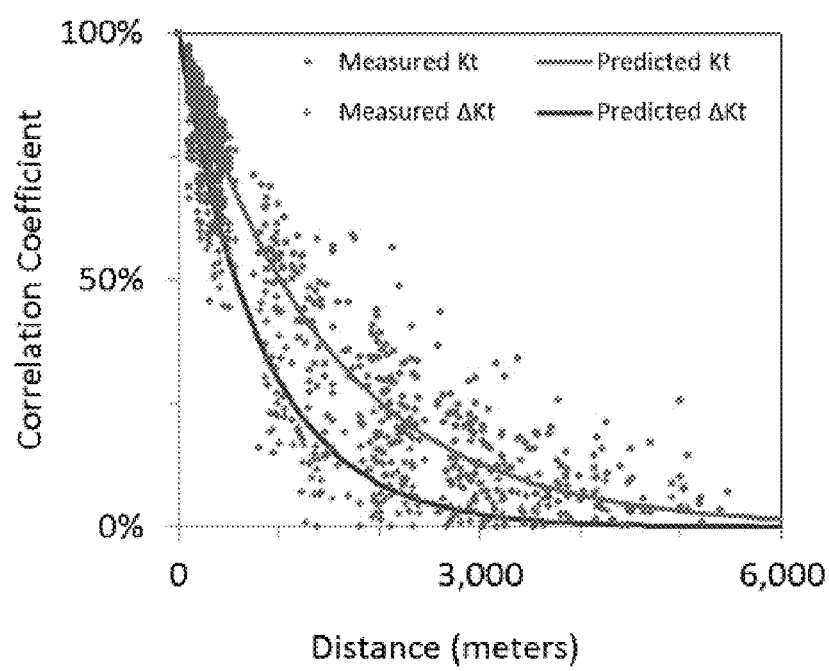
Figure 30F:
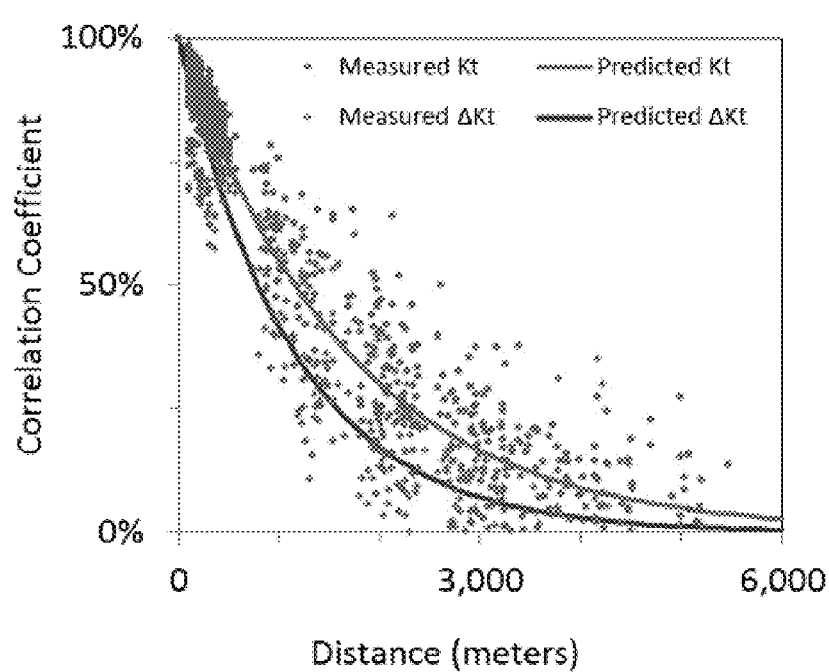
Figure 31A:
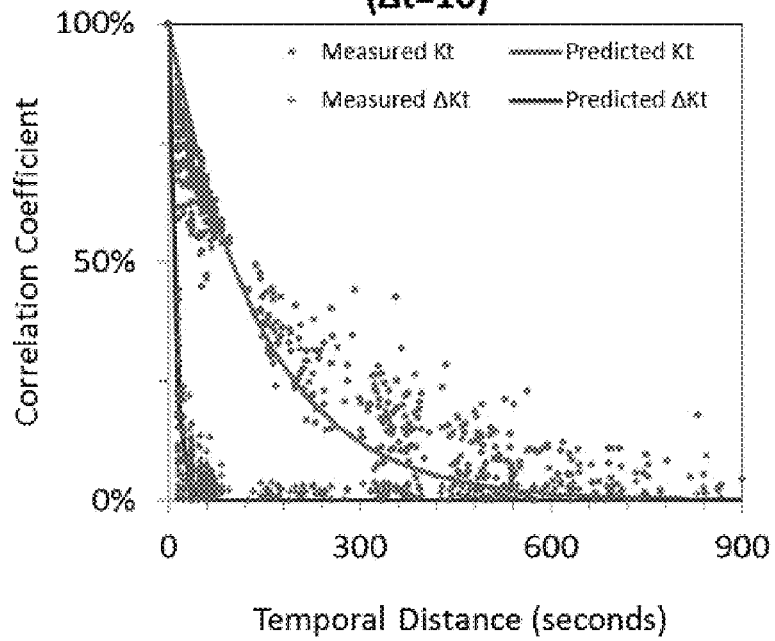
FIGS. 31A-31F are graphs depicting, by way of example, the same information as depicted in FIGS. 30A-30F versus temporal distance.
Figure 31B:
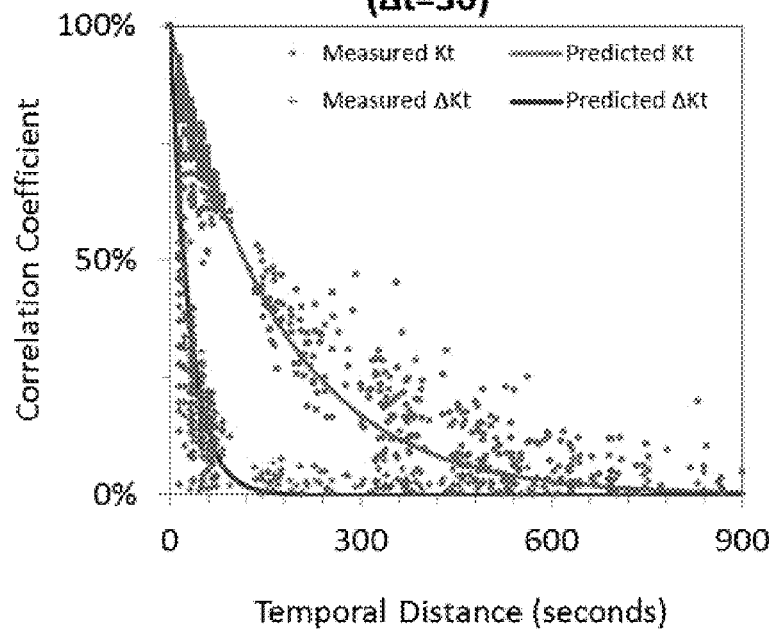
Figure 31C:
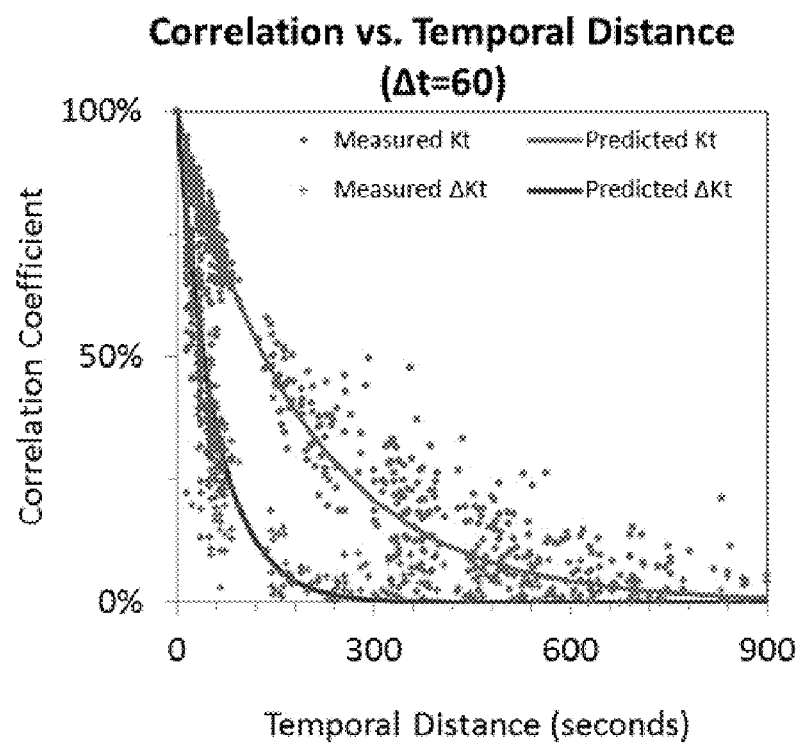
Figure 31D:
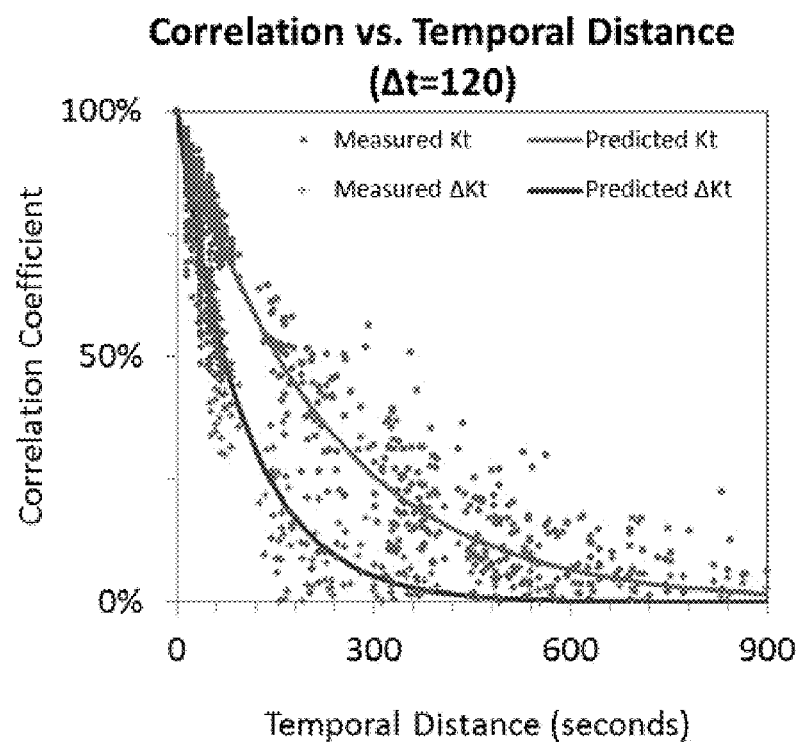
Figure 31E:
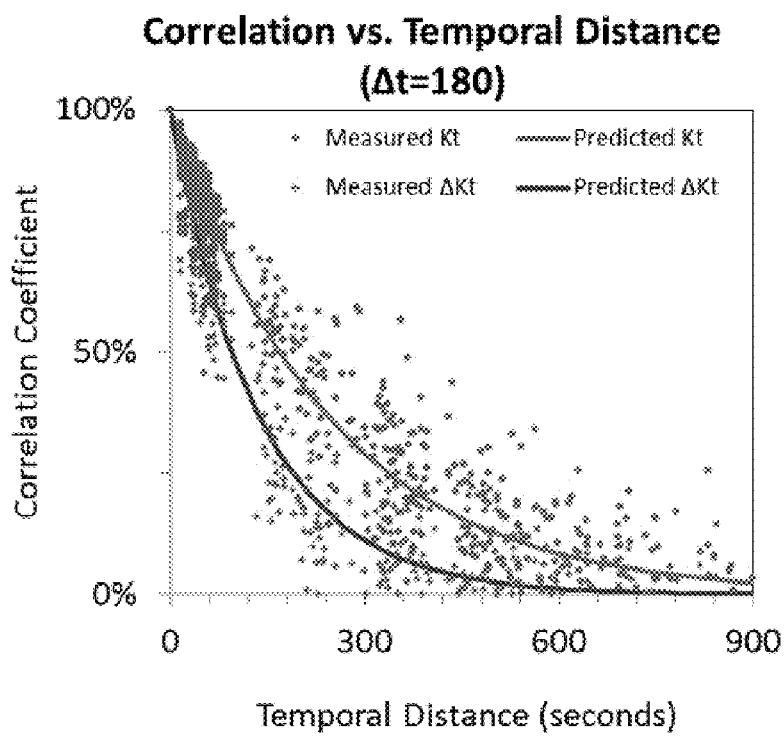
Figure 31F:
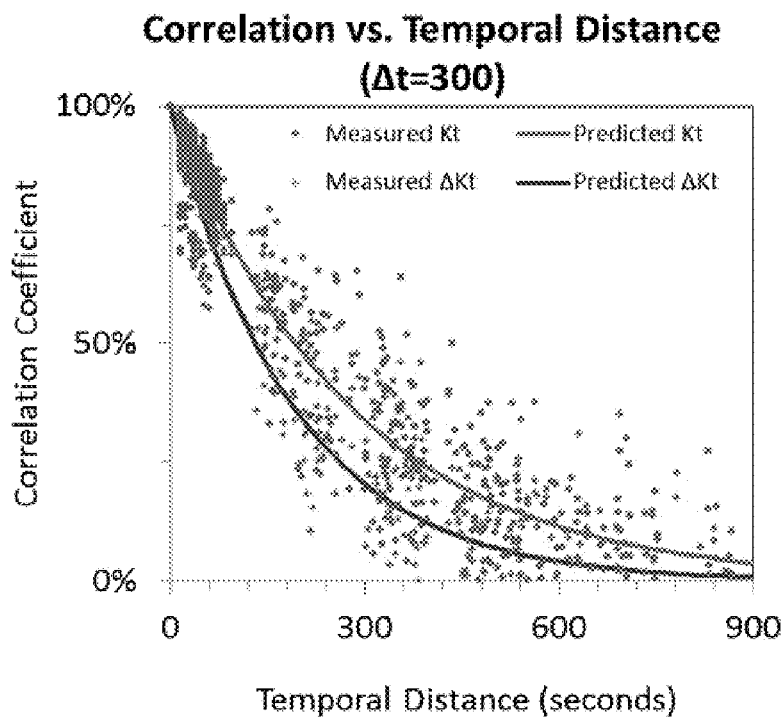
Figure 32A:
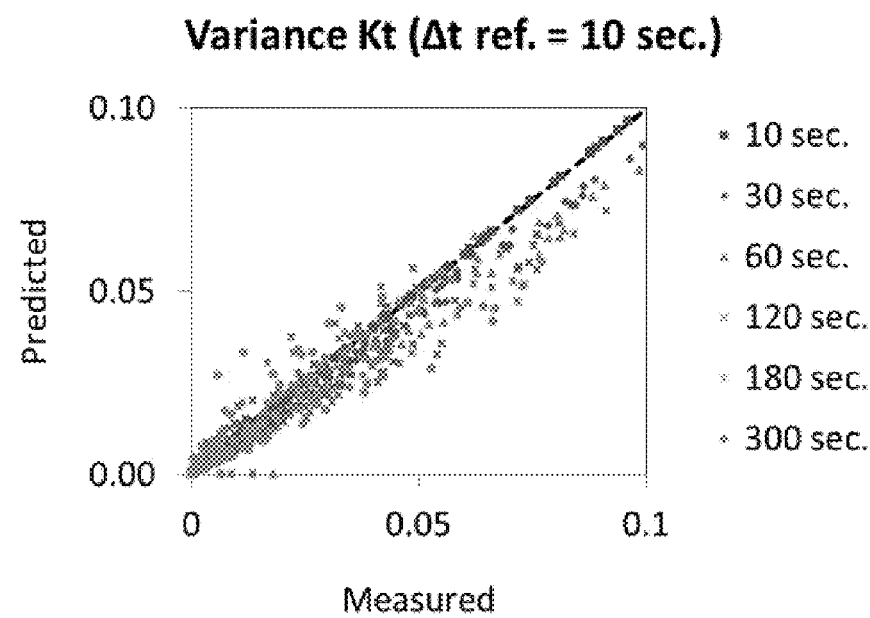
FIGS. 32A-32F are graphs depicting, by way of example, the predicted versus the measured variances of clearness indexes using different reference time intervals.
Figure 32B:
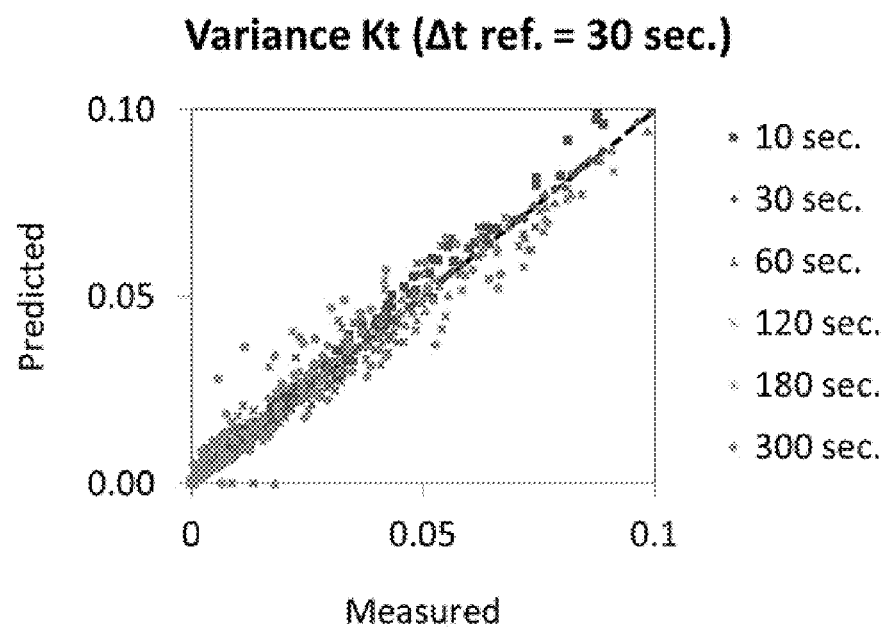
Figure 32C:
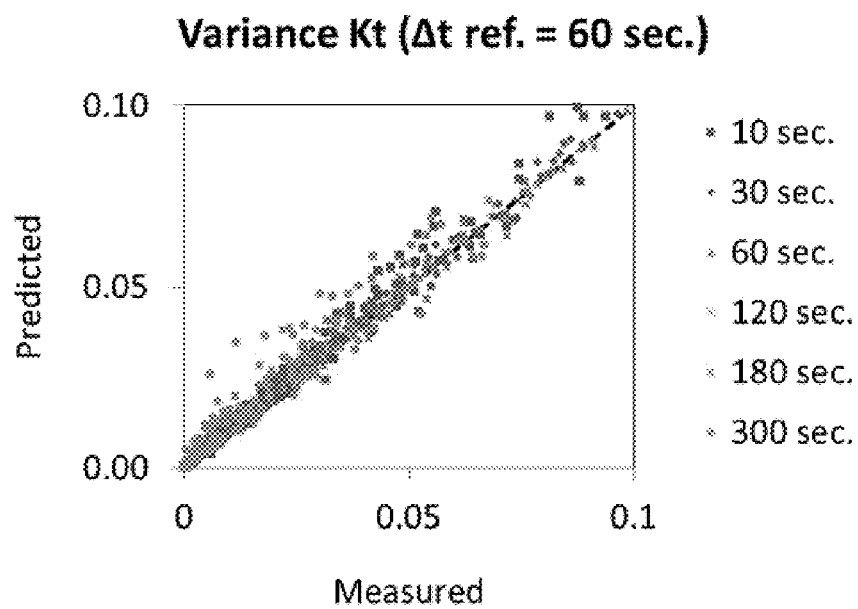
Figure 32D:
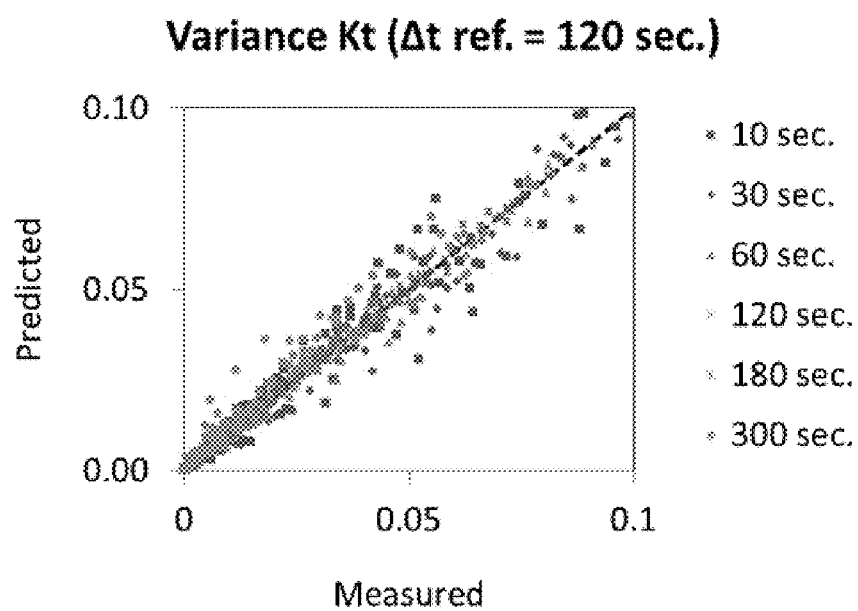
Figure 32E:
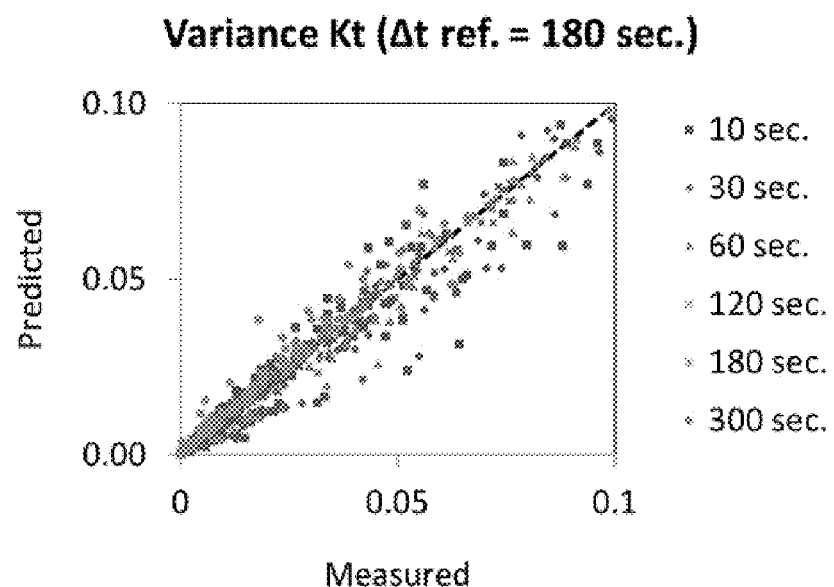
Figure 32F:
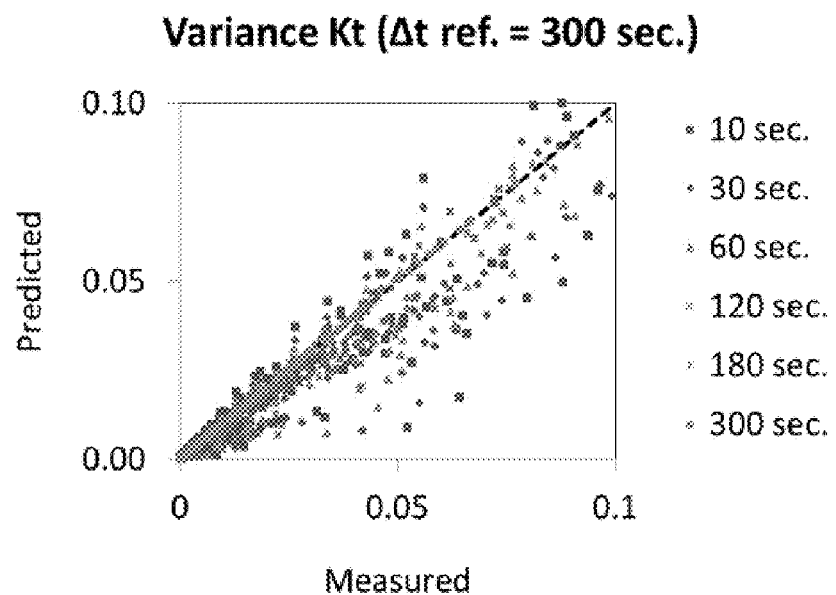
Figure 33A:
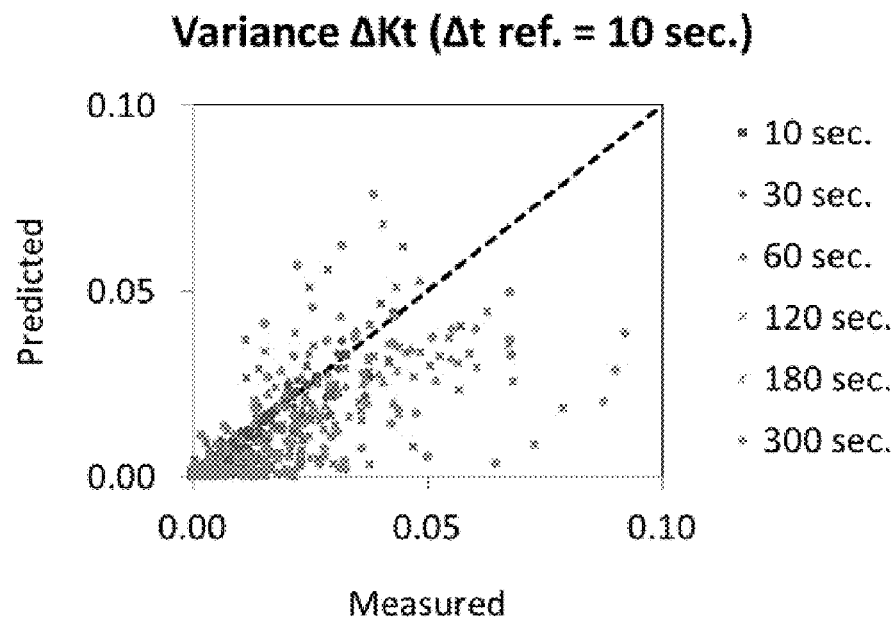
FIGS. 33A-33F are graphs depicting, by way of example, the predicted versus the measured variances of change in clearness indexes using different reference time intervals.
Figure 33B:
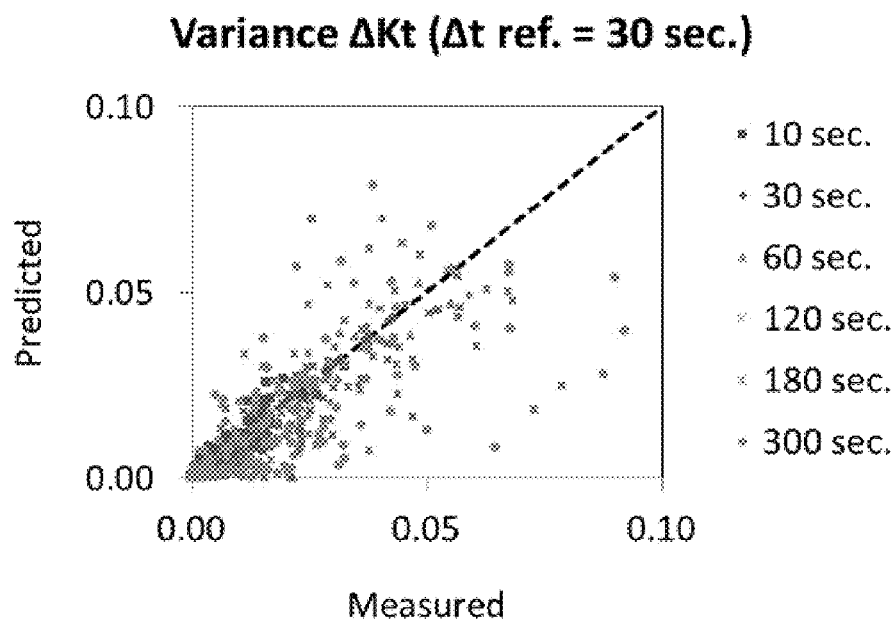
Figure 33C:
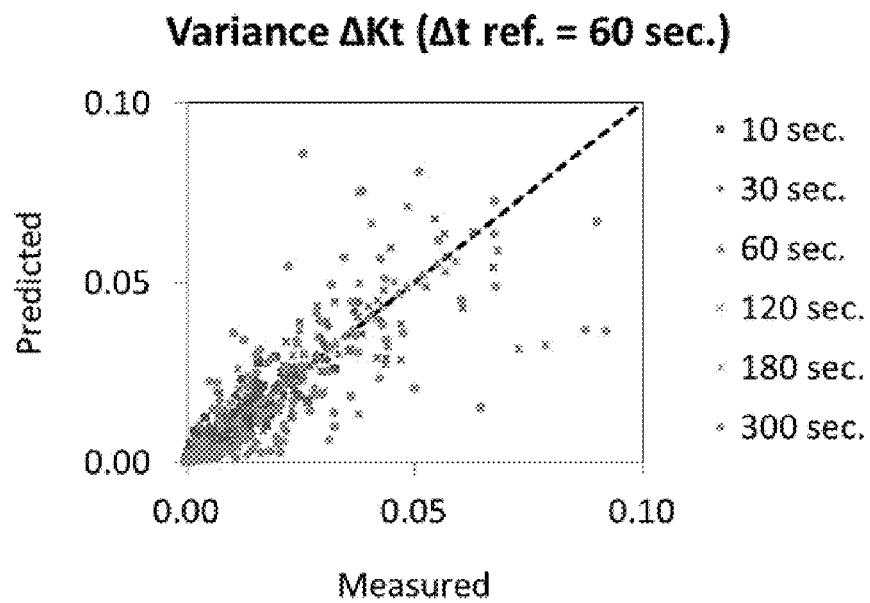
Figure 33D:
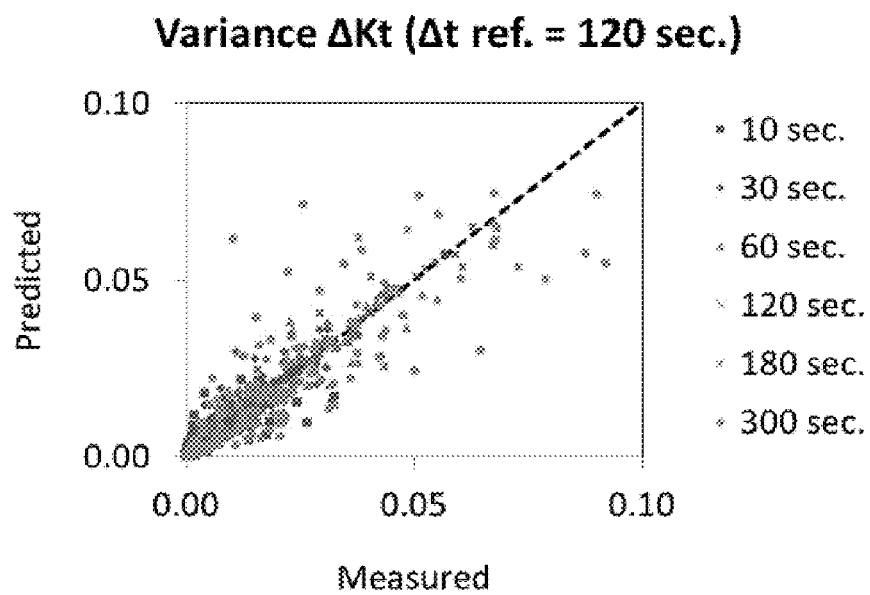
Figure 33E:
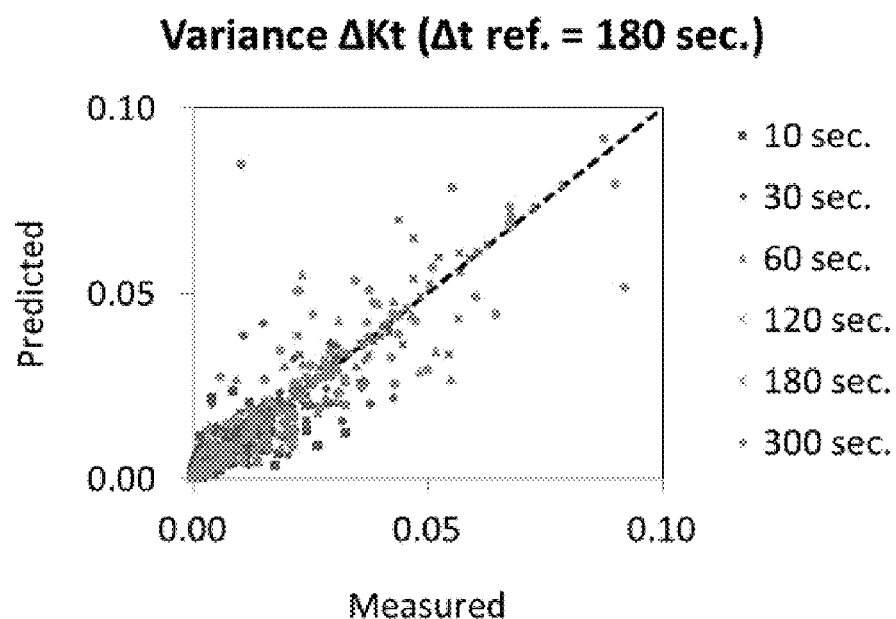
Figure 33F:
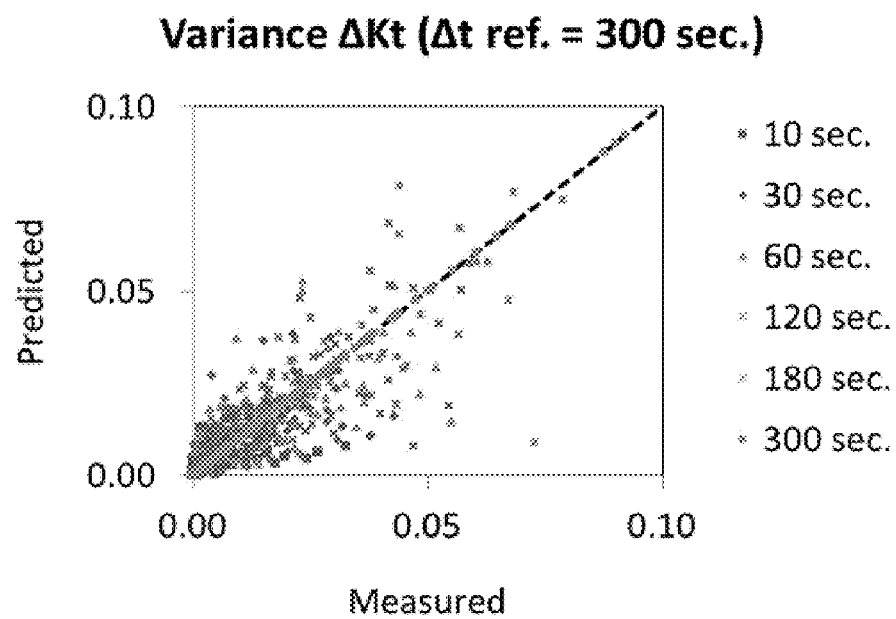

FIGS. 29A-29B are graphs depicting, by way of example, the adjustment factors plotted for time intervals from 10 seconds to 300 seconds. For example, if the variance is calculated at a 300-second time interval and the user desires results at a 10-second time interval, the adjustment for the variance clearness index would be 1.49.

These empirical models represent a valuable means to rapidly calculate correlation coefficients and translate time interval with readily-available information, which avoids the use of computation-intensive calculations and high-speed streams of data from many point sources, as would otherwise be required.

Validation

Equations (64) and (65) were validated by calculating the correlation coefficients for every pair of locations in the Cordelia Junction network and the Napa network at half-hour time periods. The correlation coefficients for each time period were then weighted by the corresponding variance of that location and time period to determine weighted average correlation coefficient for each location pair. The weighting was performed as follows:

$$\overline{\rho^{Kt^i,Kt^j}} = \frac{\sum_{t=1}^{T} \sigma^2_{Kt-i,j_t} \rho_t^{Kt^i,Kt^j}}{\sum_{t=1}^{T} \sigma^2_{Kt-i,j_t}}, \text{ and}$$

$$\overline{\rho^{\Delta Kt^i,\Delta Kt^j}} = \frac{\sum_{t=1}^{T} \sigma^2_{\Delta Kt-i,j_t} \rho_t^{\Delta Kt^i,\Delta Kt^j}}{\sum_{t=1}^{T} \sigma^2_{\Delta Kt-i,j_t}}.$$

FIGS. 30A-30F are graphs depicting, by way of example, the measured and predicted weighted average correlation coefficients for each pair of locations versus distance. FIGS. 31A-31F are graphs depicting, by way of example, the same information as depicted in FIGS. 30A-30F versus temporal distance, based on the assumption that cloud speed was six meters per second. Several observations can be drawn based on the information provided by the FIGS. 30A-30F and 31A-31F. First, for a given time interval, the correlation coefficients for both the clearness index and the change in the clearness index follow an exponential decline pattern versus distance (and temporal distance). Second, the predicted results are a good representation of the measured results for both the correlation coefficients and the variances, even though the results are for two separate networks that vary in size by a factor of 100. Third, the change in the clearness index correlation coefficient converges to the clearness correlation coefficient as the time interval increases. This convergence is predicted based on the form of the empirical model because $\Delta$ClearnessPower approaches one as $\Delta t$ becomes large.

Equations (66) and (67) were validated by calculating the average variance of the clearness index and the variance of the change in the clearness index across the 25 locations in each network for every half-hour time period. FIGS. 32A-32F are graphs depicting, by way of example, the predicted versus the measured variances of clearness indexes using different reference time intervals. FIGS. 33A-33F are graphs depicting, by way of example, the predicted versus the measured variances of change in clearness indexes using different reference time intervals. FIGS. 32A-32F and 33A-33F suggest that the predicted results are similar to the measured results.

Discussion

The point-to-point correlation coefficients calculated using the empirical forms described supra refer to the locations of specific photovoltaic power production sites. Importantly, note that the data used to calculate these coefficients was not obtained from time sequence measurements taken at the points themselves. Rather, the coefficients were calculated from fleet-level data (cloud speed), fixed fleet data (distances between points), and user-specified data (time interval).

The empirical relationships of the foregoing types of empirical relationships may be used to rapidly compute the coefficients that are then used in the fundamental mathematical relationships. The methodology does not require that these specific empirical models be used and improved models will become available in the future with additional data and analysis.

Example

This section provides a complete illustration of how to apply the methodology using data from the Napa network of 25 irradiance sensors on Nov. 21, 2010. In this example, the sensors served as proxies for an actual 1 kW photovoltaic fleet spread evenly over the geographical region as defined by the sensors. For comparison purposes, a direct measurement approach is used to determine the power of this fleet and the change in power, which is accomplished by adding up the 10-second output from each of the sensors and normalizing the output to a 1 kW system. FIGS. 34A-34F are graphs and a diagram depicting, by way of example, application of the methodology described herein to the Napa network.

Figure 34A:
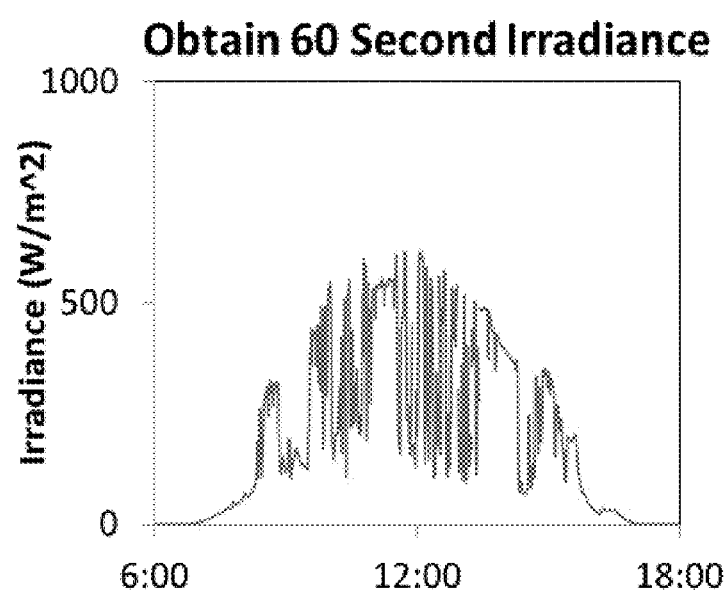
FIGS. 34A-34F are graphs and a diagram depicting, by way of example, application of the methodology described herein to the Napa network.
Figure 34B:
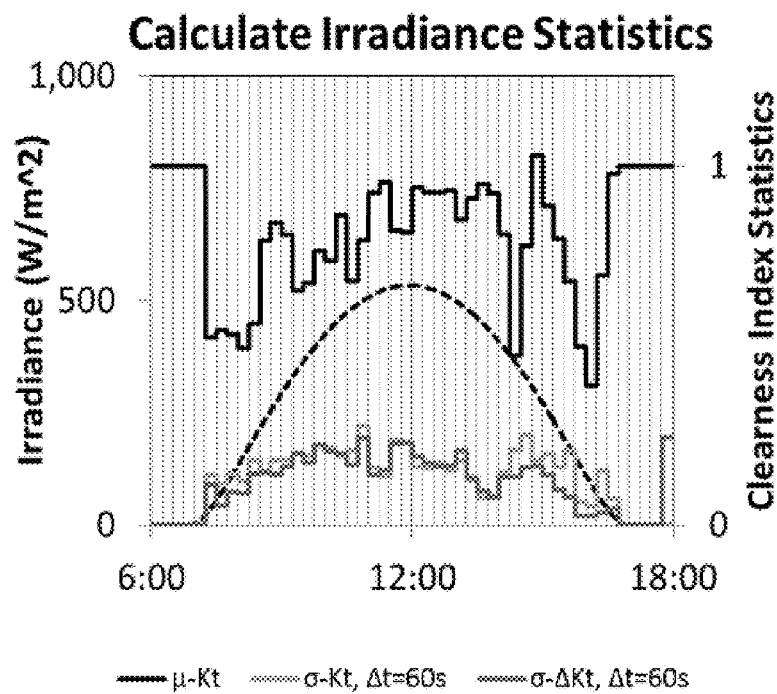
Figure 34C:
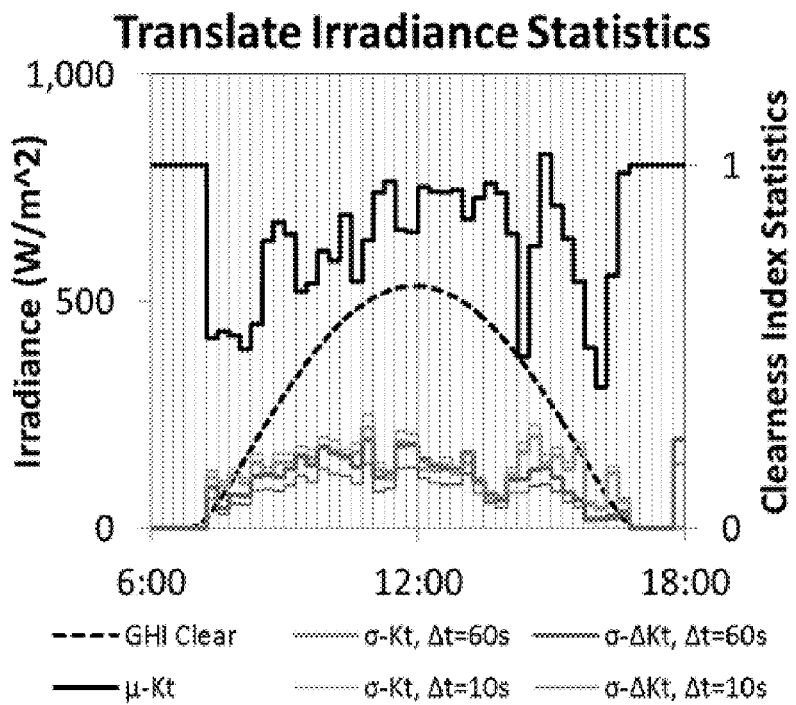
Figure 34D:
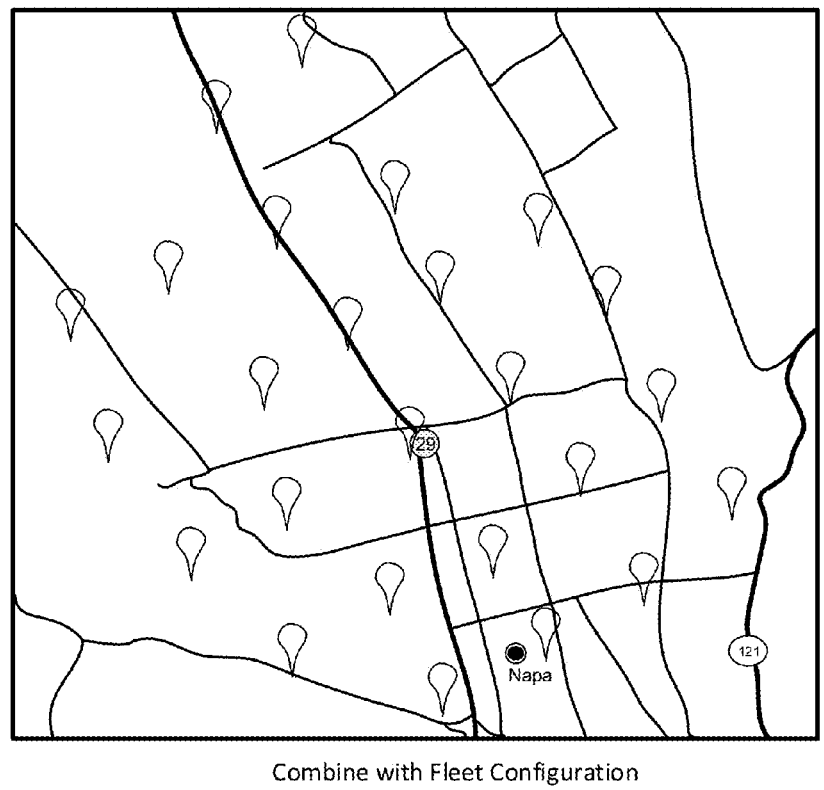
Figure 34E:
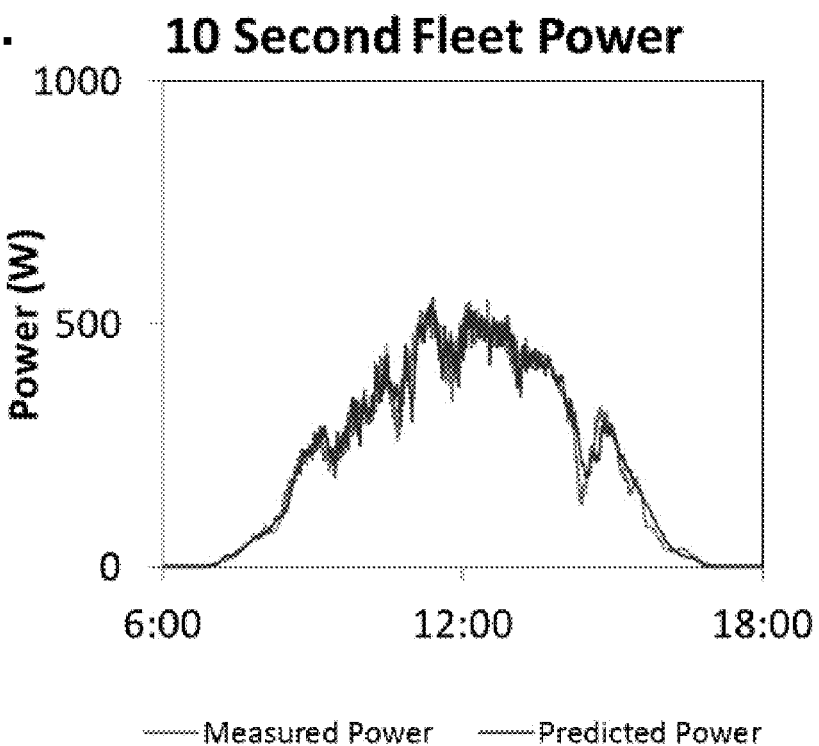
Figure 34F:
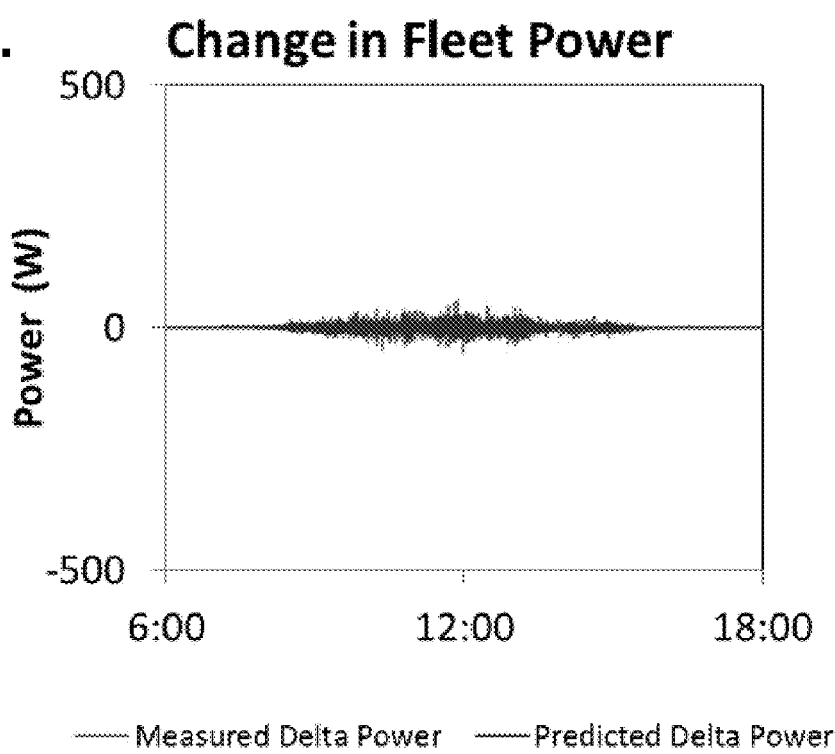

The predicted behavior of the hypothetical photovoltaic fleet was separately estimated using the steps of the methodology described supra. The irradiance data was measured using ground-based sensors, although other sources of data could be used, including from existing photovoltaic systems or satellite imagery. As shown in FIG. 34A, the data was collected on a day with highly variable clouds with one-minute global horizontal irradiance data collected at one of the 25 locations for the Napa network and specific 10-second measured power output represented by a blue line. This irradiance data was then converted from global horizontal irradiance to a clearness index. The mean clearness index, variance of clearness index, and variance of the change in clearness index were then calculated for every 15-minute period in the day. These calculations were performed for each of the 25 locations in the network. Satellite-based data or a statistically-significant subset of the ground measurement locations could have also served in place of the ground-based irradiance data. However, if the data had been collected from satellite regions, an additional translation from area statistics to average point statistics would have been required. The averaged irradiance statistics from Equations (1), (10), and (11) are shown in FIG. 34B, where standard deviation ($\sigma$) is presented, instead of variance ($\sigma^2$) to plot each of these values in the same units.

In this example, the irradiance statistics need to be translated since the data were recorded at a time interval of 60 seconds, but the desired results are at a 10-second resolution. The translation was performed using Equations (66) and (67) and the result is presented in FIG. 34C.

The details of the photovoltaic fleet configuration were then obtained. The layout of the fleet is presented in FIG. 34D. The details include the location of the each photovoltaic system (latitude and longitude), photovoltaic system rating (1/25 kW), and system orientation (all are horizontal).

Equation (48), and its associated component equations, were used to generate the time series data for the photovoltaic fleet with the additional specification of the specific empirical models, as described in Equations (64) through (67). The resulting fleet power and change in power is presented represented by the red lines in FIGS. 34E and 34F.

Probability Density Function

The conversion from area statistics to point statistics relied upon two terms $A_{Kt}$ and $A_{\Delta Kt}$ to calculate $\sigma_{Kt}^2$ and $\sigma_{\Delta Kt}^2$, respectively. This section considers these terms in more detail. For simplicity, the methodology supra applies to both Kt and $\Delta$Kt, so this notation is dropped. Understand that the correlation coefficient $\rho^{i,j}$ could refer to either the correlation coefficient for clearness index or the correlation coefficient for the change in clearness index, depending upon context. Thus, the problem at hand is to evaluate the following relationship:

$$A = \left(\frac{1}{N^2}\right)\sum_{i=1}^{N}\sum_{j=1}^{N}\rho^{i,j} \tag{68}$$

The computational effort required to calculate the correlation coefficient matrix can be substantial. For example, suppose that the one wants to evaluate variance of the sum of points within a one-square kilometer satellite region by breaking the region into one million square meters (1,000 meters by 1,000 meters). The complete calculation of this matrix requires the examination of one trillion ($10^{12}$) location pair combinations. A heuristic approach to simplifying the solution space from exponential to linear is discussed supra with reference to FIGS. 7-10.

Discrete Formulation

The calculation can be simplified using the observation that many of the terms in the correlation coefficient matrix are identical. For example, the covariance between any of the one million points and themselves is 1. This observation can be used to show that, in the case of a rectangular region that has dimension of H by W points (total of N) and the capacity is equal distributed across all parts of the region that:

$$\left(\frac{1}{N^2}\right)\sum_{i=1}^{N}\sum_{j=1}^{N}\rho^{i,j} = \tag{69}$$

$$\left(\frac{1}{N^2}\right)\left[\sum_{i=0}^{H-1}\sum_{j=0}^{i}2^k[(H-i)(W-j)]\rho^d + \sum_{i=0}^{W-1}\sum_{j=0}^{i}2^k[(W-i)(H-j)]\rho^d\right]$$

where:
$-1$, when i=0 and j=0
k=1, when j=0 or j=i
2, when 0<j<i

When the region is a square, a further simplification can be made.

$$\left(\frac{1}{N^2}\right)\sum_{i=1}^{N}\sum_{j=1}^{N}\rho^{i,j} = \left(\frac{1}{N^2}\right)\left[\sum_{i=0}^{\sqrt{N}-1}\sum_{j=0}^{i}2^k(\sqrt{N}-i)(\sqrt{N}-j)\rho^d\right] \tag{70}$$

where:
$k = \begin{cases} 0, \text{ when } i = 0 \text{ and } j = 0 \\ 2, \text{ when } j = 0 \text{ or } j = i, \text{ and} \\ 3, \text{ when } 0 < j < i \end{cases}$ $d = (\sqrt{i^2 + j^2})\left(\frac{\sqrt{Area}}{\sqrt{N}-1}\right).$ The benefit of Equation (70) is that there are $$\frac{N - \sqrt{N}}{2}$$

rather than $N^2$ unique combinations that need to be evaluated. In the example above, rather than requiring one trillion possible combinations, the calculation is reduced to one-half million possible combinations.

Continuous Formulation

Even given this simplification, however, the problem is still computationally daunting, especially if the computation needs to be performed repeatedly in the time series. Therefore, the problem can be restated as a continuous formulation in which case a proposed correlation function may be used to simplify the calculation. The only variable that changes in the correlation coefficient between any of the location pairs is the distance between the two locations; all other variables are the same for a given calculation. As a result, Equation (70) can be interpreted as the combination of two factors: the probability density function for a given distance occurring and the correlation coefficient at the specific distance.

Figure 35:
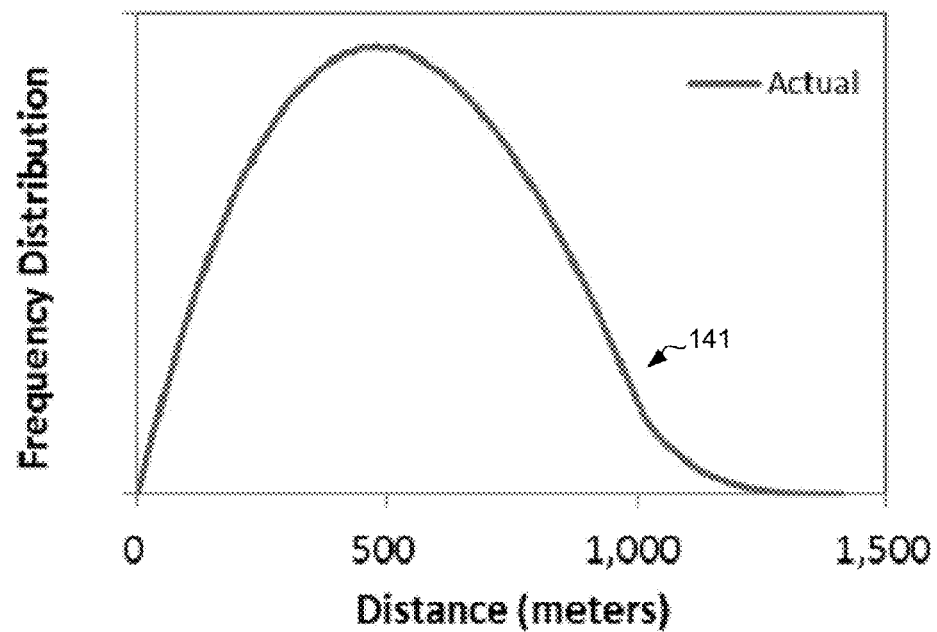
FIG. 35 is a graph depicting, by way of example, an actual probability distribution for a given distance between two pairs of locations, as calculated for a 1,000 meter×1,000 meter grid in one square meter increments.

Consider the probability density function. The actual probability of a given distance between two pairs occurring was calculated for a 1,000 meter×1,000 meter grid in one square meter increments. The evaluation of one trillion location pair combination possibilities was evaluated using Equation (68) and by eliminating the correlation coefficient from the equation. FIG. 35 is a graph depicting, by way of example, an actual probability distribution for a given distance between two pairs of locations, as calculated for a 1,000 meter×1,000 meter grid in one square meter increments.

The probability distribution suggests that a continuous approach can be taken, where the goal is to find the probability density function based on the distance, such that the integral of the probability density function times the correlation coefficient function equals:

$$A = \int f(D)\rho(d)dD \tag{71}$$

An analysis of the shape of the curve shown in FIG. 35 suggests that the distribution can be approximated through the use of two probability density functions. The first probability density function is a quadratic function that is valid between 0 and $\sqrt{Area}$.

$$f_{Quad} = \begin{cases} \left(\dfrac{6}{\sqrt{Area}}\right)\left(D - \dfrac{D^2}{\sqrt{Area}}\right) & \text{for } 0 \leq D \leq \sqrt{Area} \\ 0 & \text{for } D > \sqrt{Area} \end{cases} \tag{72}$$

This function is a probability density function because integrating between 0 and $\sqrt{Area}$ equals 1, that is, $$P\left[0 \leq D \leq \sqrt{Area}\right] = \int_0^{\sqrt{Area}} f_{Quad.} dD = 1.$$

The second function is a normal distribution with a mean of $\sqrt{Area}$ and standard deviation of $0.1\sqrt{Area}$.

$$f_{Norm} = \left(\dfrac{1}{0.1*\sqrt{Area}}\right)\left(\dfrac{1}{\sqrt{2\pi}}\right)e^{-\left(\tfrac{1}{2}\right)\left(\tfrac{D-\sqrt{Area}}{0.1*\sqrt{Area}}\right)^2} \tag{73}$$

Likewise, integrating across all values equals 1.

To construct the desired probability density function, take, for instance, 94 percent of the quadratic density function plus six percent of the normal density function.

$$f = 0.94 \int_0^{\sqrt{Area}} f_{Quad} dD + 0.06 \int_{-\infty}^{+\infty} f_{Norm} dD \tag{74}$$

Figure 36:
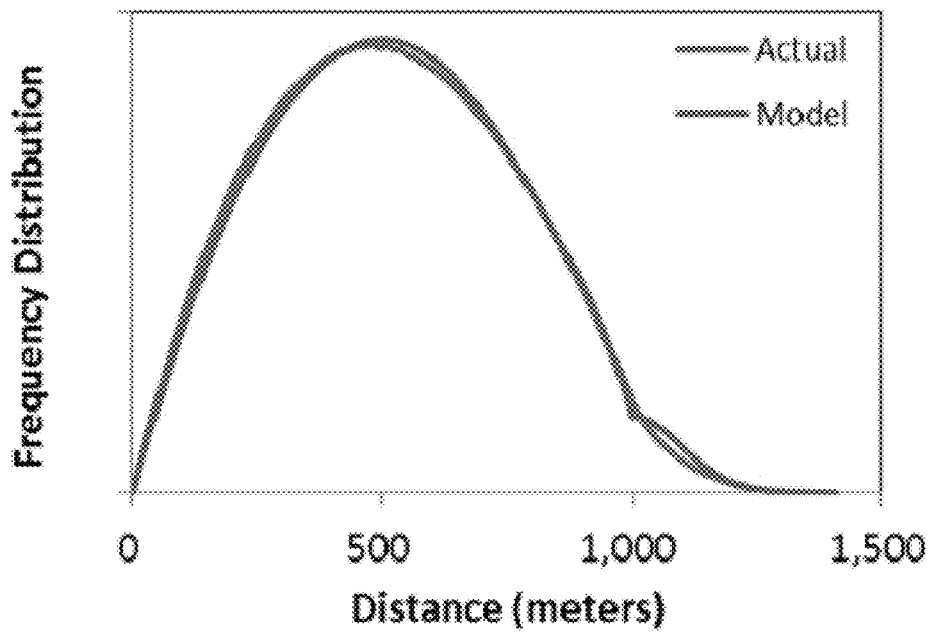
FIG. 36 is a graph depicting, by way of example, a matching of the resulting model to an actual distribution.

FIG. 36 is a graph depicting, by way of example, a matching of the resulting model to an actual distribution.

The result is that the correlation matrix of a square area with uniform point distribution as N gets large can be expressed as follows, first dropping the subscript on the variance since this equation will work for both Kt and ΔKt.

$$A \approx \left[0.94 \int_0^{\sqrt{Area}} f_{Quad}\rho(D)dD + 0.06 \int_{-\infty}^{+\infty} f_{Norm}\rho(D)dD\right] \tag{75}$$

where $\rho(D)$ is a function that expresses the correlation coefficient as a function of distance (D).

Area to Point Conversion Using Exponential Correlation Coefficient

Equation (75) simplifies the problem of calculating the correlation coefficient and can be implemented numerically once the correlation coefficient function is known. This section demonstrates how a closed form solution can be provided, if the functional form of the correlation coefficient function is exponential.

Noting the empirical results as shown in the graph in FIGS. 30A-30F, an exponentially decaying function can be taken as a suitable form for the correlation coefficient function. Assume that the functional form of correlation coefficient function equals:

$$\rho(D) = e^{\tfrac{xD}{\sqrt{Area}}} \tag{76}$$

Let Quad be the solution to $$\int_0^{\sqrt{Area}} f_{Quad.}\rho(D)dD.$$

$$Quad = \int_0^{\sqrt{Area}} f_{Quad}\rho(D)dD = \tag{77}$$

$$\left(\dfrac{6}{Area}\right)\int_0^{\sqrt{Area}}\left(D - \dfrac{D^2}{\sqrt{Area}}\right)\left[e^{\tfrac{xD}{\sqrt{Area}}}\right]dD$$

Integrate to solve.

$$Quad = (6)\left[\left(\dfrac{x}{\sqrt{Area}}D - 1\right)e^{\tfrac{xD}{\sqrt{Area}}} - \tag{78}\right.$$

$$\left.\left(\left(\dfrac{x}{\sqrt{Area}}\right)^2 D^2 - 2\dfrac{x}{\sqrt{Area}}D + 2\right)e^{\tfrac{xD}{\sqrt{Area}}}\right]$$

Complete the result by evaluating at D equal to $\sqrt{Area}$ for the upper bound and 0 for the lower bound. The result is:

$$Quad = \left(\dfrac{6}{x^3}\right)[(x-2)(e^x + 1) + 4] \tag{79}$$

Next, consider the solution to $\int_{-\infty}^{+\infty} f_{Norm.}\rho(D)\,dD$, which will be called Norm.

$$Norm = \left(\dfrac{1}{\sigma}\right)\left(\dfrac{1}{\sqrt{2\pi}}\right)\int_{-\infty}^{+\infty} e^{-\left(\tfrac{1}{2}\right)\left(\tfrac{D-\mu}{\sigma}\right)^2} e^{\tfrac{xD}{\sqrt{Area}}} dD \tag{80}$$

where $\mu = \sqrt{Area}$ and $\sigma = 0.1\sqrt{Area}$. Simplifying:

$$Norm = \left[e^{\tfrac{x}{\sqrt{Area}}\left(\mu + \tfrac{1}{2}\tfrac{x}{\sqrt{Area}}\sigma^2\right)}\right] \tag{81}$$

$$\left(\dfrac{1}{\sigma}\right)\left(\dfrac{1}{\sqrt{2\pi}}\right)\int_{-\infty}^{+\infty} e^{-\left(\tfrac{1}{2}\right)\left[\tfrac{D-\left(\mu + \tfrac{x}{\sqrt{Area}}\sigma^2\right)}{\sigma}\right]^2} dD$$

Substitute $$z = \frac{D - \left(\mu + \frac{x}{\sqrt{Area}}\sigma^2\right)}{\sigma}$$

and σdz=dD.

$$Norm = \left[e^{\frac{x}{\sqrt{Area}}\left(\mu + \frac{1}{2}\frac{x}{\sqrt{Area}}\sigma^2\right)}\right]\left(\frac{1}{\sqrt{2\pi}}\right)\int_{-\infty}^{+\infty} e^{-\left(\frac{1}{2}\right)k^2} dz \quad (82)$$

Integrate and solve.

$$Norm = e^{\frac{x}{\sqrt{Area}}\left(\mu + \frac{1}{2}\frac{x}{\sqrt{Area}}\sigma^2\right)} \quad (83)$$

Substitute the mean of $\sqrt{Area}$ and the standard deviation of 0.1 $\sqrt{Area}$ into Equation (75).

$$Norm = e^{x(1+0.005x)} \quad (84)$$

Substitute the solutions for Quad and Norm back into Equation (75). The result is the ratio of the area variance to the average point variance. This ratio was referred to as A (with the appropriate subscripts and superscripts) supra.

$$A = 0.94\left(\frac{6}{x^3}\right)[(x-2)(e^x + 1) + 4] + 0.06 e^{x(1+0.005x)} \quad (85)$$

Example

This section illustrates how to calculate A for the clearness index for a satellite pixel that covers a geographical surface area of 1 km by 1 km (total area of 1,000,000 m²), using a 60-second time interval, and 6 meter per second cloud speed. Equation (76) required that the correlation coefficient be of the form $$e^{\frac{xD}{\sqrt{Area}}}.$$

The empirically derived result in Equation (64) can be rearranged and the appropriate substitutions made to show that the correlation coefficient of the clearness index equals $$\exp\left[\frac{(\ln \Delta t - 9.3)D}{1000\, CloudSpeed}\right].$$

Multiply the exponent by $$\frac{\sqrt{Area}}{\sqrt{Area}},$$

so that the correlation coefficient equals $$\exp\left\{\left[\frac{(\ln \Delta t - 9.3)\sqrt{Area}}{1000\, CloudSpeed}\right]\left[\frac{D}{\sqrt{Area}}\right]\right\}.$$

This expression is now in the correct form to apply Equation (85), where $$x = \frac{(\ln \Delta t - 9.3)\sqrt{Area}}{1000\, CloudSpeed}.$$

Figure 37:
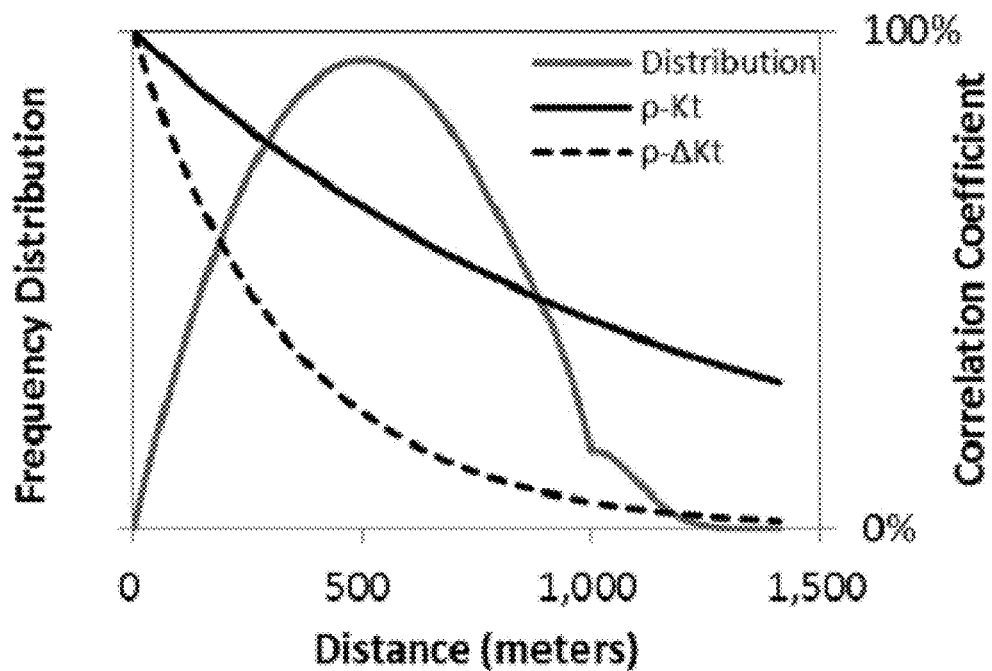
FIG. 37 is a graph depicting, by way of example, results generated by application of Equation (85).

Inserting the assumptions results in $$x = \frac{(\ln 60 - 9.3)\sqrt{1,000,000}}{1000 \times 6} = -0.86761,$$

which is applied to Equation (85). The result is that A equals 65 percent, that is, the variance of the clearness index of the satellite data collected over a 1 km² region corresponds to 65 percent of the variance when measured at a specific point. A similar approach can be used to show that the A equals 27 percent for the change in clearness index. FIG. 37 is a graph depicting, by way of example, results generated by application of Equation (85).

Time Lag Correlation Coefficient

This section presents an alternative approach to deriving the time lag correlation coefficient. The variance of the sum of the change in the clearness index equals:

$$\sigma_{\Sigma \Delta Kt}^2 = VAR[\Sigma(Kt^{\Delta t} - Kt)] \quad (86)$$

where the summation is over N locations. This value and the corresponding subscripts have been excluded for purposes of notational simplicity.

Divide the summation into two parts and add several constants to the equation:

$$\sigma_{\Sigma \Delta Kt}^2 = VAR\left[\sigma_{\Sigma Kt^{\Delta t}}\left(\frac{\sum Kt^{\Delta t}}{\sigma_{\Sigma Kt^{\Delta t}}}\right) - \sigma_{\Sigma Kt}\left(\frac{\sum Kt}{\sigma_{\Sigma Kt}}\right)\right] \quad (87)$$

Since $\sigma_{\Sigma Kt}^{\Delta t} \approx \sigma_{\Sigma Kt}$ (or $\sigma_{\Sigma Kt_t}^{\Delta t} \approx \sigma_{\Sigma Kt}$ if the first term in Kt and the last term in $Kt^{\Delta t}$ are the same):

$$\sigma_{\Sigma \Delta Kt}^2 = \sigma_{\Sigma Kt}^2 VAR\left[\frac{\sum Kt^{\Delta t}}{\sigma_{\Sigma Kt^{\Delta t}}} - \frac{\sum Kt}{\sigma_{\Sigma Kt}}\right] \quad (88)$$

The variance term can be expanded as follows:

$$\sigma_{\Sigma \Delta Kt}^2 = \quad (89)$$

$$\sigma_{\Sigma Kt}^2 \left\{\frac{VAR[\sum Kt^{\Delta t}]}{\sigma_{\Sigma Kt^{\Delta t}}^2} + \frac{VAR[\sum Kt]}{\sigma_{\Sigma Kt}^2} - \frac{2COV[\sum Kt, \sum Kt^{\Delta t}]}{\sigma_{\Sigma Kt}\sigma_{\Sigma Kt^{\Delta t}}}\right\}$$

Since $COV[\Sigma Kt, \Sigma Kt^{\Delta t}] = \sigma_{\Sigma Kt}\sigma_{\Sigma Kt^{\Delta t}}\rho^{\Sigma Kt, \Sigma Kt^{\Delta t}}$, the first two terms equal one and the covariance term is replaced by the correlation coefficient.

$$\sigma_{\Sigma \Delta Kt}^2 = 2\sigma_{\Sigma Kt}^2(1 - \rho^{\Sigma Kt, \Sigma Kt^{\Delta t}}) \quad (90)$$

This expression rearranges to:

$$\rho^{\Sigma Kt, \Sigma Kt^{\Delta t}} = 1 - \frac{1}{2}\frac{\sigma_{\Sigma \Delta Kt}^2}{\sigma_{\Sigma Kt}^2} \quad (91)$$

Assume that all photovoltaic plant ratings, orientations, and area adjustments equal to one, calculate statistics for the clearness alone using the equations described supra and then substitute. The result is:

$$\rho^{\sum Kt, \sum Kt^{\Delta t}} = 1 - \frac{P^{\Delta Kt} \sigma_{\Delta Kt}^2}{2P^{Kt} \sigma_{Kt}^2} \quad (92)$$

Relationship Between Time Lag Correlation Coefficient and Power/Change in Power Correlation Coefficient This section derives the relationship between the time lag correlation coefficient and the correlation between the series and the change in the series for a single location.

$$\rho^{P,\Delta P} = \frac{COV[P, \Delta P]}{\sqrt{\sigma_P^2 \sigma_{\Delta P}^2}} = \frac{COV[P, P^{\Delta t} - P]}{\sqrt{\sigma_P^2 \sigma_{\Delta P}^2}} = \frac{COV[P, P^{\Delta t}] - \sigma_P^2}{\sqrt{\sigma_P^2 \sigma_{\Delta P}^2}}$$

Since $\sigma_{\Delta P}^2 = VAR[P^{\Delta t} - P] =$ $\sigma_P^2 + \sigma_{P^{\Delta t}}^2 - 2COV[P, P^{\Delta t}]$ and $COV[P, P^{\Delta t}] = \rho^{P, P^{\Delta t}} \sqrt{\sigma_P^2 \sigma_{P^{\Delta t}}^2}$, $$\text{then } \rho^{P,\Delta P} = \frac{\rho^{P, P^{\Delta t}} \sqrt{\sigma_P^2 \sigma_{P^{\Delta t}}^2} - \sigma_P^2}{\sqrt{\sigma_P^2 (\sigma_P^2 + \sigma_{P^{\Delta t}}^2 - 2\rho^{P, P^{\Delta t}} \sqrt{\sigma_P^2 \sigma_{P^{\Delta t}}^2})}}.$$

Since $\sigma_P^2 \approx \sigma_{P^{\Delta t}}^2$, this expression can be further simplified. Then, square both expression and solve for the time lag correlation coefficient:

$$\rho^{P, P^{\Delta t}} = 1 - 2(\rho^{P, \Delta P})^2$$

Correlation Coefficients Between Two Regions

Assume that the two regions are squares of the same size, each side with N points, that is, a matrix with dimensions of $\sqrt{N}$ by $\sqrt{N}$ points, where $\sqrt{N}$ is an integer, but are separated by one or more regions. Thus:

$$\sum_{i=1}^{N} \sum_{j=1}^{N} \left( \frac{1}{N^2} \right) \rho^{i,j} = \left( \frac{1}{N^2} \right) \left[ \sum_{i=0}^{\sqrt{N}-1} \sum_{j=1-\sqrt{N}}^{\sqrt{N}-1} k(\sqrt{N} - i)(\sqrt{N} - |j|) \rho^d \right] \quad (93)$$

where $$k = \begin{cases} 1 & \text{when } i = 0 \\ 2 & \text{when } i > 0 \end{cases}, d = \left( \sqrt{i^2 + (j + M + \sqrt{N})^2} \right) \left( \frac{\sqrt{Area}}{\sqrt{N} - 1} \right),$$

and M equals the number of regions.

Figure 38:
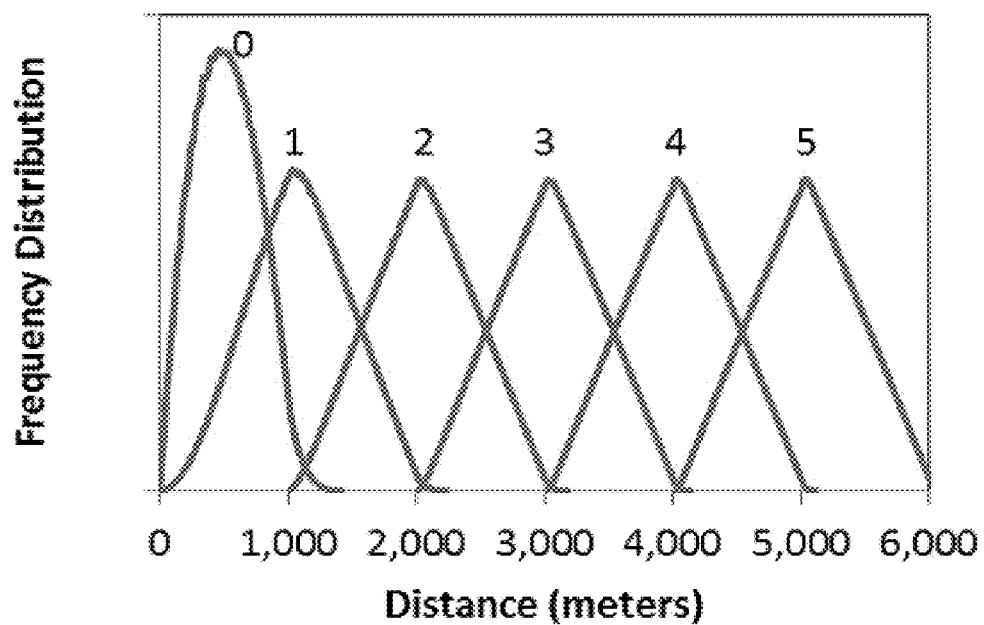
FIG. 38 is a graph depicting, by way of example, the probability density function when regions are spaced by zero to five regions.

FIG. 38 is a graph depicting, by way of example, the probability density function when regions are spaced by zero to five regions. FIG. 38 suggests that the probability density function can be estimated using the following distribution:

$$f = \begin{cases} 1 - \left( \frac{Spacing - D}{\sqrt{Area}} \right) & \text{for } Spacing - \sqrt{Area} \le D \le Spacing \\ 1 + \left( \frac{Spacing - D}{\sqrt{Area}} \right) & \text{for } Spacing \le D \le Spacing + \sqrt{Area} \\ 0 & \text{all } esle \end{cases} \quad (94)$$

Figure 39:
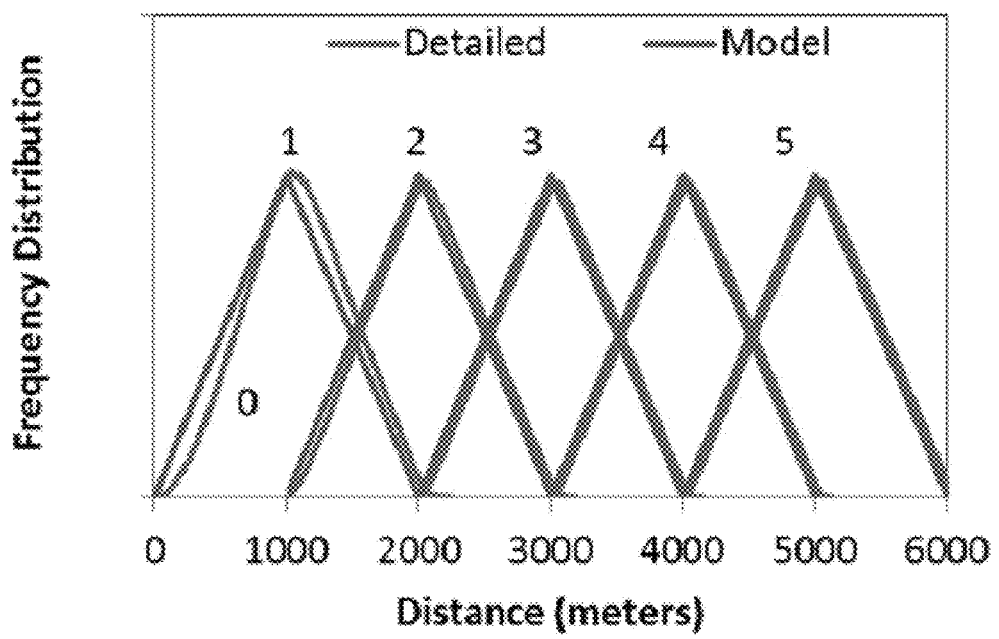
FIG. 39 is a graph depicting, by way of example, results by application of the model.

This function is a probability density function because the integration over all possible values equals zero. FIG. 39 is a graph depicting, by way of example, results by application of this model.

While the invention has been particularly shown and described as referenced to the embodiments thereof, those skilled in the art will understand that the foregoing and other changes in form and detail may be made therein without departing from the spirit and scope.

What is claimed is:

1. A method for estimating photovoltaic energy generation for use in photovoltaic fleet operation with the aid of a digital computer, comprising the steps of:

providing a computer with irradiance observations that have been measured at regular time intervals occurring between each irradiance observation for a plurality of locations at which a photovoltaic fleet comprising a plurality of photovoltaic power generation plants can be operated, and clear sky global horizontal irradiance ("clear sky irradiance") corresponding to the irradiance observations;

estimating in the computer normalized irradiation at a point within the regular time interval falling between each pair of the irradiance observations, comprising the steps of:

for each normalized irradiation estimate, selecting in the computer any three irradiance observations and a fractional offset about the middle irradiance observation;

interpolating in the computer a pair of linear slopes between the middle irradiance observation selected and each of the other two irradiance observations selected;

for each of the linear slopes, finding in the computer a weighting relative to the part of the fractional offset that falls under that linear slope; and determining in the computer the normalized irradiation estimate as the averages of the areas under each of the linear slopes in proportion to their respective weightings;

forming a time series of global horizontal irradiance clearness indexes in the computer as a ratio of each normalized irradiation estimate and the corresponding clear sky irradiance; and statistically evaluating energy production for the photovoltaic fleet in the computer as a function of the time series of the clearness indexes and photovoltaic fleet power rating, wherein the steps are performed on a computer.

2. A method according to claim 1, further comprising the step of:

equating each normalized irradiation estimate in the computer to one of the irradiance observations over a set time period.

3. A method according to claim 1, further comprising the step of:

determining each normalized irradiation estimate in the computer as an average of the irradiance observations over a set time period.

4. A method according to claim 1, further comprising the steps of:

providing a computer with measured irradiation corresponding to each of the three irradiance observations selected for the normalized irradiation estimate; and choosing in the computer each weighting to minimize error between the measured irradiation and those irradiance observations.

5. A method according to claim 1, further comprising the steps of:
  for each normalized irradiation estimate, selecting in the computer any three irradiance observations and a fractional offset about the middle irradiance observation;
  interpolating a pair of linear slopes in the computer between the clearness index corresponding to the middle irradiance observation selected and the clearness indexes corresponding to each of the other two irradiance observations selected;
  for each of the linear slopes, finding a weighting in the computer relative to the part of the fractional offset that falls under that linear slope; and
  determining the normalized irradiation estimate in the computer as a product of the averages of the clear sky irradiances corresponding to each of the linear slopes and the averages of the areas under each of the linear slopes in proportion to their respective weightings.

6. A method according to claim 1, further comprising the step of:
  providing a computer with a user interface configured to allow retrieval of the irradiance observations and normalized irradiation based on a set time period.

7. A non-transitory computer readable storage medium storing code for executing on a computer system to perform the method according to claim 1.

8. A method according to claim 1, further comprising the steps of:
  generating clearness indexes in the computer as a ratio of the normalized irradiation estimate for each of the regular time intervals and the corresponding clear sky irradiance;
  determining normalized irradiation statistics in the computer through statistical evaluation of the time series of the clearness indexes; and
  building energy statistics for the photovoltaic fleet in the computer as a function of the normalized irradiation statistics and an overall photovoltaic fleet power rating.

9. A method according to claim 1, further comprising the steps of:
  selecting in the computer each consecutive pair of regular time intervals within the irradiance observations, and a fractional offset about the middle irradiance observation within the consecutive pair of the regular time intervals;
  interpolating a pair of linear slopes in the computer between the middle irradiance observation and each of the other two irradiance observations within the consecutive pair;
  for each of the linear slopes, finding a weighting in the computer relative to the part of the fractional offset that falls under that linear slope;
  estimating normalized irradiation in the computer as the averages of the areas under each of the linear slopes in proportion to their respective weightings;
  generating clearness indexes in the computer as a ratio of the normalized irradiation estimate for each of the regular time intervals and the corresponding clear sky irradiance, and forming a time series of the clearness indexes for all locations;
  determining normalized irradiation statistics in the computer through statistical evaluation of the time series of the clearness indexes; and
  building energy statistics for the photovoltaic fleet in the computer as a function of the normalized irradiation statistics and an overall photovoltaic fleet power rating.

10. A method according to claim 1, further comprising the steps of:
  selecting in the computer each consecutive pair of regular time intervals within the irradiance observations, and a fractional offset about the middle irradiance observation within the consecutive pair of the regular time intervals;
  interpolating a pair of linear slopes in the computer between the clearness index corresponding to the middle irradiance observation and the clearness indexes corresponding to each of the other two irradiance observations within the consecutive pair;
  for each of the linear slopes, finding a weighting in the computer relative to the part of the fractional offset that falls under that linear slope;
  estimating normalized irradiation in the computer as a product of the averages of the clear sky irradiances corresponding to each of the linear slopes and the averages of the areas under each of the linear slopes in proportion to their respective weightings;
  generating clearness indexes in the computer as a ratio of the normalized irradiation estimate for each of the regular time intervals and the corresponding clear sky irradiance, and forming a time series of the clearness indexes for all locations;
  determining normalized irradiation statistics in the computer through statistical evaluation of the time series of the clearness indexes; and
  building energy statistics for the photovoltaic fleet in the computer as a function of the normalized irradiation statistics and an overall photovoltaic fleet power rating.

11. A method according to claim 5, further comprising the steps of:
  providing a computer with measured irradiation corresponding to each of the three irradiance observations selected for the normalized irradiation estimate; and
  choosing in the computer each weighting to minimize error between the measured irradiation and the clearness indexes generated from the normalized irradiation estimate for that time interval.

12. A method according to claim 8, wherein each normalized irradiation estimate $\overline{Irradiation_{t_0 to t_0+\Delta t}}$ from time $t_0$ over a time interval $\Delta t$ comprises the area under an irradiance curve determined in accordance with:

$$\overline{Irradiation_{t_0 \text{ to } t_0+\Delta t}} = E\left[\int_{t_0}^{t_0+\Delta t} I_t dt\right]$$

where $I_t$ is the irradiance observation at time t.

13. A method according to claim 8, wherein each normalized irradiation estimate $\overline{Irradiation_{t_0 to t_0+\Delta t}}$ from time $t_0$ over a time interval $\Delta t$ is determined in accordance with:

$$\overline{Irradiation_{t_0 \text{ to } t_0+\Delta t}} \approx \left(\frac{1}{N}\right)\sum_{i=0}^{N-1} I_{t_0+i*\frac{\Delta t}{N}}$$

where N is the number of irradiance observations between time t0 over a time interval $\Delta t$ and It represents the irradiance observation at time $$t_0 + i*\frac{\Delta t}{N}.$$

14. A method according to claim 9, wherein each normalized irradiation estimate $\overline{I_{t\_f to t_{1-f}}}$ at time t over a time interval defined by the fractional offset f is determined in accordance with:

$$\overline{I_{t-f \text{ to } t_{1-f}}} = [\omega_{t_{-1}} \quad \omega_{t_0} \quad \omega_{t_1}] \begin{bmatrix} I_{t_{-1}} \\ I_{t_0} \\ I_{t_1} \end{bmatrix}$$

where $[\omega_{t_{-1}} \quad \omega_{t_0} \quad \omega_{t_1}] = \left[ \frac{f^2}{2} \quad \frac{1}{2} + f - f^2 \quad \frac{(1-f)^2}{2} \right]$ for $0 \le f \le 1$.

15. A method according to claim 10, wherein each normalized irradiation estimate $\overline{I_{t\_f tot_{1-f}}}$ at time t over a time interval defined by a fractional distance f is determined in accordance with:

$$\overline{I_{t-f \text{ to } t_{1-f}}} = E\left[ \int_{t_{-f}}^{t_{1-f}} I_t^{ClearSky} Kt_t^* dt \right]$$

where $I_t^{ClearSky}$ is the clear sky irradiance and $Kt_t^*$ is the average clearness index for $0 \le f \le 1$.

16. A method according to claim 10, wherein each normalized irradiation estimate $\overline{I_{t\_f tot_{1-f}}}$ at time t over a time interval defined by a fractional distance f is determined in accordance with:

$$\overline{I_{t-f \text{ to } t_{1-f}}} \approx \left[ \left(\frac{1}{N}\right) \sum_{i=0}^{N-1} I_{t-f+i*\frac{\Delta t}{N}}^{ClearSky} \right] \left\{ [\omega_{t_{-1}} \quad \omega_{t_0} \quad \omega_{t_1}] \begin{bmatrix} Kt_{t_{-1}}^* \\ Kt_{t_0}^* \\ Kt_{t_1}^* \end{bmatrix} \right\}$$

where N is the number of irradiance observations over the time interval, $I_t^{ClearSky}$ is the clear sky irradiance, $Kt_t^*$ is the average clearness index, and $$[\omega_{t_{-1}} \quad \omega_{t_0} \quad \omega_{t_1}] = \left[ \frac{f^2}{2} \quad \frac{1}{2} + f - f^2 \quad \frac{(1-f)^2}{2} \right] \text{ for } 0 \le f \le 1.$$

\* \* \* \* \*